United States Patent
Matsumura et al.

(10) Patent No.: US 12,528,947 B2
(45) Date of Patent: Jan. 20, 2026

(54) INFRARED-ABSORBING COMPOSITION, FILM, OPTICAL FILTER, SOLID-STATE IMAGING ELEMENT, IMAGE DISPLAY DEVICE, AND INFRARED SENSOR

(71) Applicant: FUJIFILM Corporation, Tokyo (JP)

(72) Inventors: Tokihiko Matsumura, Haibara-gun (JP); Suguru Samejima, Haibara-gun (JP); Yumi Kato, Haibara-gun (JP); Ryoji Orita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 212 days.

(21) Appl. No.: 18/065,080

(22) Filed: Dec. 13, 2022

(65) Prior Publication Data

US 2023/0118444 A1     Apr. 20, 2023

Related U.S. Application Data

(63) Continuation of application No. PCT/JP2021/017673, filed on May 10, 2021.

(30) Foreign Application Priority Data

Jun. 15, 2020   (JP) .................................. 2020-102886
Mar. 1, 2021    (JP) .................................. 2021-031326

(51) Int. Cl.
*C09B 57/00*     (2006.01)
*C09B 67/20*     (2006.01)
(Continued)

(52) U.S. Cl.
CPC .......... *C09B 67/0084* (2013.01); *C09B 57/00* (2013.01); *C09B 67/0063* (2013.01);
(Continued)

(58) Field of Classification Search
CPC . C09B 57/00; C09B 67/0063; C09B 67/0084; C09D 11/037; C09D 11/106; G02B 5/208; H01L 27/1462

See application file for complete search history.

(56) References Cited

U.S. PATENT DOCUMENTS

2011/0012075 A1\* 1/2011 Nii ....................... C07D 487/04
                                                              546/256
2016/0154303 A1   6/2016 Itou et al.
(Continued)

FOREIGN PATENT DOCUMENTS

CN          101983200 B      7/2013
CN          108474884 A      8/2018
(Continued)

OTHER PUBLICATIONS

Japanese Office Action for corresponding Japanese Application No. 2022-532380, dated Jul. 18, 2023, with English translation.
(Continued)

*Primary Examiner* — Bijan Ahvazi
(74) *Attorney, Agent, or Firm* — Birch, Stewart, Kolasch & Birch, LLP

(57) ABSTRACT

An infrared-absorbing composition includes particles of an infrared-absorbing coloring agent and a solvent, in which the particles in the infrared-absorbing composition have two or more maximal absorption wavelengths exhibited in a wavelength range of 650 to 1500 nm, and in the range, in a case where an absorbance at a maximal absorption wavelength existing on a second shortest wavelength side is set to 1, an absorbance at a maximal absorption wavelength existing on a shortest wavelength side is 0.6 to 2.0.

12 Claims, 1 Drawing Sheet

(51) Int. Cl.
  *C09B 67/46* (2006.01)
  *C09D 11/037* (2014.01)
  *C09D 11/106* (2014.01)
  *G02B 5/20* (2006.01)
  *H01L 27/146* (2006.01)
  *H10F 39/00* (2025.01)

(52) U.S. Cl.
  CPC .......... *C09D 11/037* (2013.01); *C09D 11/106* (2013.01); *G02B 5/208* (2013.01); *H10F 39/805* (2025.01)

(56) References Cited

U.S. PATENT DOCUMENTS

| | | |
|---|---|---|
| 2019/0270904 A1 | 9/2019 | Takahashi et al. |
| 2020/0115382 A1* | 4/2020 | Tsuruta ................ C07D 487/04 |
| 2021/0139708 A1 | 5/2021 | Matsumura et al. |
| 2021/0173304 A1 | 6/2021 | Arayama et al. |
| 2022/0011484 A1* | 1/2022 | Shiono ................... G02B 5/208 |
| 2022/0081535 A1 | 3/2022 | Tsuruta et al. |

FOREIGN PATENT DOCUMENTS

| | | |
|---|---|---|
| JP | 2009-263614 A | 11/2009 |
| JP | 2011-70156 A | 4/2011 |
| JP | 2018-41047 A | 3/2018 |
| KR | 10-2011-0008062 A | 1/2011 |
| TW | 201903061 A | 1/2019 |
| WO | WO 2018/020861 A1 | 2/2018 |
| WO | WO 2018/043564 A1 | 3/2018 |
| WO | WO 2018/101189 A1 | 6/2018 |
| WO | WO 2018/230387 A1 | 12/2018 |
| WO | WO 2020/054718-1 | 3/2020 |
| WO | WO 2020/054719 A1 | 3/2020 |

OTHER PUBLICATIONS

International Preliminary Report on Patentability, dated Dec. 29, 2022, and English translation of the Written Opinion of the International Searching Authority, dated Jul. 27, 2021, for International Application No. PCT/JP2021/017673.
International Search Report for International Application No. PCT/JP2021/017673, dated Jul. 27, 2021, with English translation.
Japanese Office Action for corresponding Japanese Application No. 2023-202375, dated Nov. 5, 2024, with English translation.
Korean Office Action for corresponding Korean Application No. 10-2022-7042867, dated Dec. 19, 2024, with English translation.
Taiwanese Office Action and Search Report for Taiwanese Application No. 110117985, dated Aug. 26, 2024, with a partial English translation.
Chinese Office Action and Search Report for corresponding Chinese Application No. 202180042258.6, dated Sep. 3, 2025, with Engisih translation.

* cited by examiner

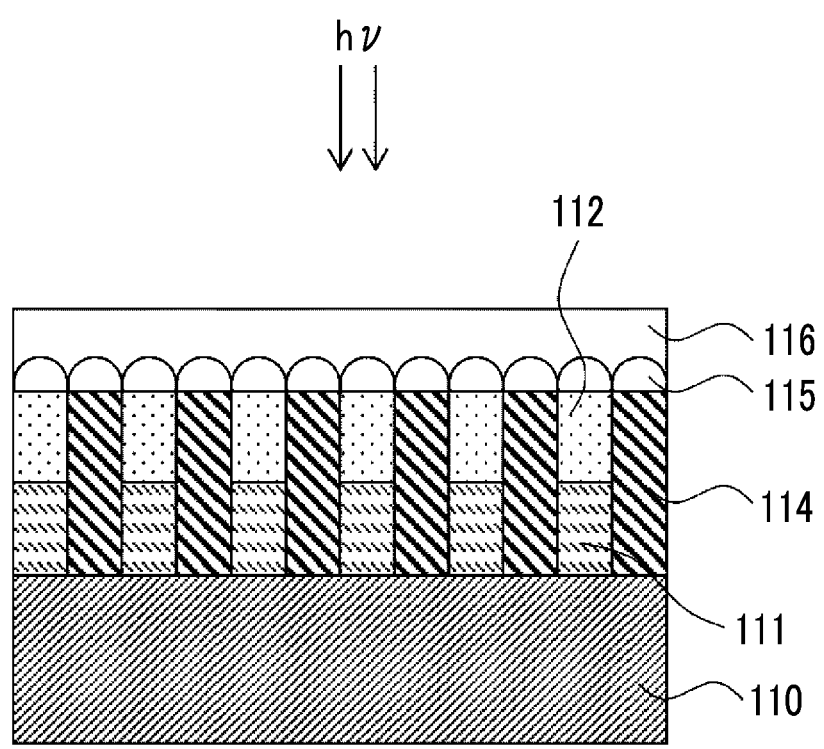

INFRARED-ABSORBING COMPOSITION, FILM, OPTICAL FILTER, SOLID-STATE IMAGING ELEMENT, IMAGE DISPLAY DEVICE, AND INFRARED SENSOR

CROSS-REFERENCE TO RELATED APPLICATIONS

This application is a Continuation of PCT International Application No. PCT/JP2021/017673 filed on May 10, 2021, which claims priority under 35 U.S.C § 119(a) to Japanese Patent Application No. 2020-102886 filed on Jun. 15, 2020 and Japanese Patent Application No. 2021-031326 filed on Mar. 1, 2021. Each of the above application(s) is hereby expressly incorporated by reference, in its entirety, into the present application.

BACKGROUND OF THE INVENTION

1. Field of the Invention

The present invention relates to an infrared-absorbing composition including an infrared-absorbing coloring agent. The present invention also relates to a film formed of a composition including an infrared-absorbing coloring agent, an optical filter, a solid-state imaging element, an image display device, and an infrared sensor.

2. Description of the Related Art

A charge coupled device (CCD) or a complementary metal-oxide semiconductor (CMOS), which are solid-state imaging elements of color images, has been used in video cameras, digital still cameras, mobile phones with camera function, and the like. Silicon photodiodes having sensitivity to infrared rays are used in a light receiving section of these solid-state imaging elements. Therefore, an infrared cut filter may be provided to correct visual sensitivity.

The infrared cut filter is manufactured by using a composition including an infrared-absorbing coloring agent.

JP2018-041047A discloses an invention relating to a resin composition containing an oxocarbon-based compound and a resin, in which an uncured product of the resin composition has one or more absorption peaks with maximal absorption in a wavelength range of 600 nm or more and 1100 nm or less and a cured product of the resin composition has more absorption peaks with maximal absorption in the wavelength range of 600 nm or more and 1100 nm or less than the uncured product.

SUMMARY OF THE INVENTION

In recent years, there has been a demand for further improvement in spectral characteristics of a film formed of a composition including an infrared-absorbing coloring agent. For example, it is required to be able to shield infrared rays in a wide wavelength range. As a result of intensive studies with regard to the composition disclosed in JP2018-041047A, the present inventor has found that, even in this composition, there is room for further improvement in these properties.

Therefore, an object of the present invention is to provide an infrared-absorbing composition with which a film having excellent infrared shielding properties can be formed. Another object of the present invention is to provide a film formed of the infrared-absorbing composition, an optical filter, a solid-state imaging element, an image display device, and an infrared sensor.

The present invention provides the following.

<1> An infrared-absorbing composition comprising:
particles of an infrared-absorbing coloring agent; and
a solvent,
in which the particles in the infrared-absorbing composition have two or more maximal absorption wavelengths exhibited in a wavelength range of 650 to 1500 nm, and
in the range, in a case where an absorbance at a maximal absorption wavelength existing on a second shortest wavelength side is set to 1, an absorbance at a maximal absorption wavelength existing on a shortest wavelength side is 0.6 to 2.0.

<2> The infrared-absorbing composition according to <1>,
in which, in the range, a difference between the maximal absorption wavelength existing on the shortest wavelength side and the maximal absorption wavelength existing on the second shortest wavelength side is 30 to 80 nm.

<3> The infrared-absorbing composition according to <1> or <2>,
in which the infrared-absorbing coloring agent is at least one selected from a pyrrolopyrrole compound, a squarylium compound, a pyrromethene compound, a croconium compound, or a cyanine compound.

<4> An infrared-absorbing composition comprising:
particles of an infrared-absorbing coloring agent; and
a solvent,
in which the infrared-absorbing coloring agent is at least one selected from a pyrrolopyrrole compound having one or more groups represented by Formula (1) and one or more groups represented by Formula (2) or a squarylium compound having one or more groups represented by Formula (1) and one or more groups represented by Formula (2),

(1)

(2)

in Formula (1), $R^{1a}$ represents an alkyl group, a halogen atom, an alkenyl group, an alkynyl group, an aryl group, a heteroaryl group, or a cyano group, $R^{1b}$ represents a substituent, n1 represents an integer of 0 to 4, and * represents a bonding site, in Formula (2), $L^1$ represents an aliphatic hydrocarbon group, an aromatic hydrocarbon group, a heterocyclic group, —O—, —S—, —$NR^{L1}$—, —CO—, —COO—, —OCO—, —$SO_2$—, an (n2+1)-valent linking group consisting of a combination of these groups, or a single bond, $R^{L1}$ represents a hydrogen atom, an alkyl group, or an aryl group, $X^1$ represents an acid group or a basic group, and * represents a bonding site.

<5> The infrared-absorbing composition according to any one of <1> to <4>,
in which the maximal absorption wavelength of the particles, which exists on the shortest wavelength side, exists on a shorter wavelength side than a wavelength at which a coloring agent solution that the infrared-absorbing coloring agent constituting the particles is dissolved in a good solvent for the infrared-absorbing coloring agent exhibits a highest absorbance.

<6> The infrared-absorbing composition according to any one of <1> to <5>,
in which the particles in the infrared-absorbing composition have three or more maximal absorption wavelengths exhibited in the wavelength range of 650 to 1500 nm.

<7> The infrared-absorbing composition according to any one of <1> to <6>,
in which the number of maximal absorption wavelengths exhibited by the particles in the infrared-absorbing composition in the wavelength range of 650 to 1500 nm is greater than the number of maximal absorption wavelengths exhibited by a coloring agent solution that the infrared-absorbing coloring agent constituting the particles is dissolved in a good solvent for the infrared-absorbing coloring agent in the wavelength range of 650 to 1500 nm.

<8> The infrared-absorbing composition according to any one of <1> to <7>,
in which the infrared-absorbing coloring agent is a compound represented by Formula (PP-1),

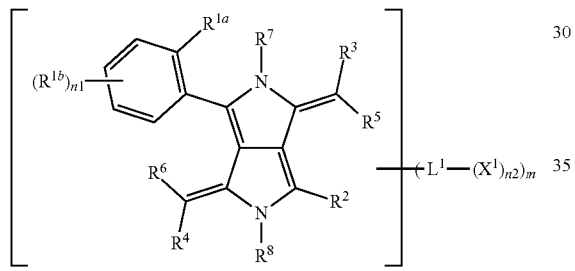

(PP-1)

in the formula, $R^{1a}$ represents an alkyl group, a halogen atom, an alkenyl group, an alkynyl group, an aryl group, a heteroaryl group, or a cyano group,
$R^{1b}$ represents a substituent,
$R^2$ represents an alkyl group, an aryl group, or a heteroaryl group,
$R^3$, $R^4$, $R^5$, and $R^6$ each independently represent a cyano group, an acyl group, an alkoxycarbonyl group, an alkylsulfinyl group, an arylsulfinyl group, or a heteroaryl group,
$R^7$ and $R^8$ each independently represent a hydrogen atom, an alkyl group, an aryl group, a heteroaryl group, —$BR^9R^{10}$, or a metal atom,
$R^9$ and $R^{10}$ each independently represent a hydrogen atom, a halogen atom, an alkyl group, an alkenyl group, an aryl group, a heteroaryl group, an alkoxy group, an aryloxy group, or a heteroaryloxy group,
$R^9$ and $R^{10}$ may be bonded to each other to form a ring,
$R^7$ may be covalently bonded or coordinately bonded to $R^3$ or $R^5$,
$R^8$ may be covalently bonded or coordinately bonded to $R^2$, $R^4$, or $R^6$,
$L^1$ represents an aliphatic hydrocarbon group, an aromatic hydrocarbon group, a heterocyclic group, —O—, —S—, —$NR^{L1}$—, —CO—, —COO—, —OCO—, —$SO_2$—, an (n2+1)-valent linking group consisting of a combination of these groups, or a single bond,
$R^{L1}$ represents a hydrogen atom, an alkyl group, or an aryl group,
$X^1$ represents an acid group or a basic group,
n1 represents an integer of 0 to 4,
n2 represents an integer of 1 or more, and
m represents an integer of 1 or more.

<9> The infrared-absorbing composition according to any one of <1> to <8>, further comprising:
a curable compound.

<10> The infrared-absorbing composition according to any one of <1> to <9>,
in which the infrared-absorbing composition is for an optical filter or an ink.

<11> A film formed of the infrared-absorbing composition according to any one of <1> to <9>.

<12> An optical filter comprising:
the film according to <11>.

<13> A solid-state imaging element comprising:
the film according to <11>.

<14> An image display device comprising:
the film according to <11>.

<15> An infrared sensor comprising:
the film according to <11>.

According to the present invention, it is possible to provide an infrared-absorbing composition with which a film having excellent infrared shielding properties can be formed, a film, an optical filter, a solid-state imaging element, an image display device, and an infrared sensor.

BRIEF DESCRIPTION OF THE DRAWINGS

FIG. 1 is a schematic diagram indicating an embodiment of an infrared sensor.

DESCRIPTION OF THE PREFERRED EMBODIMENTS

Hereinafter, the details of the present invention will be described.

In the present specification, numerical ranges represented by "to" include numerical values before and after "to" as lower limit values and upper limit values.

In the present specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In the present specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV light), an X-ray, or an electron beam.

In the present specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In the present specification, a weight-average molecular weight and a number-average molecular weight are defined as values in terms of polystyrene measured by gel permeation chromatography (GPC).

In the present specification, in a chemical formula, Me represents a methyl group, Et represents an ethyl group, Bu represents a butyl group, and Ph represents a phenyl group.

In the present specification, infrared rays denote light (electromagnetic wave) having a wavelength in a range of 700 to 2500 nm.

In the present specification, a total solid content denotes the total mass of all the components of the composition excluding a solvent.

In the present specification, a pigment means a coloring material which is hardly dissolved in a solvent.

In the present specification, the term "step" denotes not only an individual step but also a step which is not clearly distinguishable from another step as long as an effect expected from the step can be achieved.

<Infrared-Absorbing Composition>

A first aspect of the infrared-absorbing composition according to the present invention is an infrared-absorbing composition including particles of an infrared-absorbing coloring agent and a solvent, in which the particles in the infrared-absorbing composition have two or more maximal absorption wavelengths exhibited in a wavelength range of 650 to 1500 nm, and in the range, in a case where an absorbance at a maximal absorption wavelength existing on a second shortest wavelength side is set to 1, an absorbance at a maximal absorption wavelength existing on a shortest wavelength side is 0.6 to 2.0.

In the first aspect of the infrared-absorbing composition according to the present invention, by including the above-described particles, it is possible to form a film having excellent infrared shielding properties capable of shielding infrared rays in a wide wavelength range. In addition, according to the first aspect of the infrared-absorbing composition according to the present invention, it is also possible to form a film capable of shielding infrared rays in a wide wavelength range using only one type of the infrared-absorbing coloring agent, without using multiple types of infrared-absorbing coloring agents.

Examples of one aspect of the particles satisfying the above-described spectral characteristics include particles of an infrared-absorbing coloring agent which has one or more groups represented by Formula (1) and one or more groups represented by Formula (2).

The detailed reason why the above-described spectral characteristics can be achieved by using the particles of an infrared-absorbing coloring agent having such a structure is not clear, but is presumed as follows.

In a case where the infrared-absorbing coloring agent is dissolved in a solvent and used, since the infrared-absorbing coloring agent can move freely in the solution, only the absorption peak derived from a single molecule of the infrared-absorbing coloring agent is exhibited.

Since the group represented by Formula (2) is a group with a highly hydrophilic structure, it is presumed that, during the dispersion, associations are formed in the infrared-absorbing composition so that the side of the infrared-absorbing coloring agent having the group represented by Formula (2) faces the solvent side. Since the group represented by Formula (1) has a substituent at the ortho position of the benzene ring, it is difficult for the infrared-absorbing coloring agent to overlap in parallel due to steric hindrance by the group represented by Formula (1) included in the infrared-absorbing coloring agent. Therefore, it is presumed that transition moments are obliquely arranged and the infrared-absorbing coloring agents associate with each other, so that the infrared-absorbing coloring agents are obliquely aligned.

In a case where particles of an infrared-absorbing coloring agent described later, which has one or more groups represented by Formula (1) and one or more groups represented by Formula (2) form such an association state (hereinafter, also referred to as a specific state) in the infrared-absorbing composition, the absorption peak of the infrared-absorbing coloring agent shifts to the short-wave side of the long-wave side. As a result, it is presumed that the absorption peak derived from the specific state appears in addition to the absorption peak derived from the single molecule of the infrared-absorbing coloring agent, so that the above-described spectral characteristics can be achieved.

A second aspect of the infrared-absorbing composition according to the present invention includes particles of an infrared-absorbing coloring agent and a solvent, in which the infrared-absorbing coloring agent is at least one selected from a pyrrolopyrrole compound having one or more groups represented by Formula (1) and one or more groups represented by Formula (2) or a squarylium compound having one or more groups represented by Formula (1) and one or more groups represented by Formula (2).

In the second aspect of the infrared-absorbing composition according to the present invention, by including the above-described particles, it is possible to form a film having excellent infrared shielding properties capable of shielding infrared rays in a wide wavelength range. In addition, even in the second aspect of the infrared-absorbing composition according to the present invention, it is also possible to form a film capable of shielding infrared rays in a wide wavelength range using only one type of the infrared-absorbing coloring agent, without using multiple types of infrared-absorbing coloring agents.

The infrared-absorbing composition according to the embodiment of the present invention can be used for ink (ink composition). Examples of the ink composition include printing ink and ink jet ink. In addition, in a case where the infrared-absorbing composition according to the embodiment of the present invention is used as the ink composition, a solvent including water can also be used as the solvent. That is, the infrared-absorbing composition according to the embodiment of the present invention can also be used as an aqueous ink composition. In a case where the infrared-absorbing composition according to the embodiment of the present invention is used as the ink composition, a concentration of solid contents of the infrared-absorbing composition is preferably 0.1% to 50% by mass and more preferably 1% to 30% by mass.

In addition, the infrared-absorbing composition according to the embodiment of the present invention can also be used as a composition for an optical filter. Examples of the type of the optical filter include an infrared cut filter and an infrared transmitting filter. In a case where the infrared-absorbing composition according to the embodiment of the present invention is used as a composition for an optical filter, it is preferable that the infrared-absorbing composition according to the embodiment of the present invention further includes a resin. In a case where the infrared-absorbing composition according to the embodiment of the present invention is used as the composition for an optical filter, a concentration of solid contents of the infrared-absorbing composition is preferably 1% to 70% by mass, more preferably 2% to 60% by mass, and still more preferably 5% to 50% by mass.

Hereinafter, the respective components used in the infrared-absorbing composition according to the embodiment of the present invention will be described.

<<Particles of Infrared-Absorbing Coloring Agent (Specific Particles)>>

The infrared-absorbing composition according to the embodiment of the present invention includes particles of an infrared-absorbing coloring agent (hereinafter, also referred to as specific particles), which satisfy the following requirement 1 or requirement 2.

(Requirement 1) particles of an infrared-absorbing coloring agent, in which the particles in the infrared-absorbing composition have two or more maximal absorption wavelengths exhibited in a wavelength range of 650 to 1500 nm, and in the range, in a case where an absorbance at the maximal absorption wavelength existing on the second shortest wavelength side is set to 1, an absorbance at the maximal absorption wavelength existing on the shortest wavelength side is 0.6 to 2.0. In the above-described range, in a case where the absorbance at the maximal absorption wavelength existing on the second shortest wavelength side is set to 1, the absorbance at the maximal absorption wavelength existing on the shortest wavelength side is preferably 0.8 to 1.8 and more preferably 1.0 to 1.6.

(Requirement 2) particles of an infrared-absorbing coloring agent which is at least one selected from a pyrrolopyrrole compound having one or more groups represented by Formula (1) and one or more groups represented by Formula (2) or a squarylium compound having one or more groups represented by Formula (1) and one or more groups represented by Formula (2). The infrared-absorbing coloring agent is preferably a pyrrolopyrrole compound having one or more groups represented by Formula (1) and one or more groups represented by Formula (2).

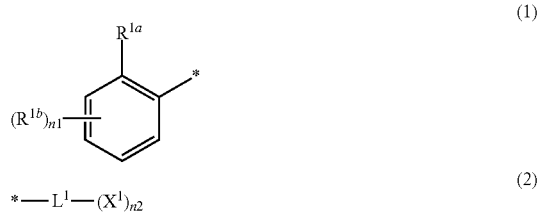

In Formula (1), $R^{1a}$ represents an alkyl group, a halogen atom, an alkenyl group, an alkynyl group, an aryl group, a heteroaryl group, or a cyano group, $R^{1b}$ represents a substituent, n1 represents an integer of 0 to 4, and * represents a bonding site.

In Formula (2), $L^1$ represents an aliphatic hydrocarbon group, an aromatic hydrocarbon group, a heterocyclic group, —O—, —S—, —NR$^{L1}$—, —CO—, —COO—, —OCO—, —SO$_2$—, an (n2+1)-valent linking group consisting of a combination of these groups, or a single bond, $R^{L1}$ represents a hydrogen atom, an alkyl group, or an aryl group, $X^1$ represents an acid group or a basic group, n2 represents an integer of 1 or more, and * represents a bonding site.

However, in a case where n2 is an integer of 2 or more, $L^1$ represents a tri- or higher valent linking group.

Examples of the halogen atom represented by $R^{1a}$ include a fluorine atom, a chlorine atom, a bromine atom, and an iodine atom.

The number of carbon atoms in the alkyl group represented by $R^{1a}$ is preferably 1 to 30, more preferably 1 to 20, still more preferably 1 to 10, even more preferably 1 to 5, and particularly preferably 1 to 3. The alkyl group may be linear, branched, or cyclic forms, and is preferably linear or branched and more preferably linear.

The number of carbon atoms in the alkenyl group represented by $R^{1a}$ is preferably 2 to 30, more preferably 2 to 20, still more preferably 2 to 10, and even more preferably 2 to 5.

The number of carbon atoms in the alkynyl group represented by $R^{1a}$ is preferably 2 to 30, more preferably 2 to 20, still more preferably 2 to 10, and even more preferably 2 to 5.

The aryl group represented by $R^{1a}$ preferably has 6 to 30 carbon atoms, more preferably has 6 to 20 carbon atoms, and still more preferably has 6 to 12 carbon atoms.

The number of carbon atoms in the heteroaryl group represented by $R^{1a}$ is preferably 1 to 30 and more preferably 1 to 12. Examples of the type of heteroatom constituting the heteroaryl group include a nitrogen atom, an oxygen atom, and a sulfur atom. The number of heteroatoms constituting the heteroaryl group is preferably 1 to 3 and more preferably 1 or 2. The heteroaryl group is preferably a monocyclic ring or a fused ring, more preferably a monocyclic ring or a fused ring composed of 2 to 8 rings, and still more preferably a monocyclic ring or a fused ring composed of 2 to 4 rings.

The alkyl group, alkenyl group, alkynyl group, aryl group, and heteroaryl group represented by $R^{1a}$ may further have a substituent. Examples of the substituent include a substituent T described later. The substituent is preferably a group other than the group represented by Formula (2).

$R^{1a}$ in Formula (1) is preferably an alkyl group, a halogen atom, or an aryl group, more preferably an alkyl group or an aryl group, and still more preferably an alkyl group.

Examples of the substituent represented by $R^{1b}$ in Formula (1) include an alkyl group, an alkenyl group, an alkynyl group, an aryl group, a heteroaryl group, an alkoxy group, an aryloxy group, a heteroaryloxy group, an acyl group, an alkylcarbonyl group, an arylcarbonyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a sulfinyl group, a ureide group, a hydroxy group, a mercapto group, a halogen atom, a cyano group, a nitro group, an imino group, and a silyl group, and an alkyl group, an alkoxy group, an aryloxy group, or a halogen atom is preferable. These groups may further have a substituent. Examples of the substituent include a substituent T described later. The substituent is preferably a group other than the group represented by Formula (2).

n1 in Formula (1) represents an integer of 0 to 4, and is preferably an integer of 0 to 2 and more preferably 0.

$L^1$ in Formula (2) represents an aliphatic hydrocarbon group, an aromatic hydrocarbon group, a heterocyclic group, —O—, —S—, —NR$^{L1}$—, —CO—, —COO—, —OCO—, —SO$_2$—, or an (n2+1)-valent linking group consisting of a combination of these groups, and $R^{L1}$ represents a hydrogen atom, an alkyl group, or an aryl group. In a case where n2 is 1, $L^1$ may be a single bond.

The number of carbon atoms in the aliphatic hydrocarbon group is preferably 1 to 20, more preferably 2 to 20, still more preferably 2 to 10, and particularly preferably 2 to 5. The aliphatic hydrocarbon group may be linear, branched, or cyclic. In addition, the cyclic aliphatic hydrocarbon group may be a single ring or a polycyclic ring. The number of carbon atoms in the aromatic hydrocarbon group is preferably 6 to 18, more preferably 6 to 14, and still more preferably 6 to 10. The aliphatic hydrocarbon group may have a substituent.

The number of carbon atoms in the aromatic hydrocarbon group is preferably 6 to 18, more preferably 6 to 14, and still more preferably 6 to 10. The aromatic hydrocarbon group is preferably an aromatic hydrocarbon group having a single ring or a fused ring having 2 to 4 fused numbers, and more preferably an aromatic hydrocarbon group having a single ring. The aromatic hydrocarbon group is preferably a benzene ring group.

The heterocyclic group is preferably a monocyclic ring or a fused ring having 2 to 4 fused rings. The number of heteroatoms constituting a ring of the heterocyclic group is preferably 1 to 3. The heteroatom constituting the ring of the heterocyclic group is preferably a nitrogen atom, an oxygen atom, or a sulfur atom. The number of carbon atoms constituting the ring of the heterocyclic group is preferably 3 to 30, more preferably 3 to 18, and more preferably 3 to 12. Specific examples of the heterocyclic group include a piperazine ring group, a pyrrolidine ring group, a pyrrole ring group, a piperidine ring group, a pyridine ring group, an imidazole ring group, a pyrazole ring group, an oxazole ring group, a thiazole ring group, a pyrazine ring group, a morpholine ring group, a thiazine ring group, an indole ring group, an isoindole ring group, a benzimidazole ring group, a purine ring group, a quinoline ring group, an isoquinoline ring group, a quinoxaline ring group, a cinnoline ring group, a carbazole ring group, and groups represented by Formulae (L-1) to (L-7).

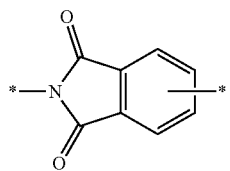
(L-1)

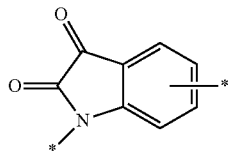
(L-2)

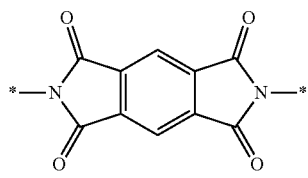
(L-3)

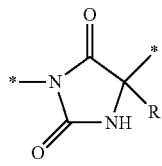
(L-4)

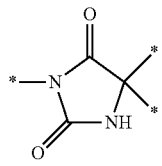
(L-5)

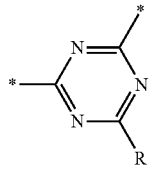
(L-6)

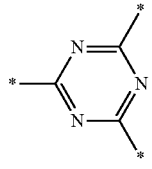
(L-7)

* in the formulae represents a bonding site with $X^1$ and the like. R represents a hydrogen atom or a substituent. Examples of the substituent include the substituent T described in Formula (1).

The aliphatic hydrocarbon group, the aromatic hydrocarbon group, and the heterocyclic group may have a substituent. Examples of the substituent include groups in the description of the substituent T described later.

The alkyl group represented by $R^{L1}$ preferably has 1 to 20 carbon atoms, more preferably has 1 to 15 carbon atoms, and still more preferably has 1 to 8 carbon atoms. The alkyl group may be linear, branched, or cyclic, and is preferably linear or branched and more preferably linear. The alkyl group represented by $R^{L1}$ may further have a substituent. Examples of the substituent include the substituent T described later.

The aryl group represented by $R^{L1}$ preferably has 6 to 30 carbon atoms, more preferably has 6 to 20 carbon atoms, and still more preferably has 6 to 12 carbon atoms. The aryl group represented by $R^{L1}$ may further have a substituent. Examples of the substituent include the substituent T described later.

Examples of the acid group represented by $X^1$ in Formula (2) include a sulfo group, a carboxyl group, a phosphoric acid group, a boronic acid group, a sulfonimide group, a sulfonamide group, and salts of these group. Examples of an atom or atomic group constituting the salts include alkali metal ions ($Li^+$, $Na^+$, $K^+$, and the like), alkaline earth metal ions ($Ca^{2+}$, $Mg^{2+}$, and the like), an ammonium ion, an imidazolium ion, a pyridinium ion, and a phosphonium ion.

Examples of the basic group represented by $X^1$ in Formula (2) include an amino group, a pyridinyl group, or a salt thereof, a salt of an ammonium group, and a phthalimidomethyl group. Examples of an atom or atomic group constituting the salts include a hydroxide ion, a halogen ion, a carboxylate ion, a sulfonate ion, and a phenoxide ion.

Examples of the amino group include a group represented by —$NRx^1Rx^2$ and a cyclic amino group.

In the group represented by —$NRx^1Rx^2$, $Rx^1$ and $Rx^2$ each independently represent a hydrogen atom, an alkyl group, or an aryl group, and an alkyl group is preferable. The alkyl group preferably has 1 to 10 carbon atoms, more preferably has 1 to 5 carbon atoms, and still more preferably 1 to 3 carbon atoms. The alkyl group may be any of linear, branched, and cyclic forms, but is preferably linear or branched and more preferably linear. The alkyl group may have a substituent. Examples of the substituent include a substituent T described later. The number of carbon atoms in the aryl group is preferably 6 to 30, more preferably 6 to 20, and still more preferably 6 to 12. The aryl group may have a substituent. Examples of the substituent include a substituent T described later. In addition, $Rx^1$ and $RX^2$ may be bonded to each other to form a ring.

Examples of the cyclic amino group include a pyrrolidine group, a piperidine group, a piperazine group, and a morpholine group. These groups may further have a substituent. Examples of the substituent include a substituent T described later. Specific examples of the substituent include an alkyl group and an aryl group.

$X^1$ in Formula (2) is preferably a sulfo group, a phosphoric acid group, a group represented by Formula (X-1), a group represented by Formula (X-2), a group represented by Formula (X-3), or a group represented by Formula (X-4), and more preferably a sulfo group, a group represented by Formula (X-1), or a group represented by Formula (X-3).

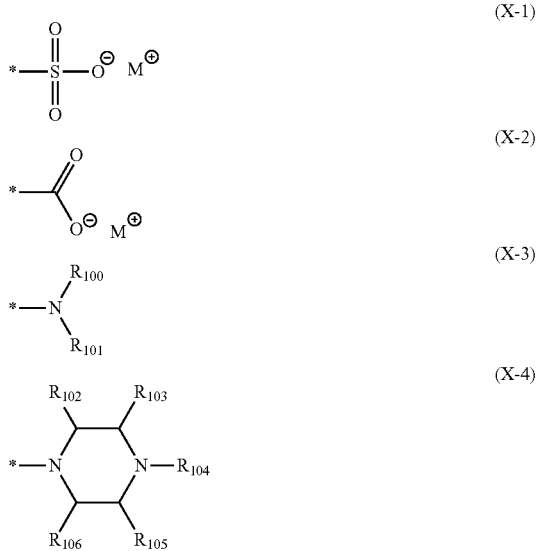

In Formulae (X-1) to (X-4), $R^{100}$ to $R^{106}$ each independently represent a hydrogen atom, an alkyl group, an alkenyl group, or an aryl group, $R^{100}$ and $R^{101}$ may be linked to each other to form a ring, and M represents an atom or atomic group constituting a salt with an anion. Examples of M include alkali metal ions ($Li^+$, $Na^+$, $K^+$, and the like), alkaline earth metal ions ($Ca^{2+}$, $Mg^{2+}$, and the like), an ammonium ion, an imidazolium ion, a pyridinium ion, and a phosphonium ion.

n2 in Formula (2) represents an integer of 1 or more, and is preferably an integer of 1 or 3, more preferably 1 or 2, and still more preferably 1.

(Substituent T)

Examples of the substituent T include the following groups: a halogen atom (for example, a fluorine atom, a chlorine atom, a bromine atom, and an iodine atom), an alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), a heteroaryl group (preferably a heteroaryl group having 1 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group (preferably a heteroaryloxy group having 1 to 30 carbon atoms), an acyl group (preferably an acyl group having 2 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), a heteroaryloxycarbonyl group (preferably a heteroaryloxycarbonyl group having 2 to 30 carbon atoms), an acyloxy group (preferably an acyloxy group having 2 to 30 carbon atoms), an acylamino group (preferably an acylamino group having 2 to 30 carbon atoms), an aminocarbonylamino group (preferably an aminocarbonylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a sulfamoylamino group (preferably a sulfamoylamino group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably a heteroarylthio group having 1 to 30 carbon atoms), an alkylsulfonyl group (preferably an alkylsulfonyl group having 1 to 30 carbon atoms), an alkylsulfonylamino group (preferably an alkylsulfonylamino group having 1 to 30 carbon atoms), an arylsulfonyl group (preferably an arylsulfonyl group having 6 to 30 carbon atoms), an arylsulfonylamino group (preferably an arylsulfonylamino group having 6 to 30 carbon atoms), a heteroarylsulfonyl group (preferably a heteroarylsulfonyl group having 1 to 30 carbon atoms), a heteroarylsulfonylamino group (preferably a heteroarylsulfonylamino group having 1 to 30 carbon atoms), an alkylsulfinyl group (preferably an alkylsulfinyl group having 1 to 30 carbon atoms), an arylsulfinyl group (preferably an arylsulfinyl group having 6 to 30 carbon atoms), a heteroarylsulfinyl group (preferably a heteroarylsulfinyl group having 1 to 30 carbon atoms), a ureide group (preferably a ureide group having 1 to 30 carbon atoms), a hydroxy group, a nitro group, a carboxyl group, a sulfo group, a phosphoric acid group, a carboxylic acid amide group, a sulfonic acid amide group, an imide group, a phosphino group, a mercapto group, a cyano group, an alkylsulfino group, an arylsulphino group, an arylazo group, a heteroarylazo group, a phosphinyl group, a phosphinyloxy group, a phosphinylamino group, a silyl group, a hydradino group, and an imino group. In a case where the above-described groups can be further substituted, the groups may further have a substituent. Examples of the substituent include the groups described regarding the substituent T.

The particles satisfying the above-described requirement 1 are preferably particles of the above-described infrared-absorbing coloring agent having one or more groups represented by Formula (1) and one or more groups represented by Formula (2). In addition, examples of the infrared-absorbing coloring agent constituting the specific particles satisfying the above-described requirement 1 include a pyrrolopyrrole compound, a squarylium compound, a pyrromethene compound, a croconium compound, and a cyanine compound, and a pyrromethene compound or a squarylium compound is preferable and a pyrrolopyrrole compound is more preferable.

It is preferable that the particles satisfying the above-described requirement 2 further satisfy the characteristics of the above-described requirement 1.

The specific particles in the infrared-absorbing composition have two or more maximal absorption wavelengths exhibited in a wavelength range of 650 to 1500 nm, and in the range, a difference ($\lambda_2-\lambda_1$) between the maximal absorption wavelength ($\lambda_1$) existing on the shortest wavelength side and the maximal absorption wavelength ($\lambda_2$) existing on the second shortest wavelength side is preferably 20 to 90 nm, more preferably 30 to 80 nm, and still more preferably 35 to 70 nm. In a case where the difference between the above-described wavelengths is within the above-described range, it is possible to form a film having excellent infrared shielding properties capable of shielding infrared rays in a wide wavelength range.

It is preferable that the maximal absorption wavelength of the specific particles, which exists on the shortest wavelength side, exists on a shorter wavelength side than a wavelength at which a coloring agent solution that the infrared-absorbing coloring agent constituting the specific particles is dissolved in a good solvent for the infrared-absorbing coloring agent exhibits a highest absorbance, it is more preferable to exist on the short-wave side of 30 nm or more, and it is still more preferable to exist on the short-wave side of 50 nm or more. By using particles satisfying such spectral characteristics, it is possible to form a film having a well-cut tail for absorbing infrared rays. In the present specification, the good solvent for the infrared-absorbing coloring agent means a solvent in which a dissolved amount of the infrared-absorbing coloring agent in 100 g of the solvent at 25° C. is 0.1 g or more. The good solvent is preferably a solvent in which the dissolved amount of the infrared-absorbing coloring agent in 100 g of the solvent at 25° C. is 0.1 g or more, and more preferably a solvent in which the dissolved amount is 0.2 g or more. The type of the good solvent varies depending on the type of the infrared-absorbing coloring agent, and examples thereof include dimethyl sulfoxide and chloroform.

It is preferable that the specific particles in the infrared-absorbing composition have three or more maximal absorption wavelengths exhibited in the wavelength range of 650 to 1500 nm. In addition, in a case where the absorbance at the maximal absorption wavelength existing on the second shortest wavelength side is set to 1, the absorbance at the maximal absorption wavelength existing on the third shortest wavelength side is preferably 0.2 to 2, more preferably 0.3 to 1.8, and still more preferably 0.4 to 1.5. In addition, a difference ($\lambda_3-\lambda_2$) between the maximal absorption wavelength ($\lambda_2$) existing on the second shortest wavelength side and the maximal absorption wavelength ($\lambda_3$) existing on the third shortest wavelength side is preferably 20 to 100 nm, more preferably 30 to 90 nm, and still more preferably 35 to 80 nm. A difference ($\lambda_3-\lambda_1$) between the maximal absorption wavelength ($\lambda_1$) existing on the shortest wavelength side and the maximal absorption wavelength ($\lambda_3$) existing on the third shortest wavelength side is preferably 60 to 200 nm, more preferably 70 to 170 nm, and still more preferably 80 to 150 nm.

It is preferable that the number of maximal absorption wavelengths exhibited by the specific particles in the infrared-absorbing composition in the wavelength range of 650 to 1500 nm is greater than the number of maximal absorption wavelengths exhibited by a coloring agent solution that the infrared-absorbing coloring agent is dissolved in the good solvent for the infrared-absorbing coloring agent in the wavelength range of 650 to 1500 nm. By using such specific particles, it is possible to form a film having excellent infrared shielding properties capable of shielding infrared rays in a wider wavelength range.

In the present specification, the maximal absorption wavelength and absorbance of the specific particles in the infrared-absorbing composition can be obtained by measuring an absorbance of the infrared-absorbing composition. In addition, in a case where two or more kinds of the specific particles are included in the infrared-absorbing composition, the maximal absorption wavelength and absorbance thereof are obtained by measuring an absorbance of a composition in which one kind of the specific particles other than those to be measured is excluded from the infrared-absorbing composition. For example, in a case of an infrared-absorbing composition including specific particles A, specific particles B, a solvent, and other additives, the maximal absorption wavelength and absorbance of the specific particles A in the infrared-absorbing composition are obtained by measuring an absorbance of a composition in which the specific particles B are excluded from the infrared-absorbing composition. In addition, the maximal absorption wavelength and absorbance of the specific particles B in the infrared-absorbing composition are obtained by measuring an absorbance of a composition in which the specific particles A are excluded from the infrared-absorbing composition. In addition, in a case where the infrared-absorbing composition further includes materials such as an infrared absorber other than the specific particles, a chromatic colorant, and a black colorant in addition to the specific particles, the maximal absorption wavelength and absorbance of the specific particles in the infrared-absorbing composition are obtained by measuring an absorbance of a composition in which these materials are excluded from the infrared-absorbing composition. For example, in a case of an infrared-absorbing composition including the specific particles, an infrared absorber other than the specific particles, a solvent, and other additives, the maximal absorption wavelength and absorbance of the specific particles in the infrared-absorbing composition are obtained by measuring an absorbance of a composition in which the infrared absorber other than the specific particles is excluded from the infrared-absorbing composition.

The dissolved amount of the specific particles in 100 g of water at 25° C. is preferably 0.075 g or less, more preferably 0.05 g or less, and still more preferably 0.025 g or less.

The dissolved amount of the specific particles in 100 g of propylene glycol monomethyl ether at 25° C. is preferably 0.075 g or less, more preferably 0.05 g or less, and still more preferably 0.025 g or less.

The dissolved amount of the specific particles in 100 g of cyclopentanone at 25° C. is preferably 0.075 g or less, more preferably 0.05 g or less, and still more preferably 0.025 g or less.

The infrared-absorbing coloring agent constituting the specific particles is preferably a compound represented by Formula (PP-1). That is, the specific particles are preferably particles of the compound represented by Formula (PP-1).

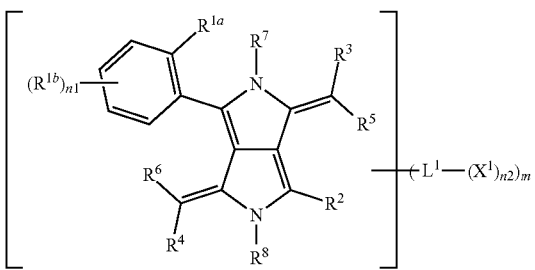

(PP-1)

In the formula, $R^{1a}$ represents an alkyl group, a halogen atom, an alkenyl group, an alkynyl group, an aryl group, a heteroaryl group, or a cyano group, $R^{1b}$ represents a substituent, $R^2$ represents an alkyl group, an aryl group, or a heteroaryl group, $R^3$, $R^4$, $R^5$, and $R^6$ each independently represent a cyano group, an acyl group, an alkoxycarbonyl group, an alkylsulfinyl group, an arylsulfinyl group, or a heteroaryl group, $R^7$ and $R^8$ each independently represent a hydrogen atom, an alkyl group, an aryl group, a heteroaryl group, —$BR^9R^{10}$, or a metal atom, $R^9$ and $R^{10}$ each independently represent a hydrogen atom, a halogen atom, an alkyl group, an alkenyl group, an aryl group, a heteroaryl group, an alkoxy group, an aryloxy group, or a heteroaryloxy group, $R^9$ and $R^{10}$ may be bonded to each other to form a ring, $R^7$ may be covalently bonded or coordinately bonded to $R^3$ or $R^5$, $R^8$ may be covalently bonded or coordinately bonded to $R^2$, $R^4$, or $R^6$, $L^1$ represents an aliphatic hydrocarbon group, an aromatic hydrocarbon group, a nitrogen-containing heterocyclic group, —O—, —S—, —$NR^{L1}$—, —CO—, —COO—, —OCO—, —$SO_2$—, an (n2+1)-valent linking group consisting of a combination of these groups, or a single bond, $R^{L1}$ represents a hydrogen atom, an alkyl group, or an aryl group, $X^1$ represents an acid group or a basic group, n1 represents an integer of 0 to 4, n2 represents an integer of 1 or more, and m represents an integer of 1 or more.

However, in a case where n2 is an integer of 2 or more, $L^1$ represents a tri- or higher valent linking group.

"-$L^1$-$(X^1)_{n2}$" can be bonded at a bondable position in Formula (PP-1).

$R^{1a}$, $R^{1b}$, and n1 in Formula (PP-1) have the same meanings as $R^{1a}$, $R^{1b}$, and n1 in Formula (1), and the preferred ranges thereof are also the same. $L^1$, $X^1$, and n2 in Formula (PP-1) have the same meanings as $L^1$, $X^1$, and n2 in Formula (2), and the preferred ranges thereof are also the same.

$R^2$ in Formula (PP-1) represents an alkyl group, an aryl group, or a heteroaryl group, and an aryl group or a heteroaryl group is preferable and an aryl group is more preferable.

The alkyl group represented by $R^2$ preferably has 1 to 30 carbon atoms, more preferably has 1 to 20 carbon atoms, and still more preferably has 1 to 10 carbon atoms.

The aryl group represented by $R^2$ preferably has 6 to 30 carbon atoms, more preferably has 6 to 20 carbon atoms, and still more preferably has 6 to 12 carbon atoms.

The number of carbon atoms in the heteroaryl group represented by $R^2$ is preferably 1 to 30 and more preferably 1 to 12. Examples of the type of heteroatom constituting the heteroaryl group include a nitrogen atom, an oxygen atom, and a sulfur atom. The number of heteroatoms constituting the heteroaryl group is preferably 1 to 3 and more preferably 1 or 2. The heteroaryl group is preferably a monocyclic ring or a fused ring, more preferably a monocyclic ring or a fused ring composed of 2 to 8 rings, and still more preferably a monocyclic ring or a fused ring composed of 2 to 4 rings.

The alkyl group, the aryl group, and the heteroaryl group, represented by $R^2$, may be unsubstituted or may have a substituent. Examples of the substituent include the groups described regarding the substituent T.

It is preferable that "-$L^1$-$(X^1)_{n2}$" in Formula (PP-1) is bonded to $R^2$.

$R^3$, $R^4$, $R^5$, and $R^6$ in Formula (PP-1) each independently represent a cyano group, an acyl group, an alkoxycarbonyl group, an alkylsulfinyl group, an arylsulfinyl group, or a heteroaryl group.

It is preferable that one of $R^3$ and $R^5$ represents a cyano group, an acyl group, an alkoxycarbonyl group, an alkylsulfinyl group, or an arylsulfinyl group, and the other represents a heteroaryl group, and it is more preferable that one of $R^3$ and $R^5$ represents a cyano group and the other represents a heteroaryl group.

It is preferable that one of $R^4$ and $R^6$ represents a cyano group, an acyl group, an alkoxycarbonyl group, an alkylsulfinyl group, or an arylsulfinyl group, and the other represents a heteroaryl group, and it is more preferable that one of $R^4$ and $R^6$ represents a cyano group and the other represents a heteroaryl group.

The number of carbon atoms in the heteroaryl group represented by $R^3$ to $R^6$ is preferably 1 to 30 and more preferably 1 to 12. Examples of the type of heteroatom constituting the heteroaryl group include a nitrogen atom, an oxygen atom, and a sulfur atom. The number of heteroatoms constituting the heteroaryl group is preferably 1 to 3 and more preferably 1 or 2. The heteroaryl group is preferably a monocyclic ring or a fused ring, more preferably a monocyclic ring or a fused ring composed of 2 to 8 rings, and still more preferably a monocyclic ring or a fused ring composed of 2 to 4 rings. The heteroaryl group may be unsubstituted or may have a substituent. Examples of the substituent include the groups described regarding the substituent T.

$R^7$ and $R^8$ in Formula (PP-1) each independently represent a hydrogen atom, an alkyl group, an aryl group, a heteroaryl group, —$BR^9R^{10}$, or a metal atom, and —$BR^9R^{10}$ is preferable.

Examples of the alkyl group, the aryl group, and the heteroaryl group represented by $R^7$ and $R^8$ include the groups described in $R^2$ above, and the preferred ranges thereof are also the same.

Examples of the metal atom represented by $R^7$ and $R^8$ include magnesium, aluminum, calcium, barium, zinc, tin, aluminum, vanadium, iron, cobalt, nickel, copper, palladium, iridium, and platinum, and aluminum, zinc, vanadium, iron, copper, vanadium, iridium, or platinum is preferable.

$R^9$ and $R^{10}$ in the group represented by —$BR^9R^{10}$ each independently represent a hydrogen atom, a halogen atom, an alkyl group, an alkenyl group, an aryl group, a heteroaryl group, an alkoxy group, an aryloxy group, or a heteroaryloxy group, and a halogen atom, an alkyl group, an aryl group, or a heteroaryl group is preferable, a halogen atom, an alkyl group, or an aryl group is more preferable, and an aryl group is still more preferable.

Examples of the halogen atom represented by $R^9$ and $R^{10}$ include a fluorine atom, a chlorine atom, a bromine atom, and an iodine atom, and a fluorine atom is preferable.

The number of carbon atoms in the alkyl group and the alkoxy group represented by $R^9$ and $R^{10}$ is preferably 1 to 40. The lower limit is, for example, more preferably 3 or more. The upper limit is, for example, more preferably 30 or less and still more preferably 25 or less. The alkyl group and the alkoxy group may be linear, branched, or cyclic, and are preferably linear or branched.

The number of carbon atoms in the alkenyl group represented by $R^9$ and $R^{10}$ is preferably 2 to 40. The lower limit is, for example, more preferably 3 or more. The upper limit is, for example, more preferably 30 or less and still more preferably 25 or less.

The number of carbon atoms in the aryl group and the aryloxy group represented by $R^9$ and $R^{10}$ is preferably 6 to 20 and more preferably 6 to 12. The aryl group and the aryloxy group may have a substituent or may be unsubstituted. Examples of the substituent include an alkyl group, an alkoxy group, and a halogen atom.

The heteroaryl group and the heteroaryloxy group represented by $R^9$ and $R^{10}$ may be a single ring or a polycyclic ring. The number of heteroatoms constituting a heteroaryl ring of the heteroaryl group and the heteroaryloxy group is preferably 1 to 3. As the heteroatom constituting the heteroaryl ring, a nitrogen atom, an oxygen atom, or a sulfur atom is preferable. The number of carbon atoms constituting the heteroaryl ring is preferably 3 to 30, more preferably 3 to 18, still more preferably 3 to 12, and particularly preferably 3 to 5. It is preferable that the heteroaryl ring is a 5-membered or 6-membered ring. The heteroaryl group and the heteroaryloxy group may have a substituent or may be unsubstituted. Examples of the substituent include an alkyl group, an alkoxy group, and a halogen atom.

$R^9$ and $R^{10}$ of $-BR^9R^{10}$ may be bonded to each other to form a ring. Examples thereof include structures shown in Formulae (B-1) to (B-4). In the following, Rb represents a substituent, $Rb^1$ to $Rb^4$ each independently represent a hydrogen atom or a substituent, b1 to b3 each independently represent an integer of 0 to 4, and * represents a bonding position with Formula (PP-1). Examples of the substituent represented by Rb and $Rb^1$ to $Rb^4$ include the substituents described in the substituent T above, and a halogen atom, an alkyl group, or an alkoxy group is preferable.

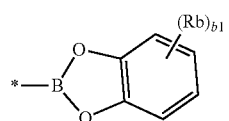

(B-1)

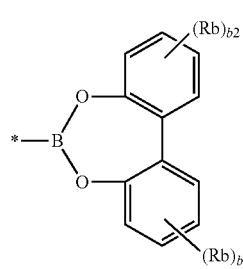

(B-2)

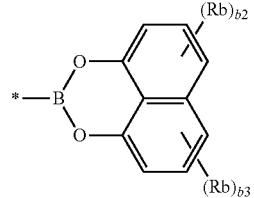

(B-3)

(B-4)

In Formula (PP-1), $R^7$ may be covalently-bonded or coordinately bonded to $R^3$ or $R^5$, and $R^8$ may be covalently bonded or coordinately bonded to $R^2$, $R^4$, or $R^6$.

m in Formula (PP-1) represents an integer of 1 or more, and is preferably an integer of 1 to 4, more preferably an integer of 1 to 3, still more preferably 1 or 2, and particularly preferably 1.

The compound represented by Formula (PP-1) is preferably a compound represented by Formula (PP-2).

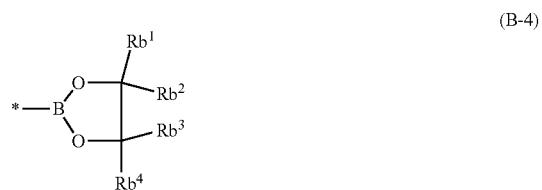

(PP-2)

$R^{1a}$, $R^{1b}$, $R^3$ to $R^8$, $L^1$, $X^1$, n1, and n2 in Formula (PP-2) have the same meanings as $R^{1a}$, $R^{1b}$, $R^3$ to $R^8$, $L^1$, $X^1$, n1, and n2 in Formula (PP-1), and the preferred ranges thereof are also the same.

m1 in Formula (PP-2) represents an integer of 1 to 4, and is preferably an integer of 1 to 3, more preferably 1 or 2, and particularly preferably 1.

Specific examples of the compound represented by Formula (PP-1) include compounds having the following structures. In the following structural formulae, Me represents a methyl group, Et represents an ethyl group, and Ph represents a phenyl group.

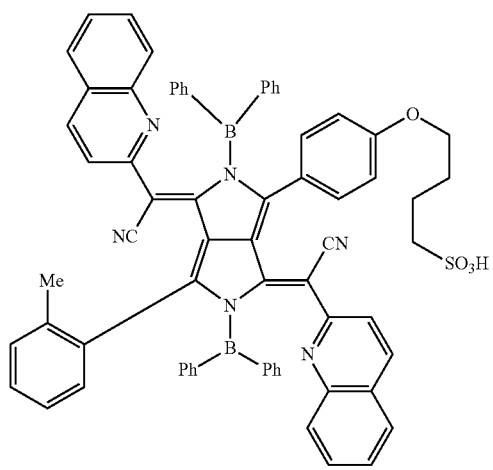
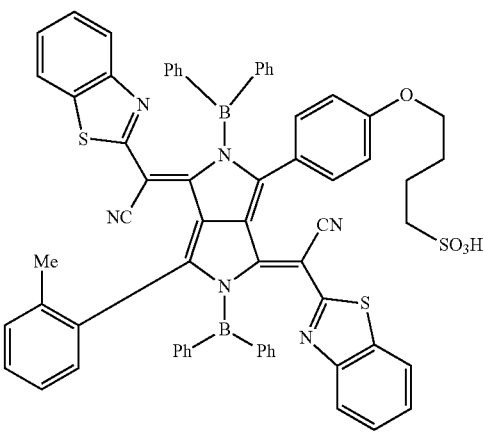
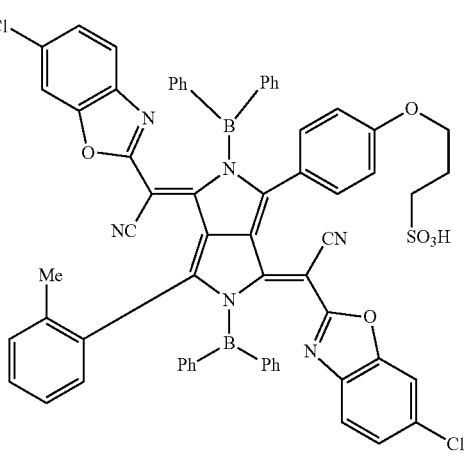
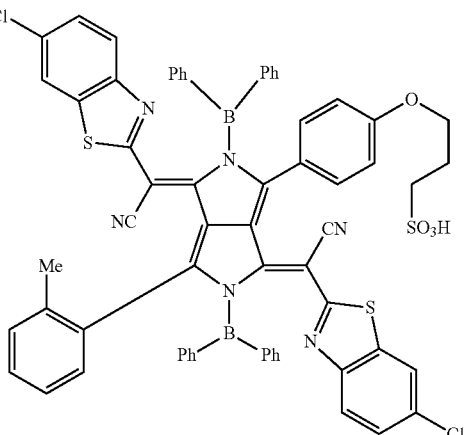

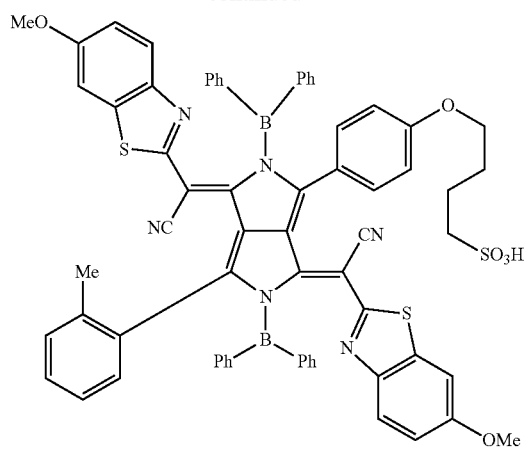
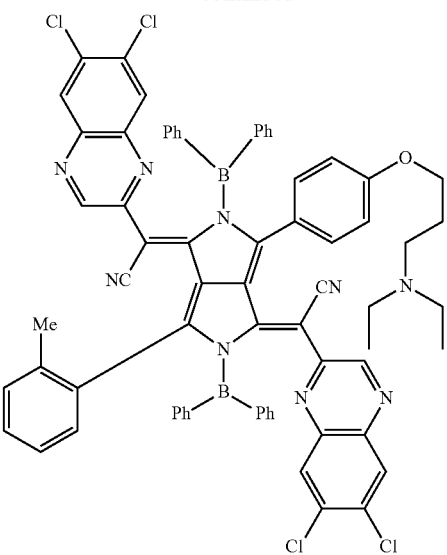
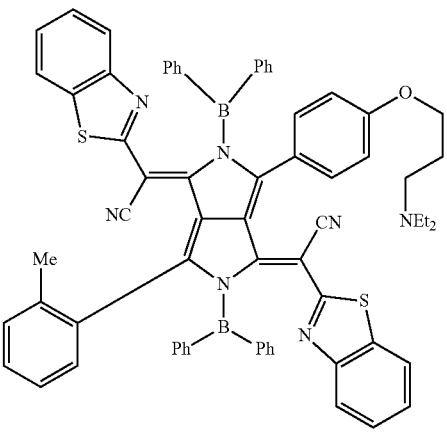
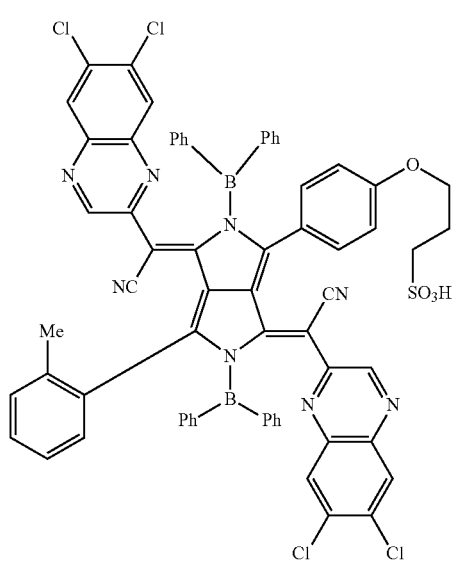
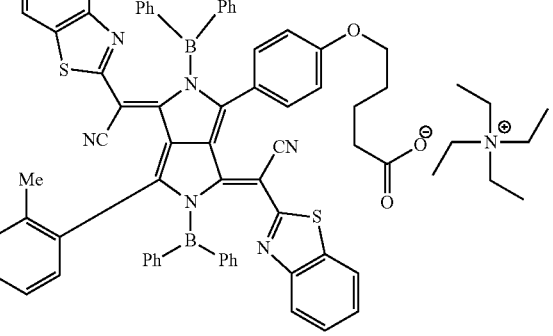

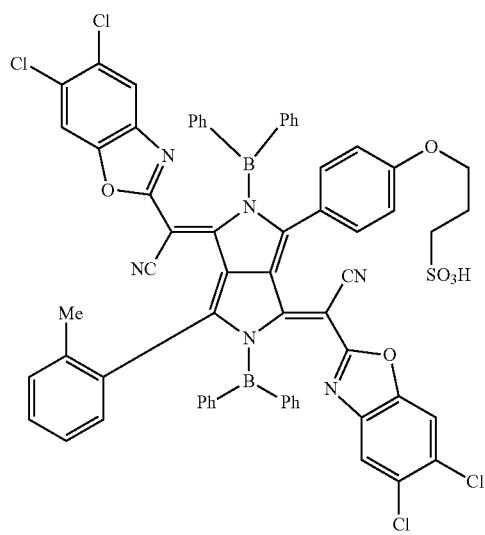
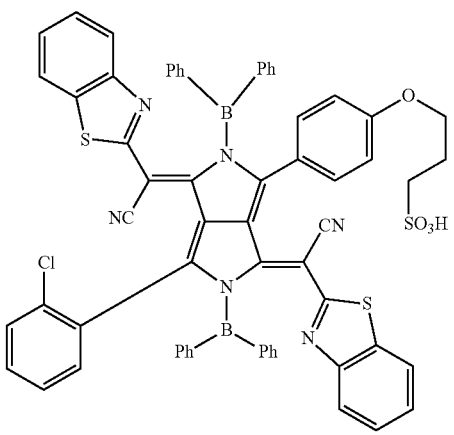
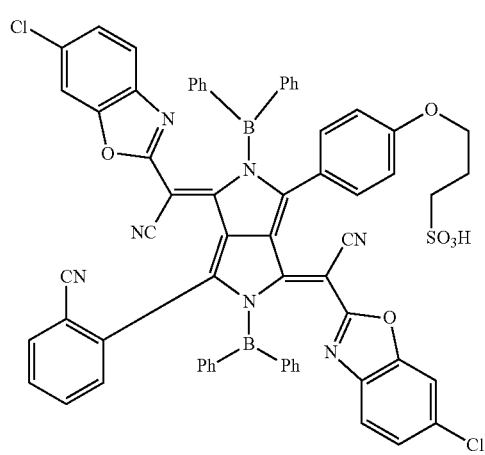
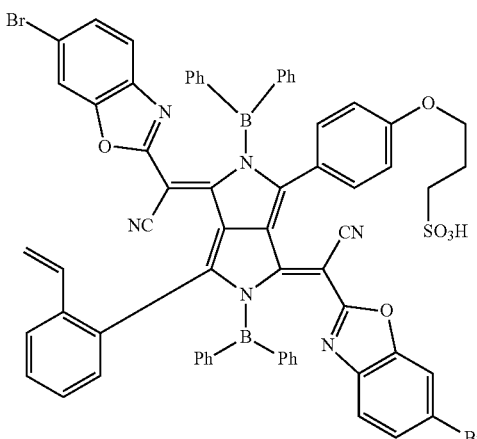
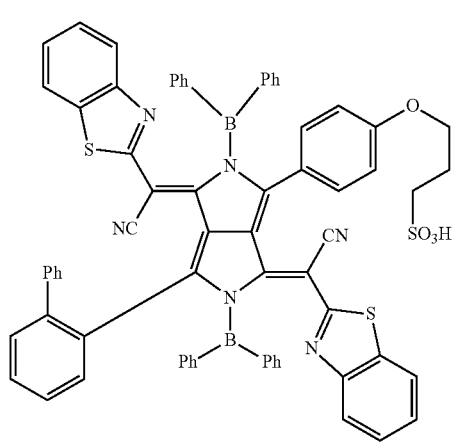
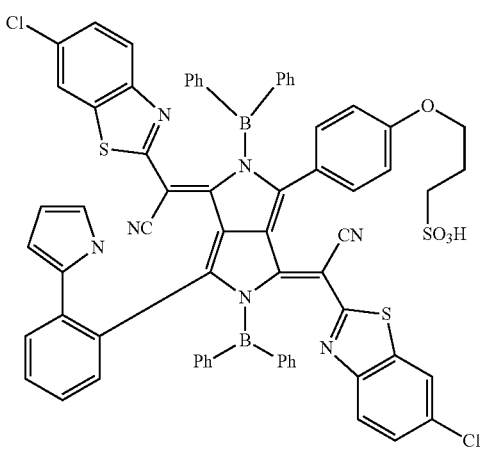

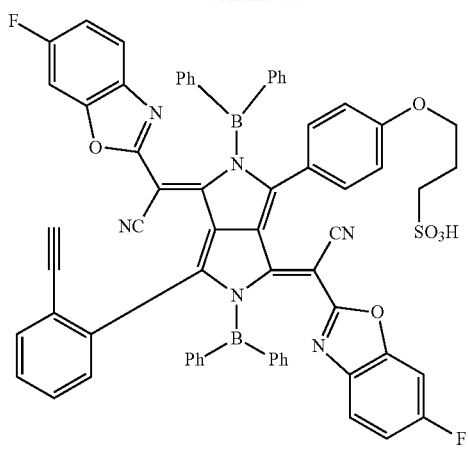
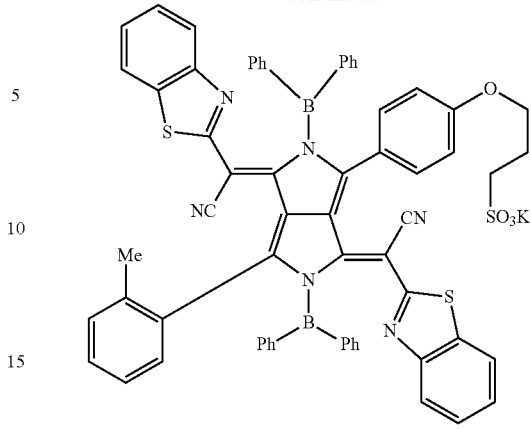
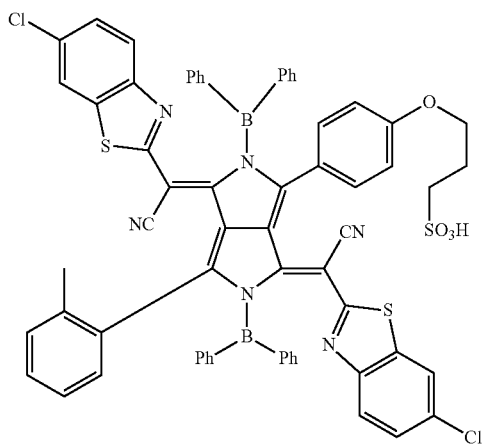
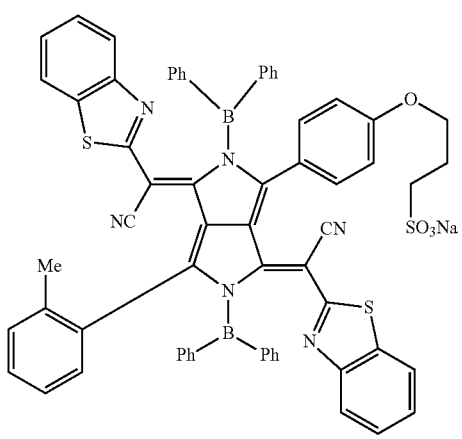

A content of the specific particles in the total solid content of the infrared-absorbing composition is preferably 1% by mass or more, more preferably 5% by mass or more, still more preferably 10% by mass or more, and particularly preferably 15% by mass or more. In addition, the upper limit of the content of the specific particles is preferably 70% by mass or less, more preferably 60% by mass or less, and still more preferably 50% by mass or less. The infrared-absorbing composition may include only one kind of the specific particles, or may include two or more kinds thereof. In a case of including two or more kinds thereof, the total amount thereof is preferably within the above-described range.

<<Solvent>>

The infrared-absorbing composition according to the embodiment of the present invention contains a solvent. Examples of the solvent include water and an organic solvent. Examples of the organic solvent include an ester-based solvent, a ketone-based solvent, an alcohol-based solvent, an amide-based solvent, an ether-based solvent, a carbonate-based solvent, and a hydrocarbon-based solvent. The details of the organic solvent can be found in paragraph No. 0223 of WO2015/166779A, the content of which is incorporated herein by reference. In addition, an ester-based solvent in which a cyclic alkyl group is substituted or a ketone-based solvent in which a cyclic alkyl group is substituted can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, 2-pentanone, 3-pentanone, 4-heptanone, 2-methylcyclohexanone, 3-methylcyclohexanone, 4-methylcyclohexanone, cycloheptanone, cyclooctanone, cyclohexyl acetate, cyclopentanone, ethylcarbitol acetate, butylcarbitol acetate, propylene glycol monomethyl ether, propylene glycol monomethyl ether acetate, 3-methoxy-N,N-dimethylpropanamide, 3-butoxy-N,N-dimethylpropanamide, y-butyrolactone, N-methyl-2-pyrrolidone, propylene glycol diacetate, sulfolane, anisole, 1,4-diacetoxybutane, diethylene glycol monoethyl ether acetate, butane diacetate-1,3-diyl, dipropylene glycol methyl ether acetate, diacetone alcohol (also known as diacetone alcohol or 4-hydroxy-4-methyl-2-pentanone), 2-methoxypropyl acetate, 2-methoxy-1-propanol, and isopropyl alcohol. In this case, it may be preferable that the content of aromatic hydrocarbons (such as benzene, toluene, xylene, and ethylbenzene) as the organic solvent is low (for example, 50 parts per million (ppm) by mass or less, 10 ppm by mass or less, or 1 ppm by mass or less with respect to the total amount of the organic solvent) in consideration of environmental aspects and the like.

As the organic solvent, one kind may be used alone, or two or more kinds may be used in combination. In a case where two or more kinds of organic solvents are contained, examples of one of preferred aspects in a case where the two or more kinds of organic solvents are used in combination include an aspect that a first organic solvent which is an ester-based solvent and a second organic solvent which includes at least one organic solvent selected from an ester-based solvent different from the first organic solvent, a ketone-based solvent, an amide-based solvent, an ether-based solvent, or a carbonate-based solvent are used in combination.

In this case, a boiling point of the second organic solvent is preferably 150° C. to 250° C. In addition, a boiling point of the first organic solvent is preferably 100° C. to 200° C.

In the present invention, an organic solvent having a low metal content is preferably used. For example, the metal content in the organic solvent is preferably 10 mass parts per billion (ppb) or less. Optionally, an organic solvent having a metal content at a mass parts per trillion (ppt) level may be used. For example, such an organic solvent is available from Toyo Gosei Co., Ltd. (The Chemical Daily, Nov. 13, 2015).

Examples of a method for removing impurities such as a metal from the organic solvent include distillation (such as molecular distillation and thin-film distillation) and filtration using a filter. The filter pore size of the filter used for the filtration is preferably 10 µm or less, more preferably 5 µm or less, and still more preferably 3 µm or less. As a material of the filter, polytetrafluoroethylene, polyethylene, or nylon is preferable.

The organic solvent may include an isomer (a compound having the same number of atoms and a different structure). In addition, only one kind of isomers may be included, or a plurality of isomers may be included.

The organic solvent preferably has the content of peroxides of 0.8 mmol/L or less, and more preferably, the organic solvent does not substantially include peroxides.

In a case where the infrared-absorbing composition according to the embodiment of the present invention is used as a composition for ink, as the solvent, it is preferable to use water or a mixed solvent of water and an water-soluble organic solvent.

Examples of the water-soluble organic solvent include polyhydric alcohols such as glycerin, ethylene glycol, diethylene glycol, triethylene glycol, propylene glycol, dipropylene glycol, tripropylene glycol, 1,3-butanediol, and 2,3-butanediol;

sugar alcohols;

alkyl alcohols having 1 to 4 carbon atoms, such as ethanol, methanol, butanol, propanol, and isopropanol;

aliphatic diols such as 2-ethyl-2-methyl-1,3-propanediol, 3,3-dimethyl-1,2-butanediol, 2,2-diethyl-1,3-propanediol, 2-ethyl-1,3-hexanediol, and 2,2,4-trimethyl-1,3-pentanediol; and glycol ethers such as ethylene glycol monomethyl ether, ethylene glycol monoethyl ether, ethylene glycol monobutyl ether, ethylene glycol monomethyl ether acetate, diethylene glycol monomethyl ether, diethylene glycol monoethyl ether, diethylene glycol mono-n-propyl ether, ethylene glycol mono-iso-propyl ether, diethylene glycol mono-iso-propyl ether, ethylene glycol mono-n-butyl ether, ethylene glycol mono-t-butyl ether, diethylene glycol mono-t-butyl ether, triethylene glycol monoethyl ether, 1-methyl-1-methoxybutanol, propylene glycol monomethyl ether, propylene glycol monoethyl ether, propylene glycol mono-t-butyl ether, propylene glycol mono-n-propyl ether, propylene glycol mono-iso-propyl ether, dipropylene glycol, dipropylene glycol monomethyl ether, dipropylene glycol monoethyl ether, dipropylene glycol mono-n-propyl ether, dipropylene glycol mono-iso-propyl ether, and tripropylene glycol monomethyl ether.

A proportion of water in the mixed solvent is preferably 30% to 99% by mass, more preferably 40% to 99% by mass, and still more preferably 50% to 99% by mass.

A content of the solvent is preferably 10% to 97% by mass with respect to the total amount of the infrared-absorbing composition. The lower limit is preferably 30% by mass or more, more preferably 40% by mass or more, still more preferably 50% by mass or more, even still more preferably 60% by mass or more, and particularly preferably 70% by mass or more. The upper limit is preferably 96% by mass or less and more preferably 95% by mass or less. The infrared-absorbing composition may include only one kind of solvent, or may include two or more kinds thereof. In a case of including two or more kinds thereof, the total amount thereof is preferably within the above-described range.

<<Other Infrared Absorbers>>

The infrared-absorbing composition according to the embodiment of the present invention can contain an infrared absorber other than the above-described specific particles (other infrared absorbers). By further containing other infrared absorbers, it is possible to form a film capable of shielding infrared rays in a wider wavelength range. The other infrared absorbers may be a dye or a pigment (particle). Examples of the other infrared absorbers include a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a dithiolene metal complex, a metal oxide, and a metal boride. Examples of the pyrrolopyrrole compound include compounds described in paragraph Nos. 0016 to 0058 of JP2009-263614A, compounds described in paragraph Nos. 0037 to 0052 of JP2011-068731A, and compounds described in paragraph Nos. 0010 to 0033 of WO2015/166873A. Examples of the squarylium compound include compounds described in paragraph Nos. 0044 to 0049 of JP2011-208101A, compounds described in paragraph Nos. 0060 and 0061 of JP6065169B, compounds described in paragraph No. 0040 of WO2016/181987A, compounds described in JP2015-176046A, compounds described in paragraph No. 0072 of WO2016/190162A, compounds described in paragraph Nos. 0196 to 0228 of JP2016-074649A, compounds described in paragraph No. 0124 of JP2017-067963A, compounds described in WO2017/135359A, compounds described in JP2017-114956A, compounds described in JP6197940B, and compounds described in WO2016/120166A. Examples of the cyanine compound include compounds described in paragraph Nos. 0044 and 0045 of JP2009-108267A, compounds described in paragraph Nos. 0026 to 0030 of JP2002-194040A, compounds described in JP2015-172004A, compounds described in JP2015-172102A, compounds described in JP2008-088426A, compounds described in paragraph No. 0090 of WO2016/190162A, and compounds described in JP2017-031394A. Examples of the croconium compound include compounds described in JP2017-082029A. Examples of the iminium compound include compounds described in JP2008-528706A, compounds described in JP2012-012399A, compounds described in JP2007-092060A, and compounds described in paragraph Nos. 0048 to 0063 of WO2018/043564A. Examples of the phthalocyanine compound include compounds described in paragraph No. 0093 of JP2012-077153A, oxytitanium phthalocyanine described in JP2006-343631A, compounds described in paragraph Nos. 0013 to 0029 of JP2013-195480A, and vanadium phthalocyanine compounds described in JP6081771B. Examples of the naphthalocyanine compound include compounds described in paragraph No. 0093 of JP2012-077153A. Examples of the dithiolene metal complex include compounds described in JP5733804B. Examples of the metal oxide include indium tin oxide, antimony tin oxide, zinc oxide, Al-doped zinc oxide, fluorine-doped tin dioxide, niobium-doped titanium dioxide, and tungsten oxide. The details of tungsten oxide can be found in paragraph Nos. 0080 of JP2016-006476A, the content of which is incorporated herein by reference. Examples of the metal boride include lanthanum boride. Examples of a commercially available product of the lanthanum boride include LaB$_6$—F (manufactured by Japan New Metals Co., Ltd.). In addition, compounds described in WO2017/119394A can also be used as the metal boride. Examples of a commercially available product of indium tin oxide include F-ITO (manufactured by DOWA HIGHTECH CO., LTD.).

In addition, as the infrared absorber, squarylium compounds described in JP2017-197437A, squarylium compounds described in JP2017-025311A, squarylium compounds described in WO2016/154782A, squarylium compounds described in JP5884953B, squarylium compounds described in JP6036689B, squarylium compounds described in JP5810604B, squarylium compounds described in paragraph Nos. 0090 to 0107 of WO2017/213047A, pyrrole ring-containing compounds described in paragraph Nos. 0019 to 0075 of JP2018-054760A, pyrrole ring-containing compounds described in paragraph Nos. 0078 to 0082 of JP2018-040955A, pyrrole ring-containing compounds described in paragraph Nos. 0043 to 0069 of JP2018-002773A, squarylium compounds having an aromatic ring at the a-amide position described in paragraph Nos. 0024 to 0086 of JP2018-041047A, amide-linked squarylium compounds described in JP2017-179131A, compounds having a pyrrole bis-type squarylium skeleton or a croconium skeleton described in JP2017-141215A, dihydrocarbazole bis-type squarylium compounds described in JP2017-082029, asymmetric compounds described in paragraph Nos. 0027 to 0114 of JP2017-068120A, pyrrole ring-containing compounds (carbazole type) described in JP2017-067963A, phthalocyanine compounds described in JP6251530B, and the like can also be used.

In a case where the infrared-absorbing coloring agent constituting the specific particles is the composition represented by Formula (PP-1), the other infrared absorbers are preferably a pyrrolopyrrole compound, and from the reason that more excellent dispersibility can be obtained and storage stability of the composition can be improved, more preferably a compound represented by Formula (PP-100).

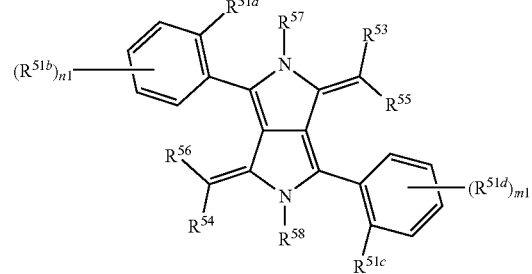

(PP-100)

In the formula, $R^{51a}$ and $R^{51c}$ each independently represent an alkyl group, a halogen atom, an alkenyl group, an alkynyl group, an aryl group, a heteroaryl group, or a cyano group, $R^{51b}$ and $R^{51d}$ each independently represent a substituent, $R^{53}$, $R^{54}$, $R^{55}$, and $R^{56}$ each independently represent a cyano group, an acyl group, an alkoxycarbonyl group, an alkylsulfinyl group, an arylsulfinyl group, or a heteroaryl group, $R^{57}$ and $R^{58}$ each independently represent a hydrogen atom, an alkyl group, an aryl group, a heteroaryl group, —BR$^{59}$R$^{60}$, or a metal atom, $R^{59}$ and $R^{60}$ each independently represent a hydrogen atom, a halogen atom, an alkyl group, an alkenyl group, an aryl group, a heteroaryl group, an alkoxy group, an aryloxy group, or a heteroaryloxy group, $R^{59}$ and $R^{60}$ may be bonded to each other to form a ring, $R^{57}$ may be covalently bonded or coordinately bonded to $R^{53}$ or $R^{55}$, $R^{58}$ may be covalently bonded or coordinately bonded to $R^{54}$ or $R^{56}$, n1 represents an integer of 0 to 4, and m1 represents an integer of 0 to 4.

$R^{51a}$ and $R^{51c}$ in Formula (PP-100) have the same meanings as $R^{1a}$ in Formula (PP-1), and the preferred ranges thereof are also the same. $R^{51b}$ and $R^{51d}$ in Formula (PP-100) have the same meanings as $R^{1b}$ in Formula (PP-1), and the preferred ranges thereof are also the same. $R^{53}$ to $R^{58}$ in Formula (PP-100) have the same meanings as $R^3$ to $R^8$ in Formula (PP-1), and the preferred ranges thereof are also the same. n1 in Formula (PP-100) represents an integer of 0 to 4, and is preferably an integer of 0 to 2 and more preferably 0. m1 in Formula (PP-100) represents an integer of 0 to 4, and is preferably an integer of 0 to 2 and more preferably 0.

Specific examples of the other infrared absorbers include infrared-absorbing coloring agents B-1 to B-9 described in Examples later.

A content of the other infrared absorbers is preferably 5 to 1000 parts by mass, more preferably 10 to 500 parts by mass, and still more preferably 30 to 300 parts by mass with respect to 100 parts by mass of the above-described specific particles. In addition, the total solid content of the above-described specific particles and the other infrared absorbers in the total solid content of the infrared-absorbing composition is preferably 1% by mass or more, more preferably 5% by mass or more, and still more preferably 15% by mass or more. The upper limit of the above-described total content is preferably 70% by mass or less, more preferably 60% by mass or less, and still more preferably 50% by mass or less.

Since the infrared-absorbing composition according to the embodiment of the present invention includes the above-described specific particles, it is possible to form a film capable of shielding infrared rays in a wide wavelength range without using other infrared absorbers. Therefore, the other infrared absorbers are not substantially contained. The fact that the other infrared absorbers are not substantially contained means that the content of the other infrared absorbers in the total solid content of the infrared-absorbing composition is 0.1% by mass or less, preferably 0.05% by or less and more preferably 0.01% by mass or less.

<<Coloring Agent Derivative>>

The infrared-absorbing composition according to the embodiment of the present invention can further contain a coloring agent derivative in addition to the above-described specific particles. Examples of the coloring agent derivative include a compound having a structure in which an acid group or a basic group is bonded to a coloring agent skeleton.

Examples of the coloring agent skeleton constituting the coloring agent derivative include a squarylium coloring agent skeleton, a pyrrolopyrrole coloring agent skeleton, a diketo pyrrolopyrrole coloring agent skeleton, a quinacridone coloring agent skeleton, an anthraquinone coloring agent skeleton, a dianthraquinone coloring agent skeleton, a benzoisoindole coloring agent skeleton, a thiazine indigo coloring agent skeleton, an azo coloring agent skeleton, a quinophthalone coloring agent skeleton, a phthalocyanine coloring agent skeleton, a naphthalocyanine coloring agent skeleton, a dioxazine coloring agent skeleton, a perylene coloring agent skeleton, a perinone coloring agent skeleton, a benzimidazolone coloring agent skeleton, a benzothiazole coloring agent skeleton, a benzimidazole coloring agent skeleton, and a benzoxazole coloring agent skeleton. Among these, a squarylium coloring agent skeleton, a pyrrolopyrrole coloring agent skeleton, a diketo pyrrolopyrrole coloring agent skeleton, a phthalocyanine coloring agent skeleton, a quinacridone coloring agent skeleton, or benzimidazolone coloring agent skeleton is preferable, and a squarylium coloring agent skeleton or a pyrrolopyrrole coloring agent skeleton is more preferable.

Examples of the acid group include a sulfo group, a carboxyl group, a phosphoric acid group, a boronic acid group, a sulfonimide group, a sulfonamide group, and salts of these group. Examples of an atom or atomic group constituting the salts include alkali metal ions ($Li^+$, $Na^+$, $K^+$, and the like), alkaline earth metal ions ($Ca^{2+}$, $Mg^{2+}$, and the like), an ammonium ion, an imidazolium ion, a pyridinium ion, and a phosphonium ion.

Examples of the basic group included in the pigment derivative include an amino group, a pyridinyl group, or a salt thereof, a salt of an ammonium group, and a phthalimidomethyl group. Examples of an atom or atomic group constituting the salts include a hydroxide ion, a halogen ion, a carboxylate ion, a sulfonate ion, and a phenoxide ion.

Specific examples of the coloring agent derivative include compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraph Nos. 0086 to 0098 of WO2011/024896A, and paragraph Nos. 0063 to 0094 of WO2012/102399A, the contents of which are incorporated herein by reference.

A content of the coloring agent derivative is preferably 1 to 50 parts by mass with respect to 100 parts by mass of the above-described specific particles. The lower limit value is preferably 3 parts by mass or more and more preferably 5 parts by mass or more. The upper limit value is preferably 40 parts by mass or less and more preferably 30 parts by mass or less. As the coloring agent derivative, one kind may be used alone, or two or more kinds may be used in combination. In a case of using two or more kinds thereof, the total amount thereof is preferably within the above-described range.

<<Resin>>

The infrared-absorbing composition according to the embodiment of the present invention can contain a resin. The resin is blended in, for example, an application for dispersing particles such as a pigment in the infrared-absorbing composition or an application as a binder. The resin which is mainly used to disperse particles of the pigments and the like will also be called a dispersant. However, such applications of the resin are merely exemplary, and the resin can also be used for other purposes in addition to such applications.

A weight-average molecular weight (Mw) of the resin is preferably 2000 to 2000000. The upper limit is preferably 1000000 or less and more preferably 500000 or less. The lower limit is preferably 3000 or more and more preferably 5000 or more.

Examples of the resin include a (meth)acrylic resin, an epoxy resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide resin, a polyamideimide resin, a polyolefin resin, a cyclic olefin resin, a polyester resin, a styrene resin, a vinyl acetate resin, a polyvinyl alcohol resin, a polyvinyl acetal resin, a polyurethane resin, and a polyurea resin. These resins may be used singly or as a mixture of two or more kinds thereof. From the viewpoint of improving heat resistance, as the cyclic olefin resin, a norbornene resin is preferable. Examples of a commercially available product of the norbornene resin include ARTON series (for example, ARTON F4520) manufactured by JSR Corporation. In addition, as the resin, resins described in Examples of WO2016/088645A can be used. In addition, in a case where the resin has an ethylenically unsaturated bond-containing group, particularly a (meth)acryloyl group in the side chain, in the resin, it is also preferable that the main chain and the ethylenically unsaturated bond-containing group are bonded through a divalent linking group having an alicyclic structure.

The infrared-absorbing composition according to the embodiment of the present invention preferably includes a resin having an acid group. The resin having an acid group can be used as an alkali-soluble resin. With regard to the resin having an acid group (alkali-soluble resin), reference can be made to the description in paragraph Nos. 0558 to 0571 of JP2012-208494A (paragraph Nos. 0685 to 0700 of the corresponding US2012/0235099A) and the description in paragraph Nos. 0076 to 0099 of JP2012-198408A, the contents of which are incorporated herein by reference. In addition, as the resin having an acid group, a commercially available product may also be used. In addition, a method of introducing the acid group into the resin is not particularly limited, and examples thereof include the method described in JP6349629B. Further, examples of the method of introducing the acid group into the resin include a method of introducing an acid group by reacting an acid anhydride with a hydroxy group generated by a ring-opening reaction of an epoxy group.

Examples of the acid group included in the resin having an acid group include a carboxyl group, a phosphoric acid group, a sulfo group, and a phenolic hydroxy group, and a carboxyl group is preferable.

An acid value of the resin having an acid group is preferably 30 to 500 mgKOH/g. The lower limit is preferably 50 mgKOH/g or more and more preferably 70 mgKOH/g or more. The upper limit is preferably 400 mgKOH/g or less, more preferably 300 mgKOH/g or less, and still more preferably 200 mgKOH/g or less. A weight-average molecular weight (Mw) of the resin having an acid group is preferably 5000 to 100000. In addition, the number-average molecular weight (Mn) of the resin having an acid group is preferably 1000 to 20000.

The resin having an acid group preferably includes a repeating unit having an acid group in the side chain, and more preferably includes 5 to 70 mol % of repeating units having an acid group in the side chain with respect to the total repeating units of the resin. The upper limit of the content of the repeating unit having an acid group in the side chain is preferably 50 mol % or less and more preferably 30 mol % or less. The lower limit of the content of the repeating unit having an acid group in the side chain is preferably 10 mol % or more and more preferably 20 mol % or more.

As the resin, it is also preferable to use a resin including a repeating unit derived from a compound represented by Formula (ED1) and/or a compound represented by Formula (ED2) (hereinafter, these compounds will also be referred to as an "ether dimer").

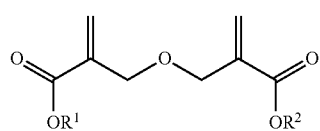
(ED1)

In Formula (ED1), $R^1$ and $R^2$ each independently represent a hydrogen atom or a hydrocarbon group having 1 to 25 carbon atoms, which may have a substituent.

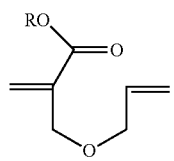
(ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph No. 0317 of JP2013-029760A, the contents of which are incorporated herein by reference.

As the resin, it is also preferable to use a resin including a repeating unit having a polymerizable group. Examples of the polymerizable group include a (meth)allyl group and a (meth)acryloyl group.

As the resin, it is also preferable to use a resin including a repeating unit derived from a compound represented by Formula (X).

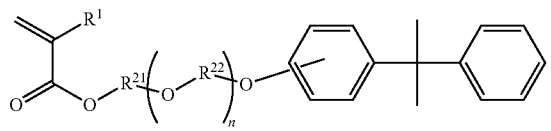
(X)

In the formula, $R^1$ represents a hydrogen atom or a methyl group, $R^{21}$ and $R^{22}$ each independently represent an alkylene group, and n represents an integer of 0 to 15. The number of carbon atoms in the alkylene group represented by $R^{21}$ and $R^{22}$ is preferably 1 to 10, more preferably 1 to 5, still more preferably 1 to 3, and particularly preferably 2 or 3. n represents an integer of 0 to 15, and is preferably an integer of 0 or 5, more preferably an integer of 0 to 4, and still more preferably an integer of 0 to 3.

Examples of the compound represented by Formula (X) include ethylene oxide- or propylene oxide-modified (meth)acrylate of para-cumylphenol. Examples of a commercially available product thereof include ARONIX M-110 (manufactured by TOAGOSEI CO., LTD.).

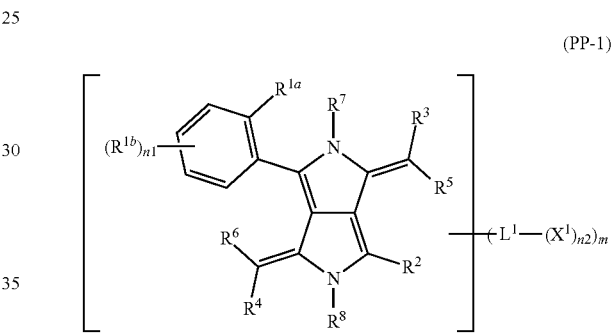
(PP-1)

The infrared-absorbing composition according to the embodiment of the present invention can also include a resin as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group is 70 mol % or more in a case where the total amount of the acid group and the basic group is 100 mol %. The acid group included in the acidic dispersant (acidic resin) is preferably a carboxyl group. An acid value of the acidic dispersant (acidic resin) is preferably 10 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total amount of the acid group and the basic group is 100 mol %. The basic group included in the basic dispersant is preferably an amino group.

It is also preferable that the resin used as a dispersant is a graft resin. With regard to details of the graft resin, reference can be made to the description in paragraph Nos. 0025 to 0094 of JP2012-255128A, the contents of which are incorporated herein by reference.

It is also preferable that the resin used as a dispersant is a polyimine-based dispersant including a nitrogen atom in at least one of the main chain or the side chain. As the polyimine-based dispersant, a resin having a main chain which has a partial structure having a functional group of pKa 14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. With regard to the polyimine-based dispersant, reference can be made to the description in paragraph Nos. 0102 to 0166 of JP2012-255128A, the contents of which are incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraph Nos. 0196 to 0209 of JP2013-043962A.

It is also preferable that the resin used as a dispersant are a resin including a repeating unit having an ethylenically unsaturated bond-containing group in the side chain. A content of the repeating unit having an ethylenically unsaturated bond-containing group in the side chain is preferably 10 mol % or more, more preferably 10 to 80 mol %, and still more preferably 20 to 70 mol % with respect to the total repeating units of the resin. In addition, as the dispersant, a resin described in JP2018-087939A can also be used.

A commercially available product is also available as the dispersant, and specific examples thereof include DISPERBYK series manufactured by BYK Chemie Japan, Solsperse series manufactured by Lubrizol Japan Ltd., Efka series manufactured by BASF SE, and AJISPER series manufactured by Ajinomoto Fine-Techno Co., Inc. In addition, products described in paragraph No. 0129 of JP2012-137564A and products described in paragraph No. 0235 of JP2017-194662A can also be used as the dispersant.

In addition, as the resin used as a dispersant, block copolymers (EB-1) to (EB-9) described in paragraph Nos. 0219 to 0221 of JP6432077B can also be used.

A content of the resin in the total solid content of the infrared-absorbing composition is preferably 1% to 50% by mass. The lower limit is preferably 5% by mass or more and more preferably 7% by mass or more. The upper limit is preferably 40% by mass or less and more preferably 30% by mass or less.

In addition, in a case where the infrared-absorbing composition according to the embodiment of the present invention contains a resin as a dispersant, a content of the resin as a dispersant in the total solid content of the infrared-absorbing composition is preferably 0.1% to 40% by mass. The upper limit is more preferably 20% by mass or less and still more preferably 10% by mass or less. The lower limit is preferably 0.5% by mass or more and more preferably 1% by mass or more. In addition, the content of the resin as a dispersant is preferably 1 to 100 parts by mass with respect to 100 parts by mass of the above-described specific particles. The upper limit is preferably 80 parts by mass or less and more preferably 60 parts by mass or less. The lower limit is preferably 2.5 parts by mass or more and more preferably 5 parts by mass or more.

The infrared-absorbing composition according to the embodiment of the present invention may include only one kind of resin, or may include two or more kinds thereof. In a case of including two or more kinds thereof, the total amount thereof is preferably within the above-described range.

<<Curable Compound>>

The infrared-absorbing composition according to the embodiment of the present invention can contain a curable compound. As the curable compound, a known compound which is cross-linkable by a radical, an acid, or heat can be used. Examples of the curable compound include a compound having an ethylenically unsaturated bond-containing group and a compound having a cyclic ether group, and a compound having an ethylenically unsaturated bond-containing group is preferable. Examples of the ethylenically unsaturated bond-containing group include a vinyl group, a (meth)allyl group, and a (meth)acryloyl group. Examples of the cyclic ether group include an epoxy group and an oxetanyl group. The curable compound used in the present invention is preferably a polymerizable compound, and more preferably a radically polymerizable compound.

(Polymerizable Compound)

Any chemical forms of a monomer, a prepolymer, an oligomer, or the like may be used as the polymerizable compound, but a monomer is preferable. The molecular weight of the polymerizable compound is preferably 100 to 3000. The upper limit is more preferably 2000 or less and still more preferably 1500 or less. The lower limit is more preferably 150 or more and still more preferably 250 or more.

The polymerizable compound is preferably a polyfunctional polymerizable monomer. In addition, the polyfunctional polymerizable monomer is preferably a compound including 3 or more ethylenically unsaturated bond-containing groups, more preferably a compound including 3 to 15 ethylenically unsaturated bond-containing groups, and still more preferably a compound including 3 to 6 ethylenically unsaturated bond-containing groups. In addition, the polyfunctional polymerizable monomer is preferably a trifunctional to pentadecafunctional (meth)acrylate compound and more preferably a trifunctional to hexafunctional (meth)acrylate compound. Specific examples of the polymerizable compound include compounds described in paragraph Nos. 0095 to 0108 of JP2009-288705A, paragraph No. 0227 of JP2013-029760A, paragraph Nos. 0254 to 0257 of JP2008-292970A, paragraph Nos. 0034 to 0038 of JP2013-253224A, paragraph No. 0477 of JP2012-208494A, JP2017-048367A, JP6057891B, JP6031807B, and JP2017-194662A, the contents of which are incorporated herein by reference.

As the polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which these (meth)acryloyl groups are bonded through an ethylene glycol and/or a propylene glycol residue (for example, SR454 and SR499 which are commercially available products from Sartomer Company Inc.) is preferable. In addition, as the polymerizable compound, diglycerin ethylene oxide (EO)-modified (meth)acrylate (as a commercially available product, M-460 manufactured by TOAGOSEI CO., LTD.), pentaerythritol tetraacrylate (NK ESTER A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by TOAGOSEI CO., LTD.), NK OLIGO UA-7200 (manufactured by Shin-Nakamura Chemical Co., Ltd.), 8UH-1006 and 8UH-1012 (manufactured by Taisei Fine Chemical Co., Ltd.), Light Acrylate POB-A0 (manufactured by KYOEISHA CHEMICAL Co., Ltd.), and the like can also be used.

In addition, as the polymerizable compound, it is also preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, or pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

As the polymerizable compound, a compound having an acid group can also be used. By using a polymerizable compound having an acid group, the polymerizable compound in a non-exposed portion is easily removed during development and the generation of a development residue can be suppressed. Examples of the acid group include a carboxyl group, a sulfo group, and a phosphoric acid group, and a carboxyl group is preferable. Examples of a commercially available product of the polymerizable compound having an acid group include ARONIX M-305, M-510, M-520, and ARONIX TO-2349 (manufactured by TOAGOSEI CO., LTD.). The acid value of the polymerizable compound having an acid group is preferably 0.1 to 40 mgKOH/g and more preferably 5 to 30 mgKOH/g. In a case where the acid value of the polymerizable compound is 0.1 mgKOH/g or more, solubility in a developer is good, and in a case where the acid value of the polymerizable compound is 40 mgKOH/g or less, it is advantageous in production and handling.

The polymerizable compound is preferably a compound having a caprolactone structure. Examples of the polymerizable compound having a caprolactone structure include DPCA-20, DPCA-30, DPCA-60, and DPCA-120, each of which is commercially available as KAYARAD DPCA series from Nippon Kayaku Co., Ltd.

As the polymerizable compound, a polymerizable compound having an alkyleneoxy group can also be used. The polymerizable compound having an alkyleneoxy group is preferably a polymerizable compound having an ethyleneoxy group and/or a propyleneoxy group, more preferably a polymerizable compound having an ethyleneoxy group, and still more preferably a 3-functional to 6-functional (meth) acrylate compound having 4 to 20 ethyleneoxy groups. Examples of a commercially available product of the polymerizable compound having an alkyleneoxy group include SR-494 manufactured by Sartomer Company Inc., which is a tetrafunctional (meth)acrylate having 4 ethyleneoxy groups, and KAYARAD TPA-330 manufactured by Nippon Kayaku Co., Ltd., which is a trifunctional (meth)acrylate having 3 isobutyleneoxy groups.

As the polymerizable compound, a polymerizable compound having a fluorene skeleton can also be used. Examples of a commercially available product of the polymerizable compound having a fluorene skeleton include OGSOL EA-0200, EA-0300 (manufactured by Osaka Gas Chemicals Co., Ltd., (meth)acrylate monomer having a fluorene skeleton).

As the polymerizable compound, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the polymerizable compound. In addition, the polymerizable compounds having an amino structure or a sulfide structure in the molecule, described in JP1988-277653A (JP-S63-277653A), JP1988-260909A (JP-S63-260909A), or JP1989-105238A (JP-H01-105238A), are also preferably used. In addition, as the polymerizable compound, commercially available products such as UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, AI-600, and LINC-202UA (manufactured by KYOEISHA CHEMICAL Co., Ltd.) can also be used.

(Compound having Cyclic Ether Group)

It is preferable that the compound having a cyclic ether group, which is used as the curable compound, is a compound having an epoxy group. Examples of the compound having an epoxy group include a compound having one or more epoxy groups in one molecule, and a compound two or more epoxy groups in one molecule is preferable. It is preferable to have 1 to 100 epoxy groups in one molecule. The upper limit of the number of epoxy groups may be, for example, 10 or less or 5 or less. The lower limit of the epoxy group is preferably 2 or more. As the compound having an epoxy group, the compounds described in paragraph Nos. 0034 to 0036 of JP2013-011869A, the compounds described in paragraph Nos. 0147 to 0156 of JP2014-043556A, the compounds paragraph Nos. 0085 to 0092 of JP2014-089408A, and the compounds described in JP2017-179172A can also be used.

The compound having an epoxy group may be a low-molecular-weight compound (for example, having a molecular weight of less than 2000, and further, a molecular weight of less than 1000) or a high-molecular-weight compound (macromolecule) (for example, having a molecular weight of 1000 or more, and in a case of a polymer, having a weight-average molecular weight of 1000 or more). A weight-average molecular weight of the compound having an epoxy group is preferably 200 to 100000 and more preferably 500 to 50000. The upper limit of the weight-average molecular weight is preferably 10000 or less, more preferably 5000 or less, and still more preferably 3000 or less.

As the compound having an epoxy group, an epoxy resin can be preferably used. Examples of the epoxy resin include an epoxy resin which is a glycidyl etherified product of a phenol compound, an epoxy resin which is a glycidyl etherified product of various novolac resins, an alicyclic epoxy resin, an aliphatic epoxy resin, a heterocyclic epoxy resin, a glycidyl ester-based epoxy resin, a glycidyl amine-based epoxy resin, an epoxy resin obtained by glycidylating halogenated phenols, a condensate of a silicon compound having an epoxy group and another silicon compound, and a copolymer of a polymerizable unsaturated compound having an epoxy group and another polymerizable unsaturated compound. The epoxy equivalent of the epoxy resin is preferably 310 to 3300 g/eq, more preferably 310 to 1700 g/eq, and still more preferably 310 to 1000 g/eq. Examples of a commercially available product of the compound having a cyclic ether group include EHPE 3150 (manufactured by Daicel Corporation), EPICLON N-695 (manufactured by DIC Corporation), and MARPROOF G-0150M, G-0105SA, G-0130SP, G-0250SP, G-10055, G-1005SA, G-1010S, G-2050M, G-01100, and G-01758 (all of which are manufactured by NOF Corporation., an epoxy group-containing polymer).

A content of the curable compound in the total solid content of the infrared-absorbing composition is preferably 0.1% to 50% by mass. The lower limit is more preferably 0.5% by mass or more and still more preferably 1% by mass or more. The upper limit is more preferably 45% by mass or less and still more preferably 40% by mass or less. The curable compound may be used singly or in a combination of two or more kinds thereof. In a case where two or more kinds thereof are used in combination, the total thereof is preferably within the above-described range.

In a case where the infrared-absorbing composition according to the embodiment of the present invention contains a polymerizable compound as the curable compound, a content of the polymerizable compound in the total solid content of the infrared-absorbing composition is preferably 0.1% to 50% by mass. The lower limit is more preferably 0.5% by mass or more and still more preferably 1% by mass or more. The upper limit is more preferably 45% by mass or less and still more preferably 40% by mass or less. The polymerizable compound may be used singly or in a combination of two or more kinds thereof. In a case where two or more kinds thereof are used in combination, the total thereof is preferably within the above-described range.

In a case where the infrared-absorbing composition according to the embodiment of the present invention contains a compound having a cyclic ether group as the curable compound, a content of the compound having a cyclic ether group in the total solid content of the infrared-absorbing composition is preferably 0.1% to 20% by mass. The lower limit is preferably 0.5% by mass or more and more preferably 1% by mass or more. The upper limit is more preferably 15% by mass or less and still more preferably 10% by mass or less. The compound having a cyclic ether group may be used singly or in combination of two or more kinds thereof. In a case where two or more kinds thereof are used in combination, the total thereof is preferably within the above-described range.

In a case where the infrared-absorbing composition according to the embodiment of the present invention includes, as the curable compound, a polymerizable compound and a compound having a cyclic ether group, the content of the compound having a cyclic ether group is preferably 1 to 400 parts by mass and more preferably 1 to 100 parts by mass with respect to 100 parts by mass of the polymerizable compound.

<<Photopolymerization Initiator>>

In a case where the infrared-absorbing composition according to the embodiment of the present invention includes the polymerizable compound, it is preferable that the infrared-absorbing composition according to the embodiment of the present invention further contains a photopolymerization initiator. The photopolymerization initiator is not particularly limited, and can be appropriately selected from known photopolymerization initiators. For example, a compound having photosensitivity to light in a range from an ultraviolet range to a visible range is preferable. The photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an a-hydroxyketone compound, and an a-aminoketone compound. From the viewpoint of exposure sensitivity, as the photopolymerization initiator, a trihalomethyltriazine compound, a benzyldimethylketal compound, an a-hydroxyketone compound, an a-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an a-hydroxyketone compound, an a-aminoketone compound, and an acylphosphine compound is more preferable, and an oxime compound is still more preferable. In addition, as the photopolymerization initiator, compounds described in paragraphs 0065 to 0111 of JP2014-130173A, compounds described in JP6301489B, peroxide-based photopolymerization initiators described in MATERIAL STAGE, p. 37 to 60, vol. 19, No. 3, 2019, photopolymerization initiators described in WO2018/221177A, photopolymerization initiators described in WO2018/110179A, photopolymerization initiators described in JP2019-043864A, photopolymerization initiators described in JP2019-044030A, and peroxide initiators described in JP2019-167313A, the contents of which are incorporated herein by reference.

Examples of a commercially available product of the a-hydroxyketone compound include Omnirad 184, Omnirad 1173, Omnirad 2959, and Omnirad 127 (all of which are manufactured by IGM Resins B.V.), Irgacure 184, Irgacure 1173, Irgacure 2959, and Irgacure 127 (all of which are manufactured by BASF SE). Examples of a commercially available product of the a-aminoketone compound include Omnirad 907, Omnirad 369, Omnirad 369E, and Omnirad 379EG (all of which are manufactured by IGM Resins B.V.), Irgacure 907, Irgacure 369, Irgacure 369E, and Irgacure 379EG (all of which are manufactured by BASF SE). Examples of a commercially available product of the acylphosphine compound include Omnirad 819 and Omnirad TPO (both of which are manufactured by IGM Resins B.V.), Irgacure 819 and Irgacure TPO (both of which are manufactured by BASF SE).

Examples of the oxime compound include the compounds described in JP2001-233842A, the compounds described in JP2000-080068A, the compounds described in JP2006-342166A, the compounds described in J. C. S. Perkin II (1979, pp. 1653 to 1660), the compounds described in J. C. S. Perkin II (1979, pp. 156 to 162), the compounds described in Journal of Photopolymer Science and Technology (1995, pp. 202 to 232), the compounds described in JP2000-066385A, the compounds described in JP2004-534797A, the compounds described in JP2017-019766A, the compounds described in JP6065596B, the compounds described in WO2015/152153A, the compounds described in WO2017/051680A, the compounds described in JP2017-198865A, the compounds described in paragraph Nos. 0025 to 0038 of WO2017/164127A, and compounds described in WO2013/167515A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenyl-propane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product thereof include Irgacure OXE01, Irgacure OXE02, Irgacure OXE03, and Irgacure OXE04 (all of which are manufactured by BASF SE), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no colorability or a compound having high transparency and being resistant to discoloration. Examples of a commercially available product thereof include ADEKA ARKLS NCI-730, NCI-831, and NCI-930 (all of which are manufactured by ADEKA Corporation).

An oxime compound having a fluorene ring can also be used as the photopolymerization initiator. Specific examples of the oxime compound having a fluorene ring include compounds described in JP2014-137466A, and compounds described in JP06636081B.

As the photopolymerization initiator, an oxime compound having a skeleton in which at least one benzene ring of a carbazole ring is a naphthalene ring can also be used. Specific examples of such an oxime compound include the compounds described in WO2013/083505A.

An oxime compound having a fluorine atom can also be used as the photopolymerization initiator. Specific examples of the oxime compound having a fluorine atom include compounds described in JP2010-262028A, Compounds 24 and 36 to 40 described in JP2014-500852A, and Compound (C-3) described in JP2013-164471A.

An oxime compound having a nitro group can be used as the photopolymerization initiator. The oxime compound having a nitro group is also preferably used in the form of a dimer. Specific examples of the oxime compound having a nitro group include a compound described in paragraph Nos. 0031 to 0047 of JP2013-114249A and paragraph Nos. 0008 to 0012 and 0070 to 0079 of JP2014-137466A, a compound described in paragraph Nos. 0007 to 0025 of JP4223071B, and ADEKA ARKLS NCI-831 (manufactured by ADEKA Corporation).

An oxime compound having a benzofuran skeleton can also be used as the photopolymerization initiator. Specific examples thereof include OE-01 to OE-75 described in WO2015/036910A.

In the present invention, as the photopolymerization initiator, an oxime compound in which a substituent having a hydroxy group is bonded to a carbazole skeleton can also be used. Examples of such a photopolymerization initiator include compounds described in WO2019/088055A.

Specific examples of the oxime compound which are preferably used in the present invention are shown below, but the present invention is not limited thereto.

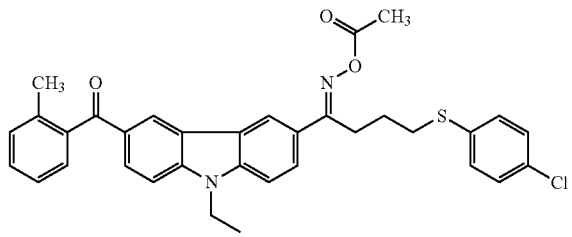

(C-1)

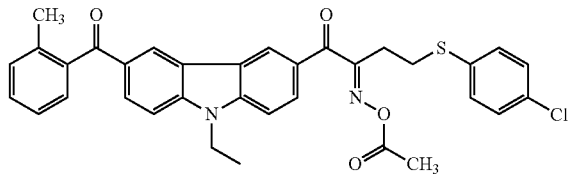

(C-2)

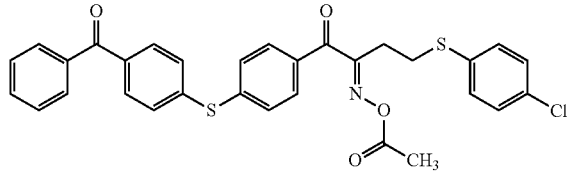

(C-3)

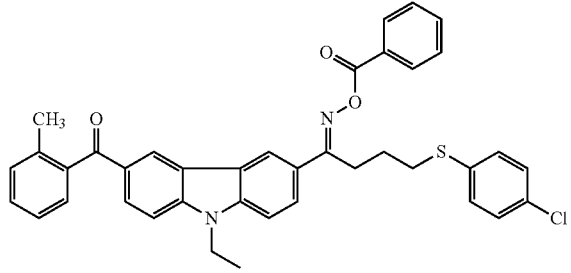

(C-4)

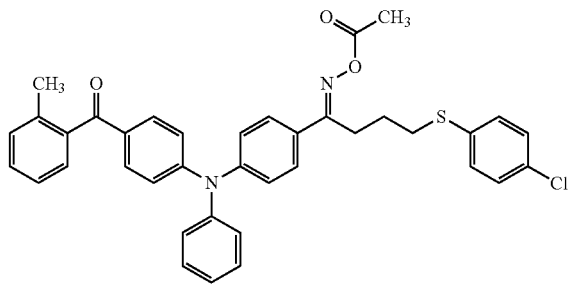

(C-5)

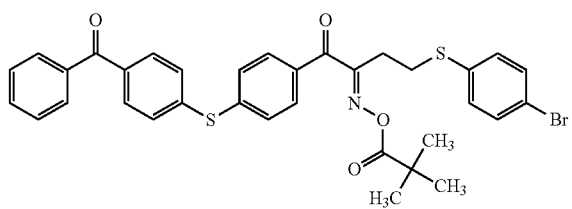

(C-6)

(C-7)
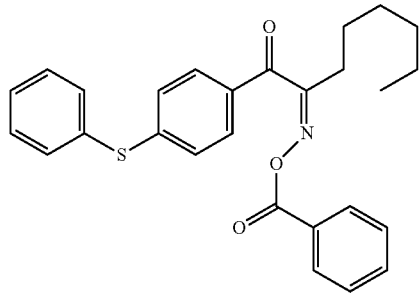
(C-8)
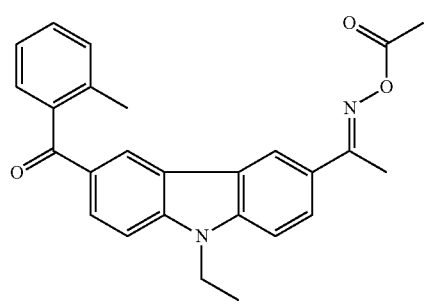
(C-9)
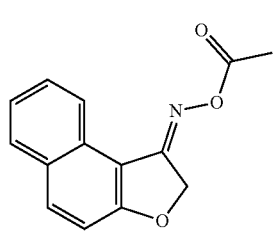
(C-10)
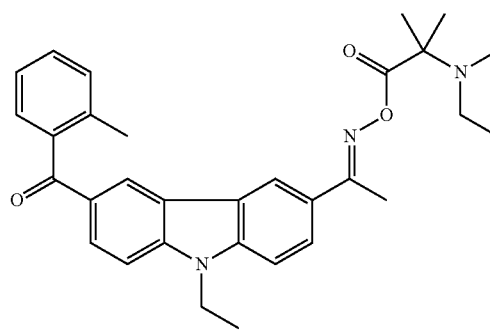
(C-11)
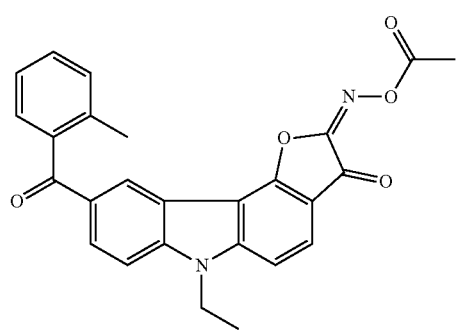
(C-12)
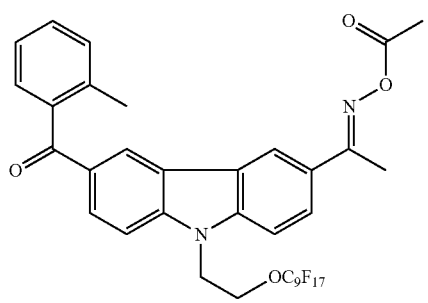
(C-13)
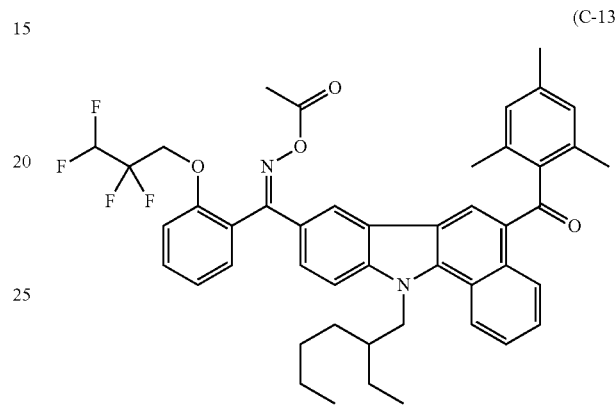
(C-14)
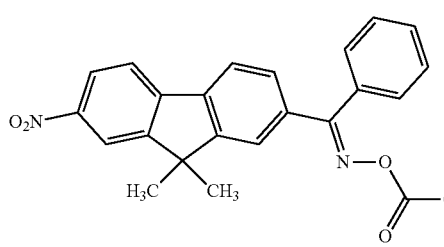
(C-15)
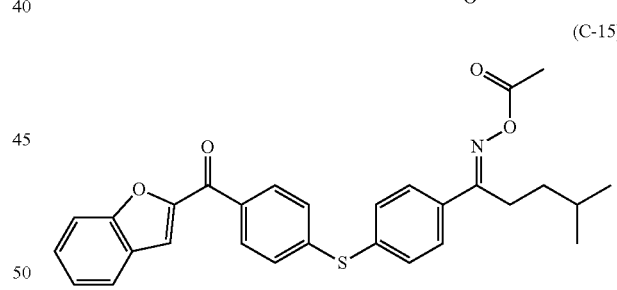
(C-16)
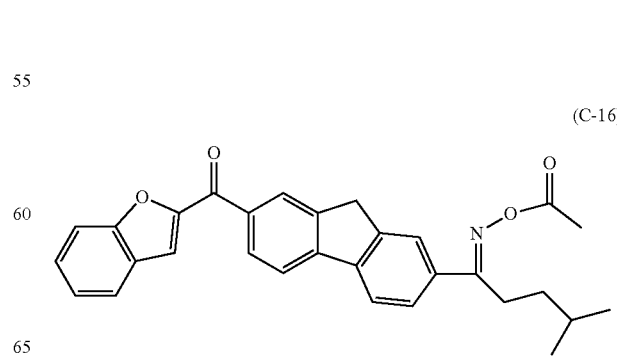

-continued (C-17)

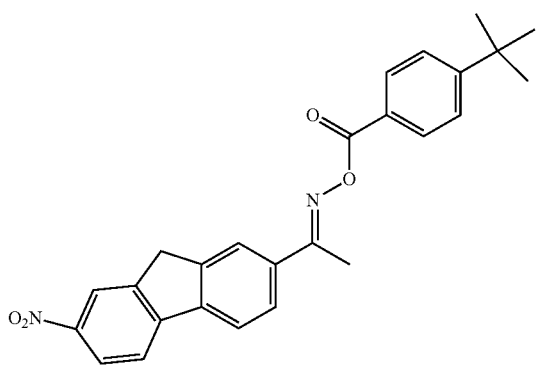

The oxime compound is preferably a compound having a maximal absorption wavelength in a wavelength range of 350 to 500 nm and more preferably a compound having a maximal absorption wavelength in a wavelength range of 360 to 480 nm. In addition, from the viewpoint of sensitivity, a molar absorption coefficient of the oxime compound at a wavelength of 365 nm or 405 nm is preferably high, more preferably 1000 to 300000, still more preferably 2000 to 300000, and particularly preferably 5000 to 200000. The molar absorption coefficient of a compound can be measured using a known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

As the photopolymerization initiator, a bifunctional or tri- or higher functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the composition can be improved. Specific examples of the bifunctional or tri- or higher functional photoradical polymerization initiator include dimers of the oxime compounds described in JP2010-527339A, JP2011-524436A, WO2015/004565A, paragraph Nos. 0407 to 0412 of JP2016-532675A, and paragraph Nos. 0039 to 0055 of WO2017/033680A; the compound (E) and compound (G) described in JP2013-522445A; Cmpd 1 to 7 described in WO2016/034963A; the oxime ester photoinitiators described in paragraph No. 0007 of JP2017-523465A; the photoinitiators described in paragraph Nos. 0020 to 0033 of JP2017-167399A; the photopolymerization initiator (A) described in paragraph Nos. 0017 to 0026 of JP2017-151342A; and the oxime ester photoinitiators described in JP6469669B.

A content of the photopolymerization initiator in the total solid content of the infrared-absorbing composition is preferably 0.1% to 40% by mass, more preferably 0.5% to 30% by mass, and still more preferably 1% to 20% by mass. The infrared-absorbing composition may include only one kind of photopolymerization initiator, or may include two or more kinds thereof. In a case of including two or more kinds thereof, the total amount thereof is preferably within the above-described range.

<<Chromatic Colorant>>

The infrared-absorbing composition according to the embodiment of the present invention can contain a chromatic colorant. In the present invention, "chromatic colorant" denotes a colorant other than a white colorant and a black colorant. It is preferable that the chromatic colorant is a colorant having an absorption wavelength in a range of 400 nm or more and less than 650 nm.

Examples of the chromatic colorant include red colorants, green colorants, blue colorants, yellow colorants, violet colorants, and orange colorants. The chromatic colorant may be a pigment or a dye. The coloring material may be used in combination of the pigment and the dye. In addition, the pigment may be either an inorganic pigment or an organic pigment. In addition, as the pigment, a material in which a part of an inorganic pigment or an organic-inorganic pigment is substituted with an organic chromophore can also be used. By substituting an inorganic pigment or an organic-inorganic pigment with an organic chromophore, hue design can be easily performed.

An average primary particle diameter of the pigment is preferably 1 to 200 nm. The lower limit is preferably 5 nm or more and more preferably 10 nm or more. The upper limit is preferably 180 nm or less, more preferably 150 nm or less, and still more preferably 100 nm or less. In a case where the average primary particle diameter of the pigment is within the above-described range, dispersion stability of the pigment in the infrared-absorbing composition is good. In the present invention, the primary particle diameter of the pigment can be determined from a captured image obtained by observing primary particles of the pigment using a transmission electron microscope. Specifically, a projected area of the primary particles of the pigment is determined, and the corresponding equivalent circle diameter is calculated as the primary particle diameter of the pigment. In addition, the average primary particle diameter in the present invention is an arithmetic average of the primary particle diameters with respect to 400 primary particles of the pigment. In addition, the primary particle of the pigment refers to a particle which is independent without aggregation.

It is preferable that the chromatic colorant includes a pigment. A content of the pigment in the chromatic colorant is preferably 50% by mass or more, more preferably 70% by mass or more, still more preferably 80% by mass or more, and particularly preferably 90% by mass or more. Examples of the pigment include the following pigments:

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 215, 228, 231, 232 (methine-based), 233 (quinoline-based), 234 (aminoketone-based), 235 (aminoketone-based), 236 (aminoketone-based), and the like (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 269, 270, 272, 279, 291, 294 (xanthene-based, Organo Ultramarine, Bluish Red), 295 (monoazo-based), 296 (diazo-based), 297 (aminoketone-based), and the like (all of which are red pigments);

C. I. Pigment Green 7, 10, 36, 37, 58, 59, 62, 63, 64 (phthalocyanine-based), 65 (phthalocyanine-based), 66 (phthalocyanine-based), and the like (all of which are green pigments);

C. I. Pigment Violet 1, 19, 23, 27, 32, 37, 42, 60 (triarylmethane-based), 61 (xanthene-based), and the like (all of which are violet pigments); and C. I. Pigment Blue 1, 2, 15, 15:1, 15:2, 15:3, 15:4, 15:6, 16, 22, 29, 60, 64, 66, 79, 80, 87 (monoazo-based), 88 (methine-based), and the like (all of which are blue pigments).

In addition, as the green pigment, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used. Specific examples thereof include the compounds described in WO2015/118720A. In addition, as the green pigment, a compound described in CN2010-6909027A, a phthalocyanine compound described in WO2012/102395A, which has phosphoric acid ester as a ligand, a phthalocyanine compound described in JP2019-008014A, a phthalocyanine compound described in JP2018-180023A, a compound described in JP2019-038958A, and the like can also be used.

In addition, as the blue pigment, an aluminum phthalocyanine compound having a phosphorus atom can also be used. Specific examples thereof include the compounds described in paragraph Nos. 0022 to 0030 of JP2012-247591A and paragraph No. 0047 of JP2011-157478A.

In addition, as the yellow pigment, compounds described in JP2017-201003A, compounds described in JP2017-197719A, compounds described in paragraph Nos. 0011 to 0062 and 0137 to 0276 of JP2017-171912A, compounds described in paragraph Nos. 0010 to 0062 and 0138 to 0295 of JP2017-171913A, compounds described in paragraph Nos. 0011 to 0062 and 0139 to 0190 of JP2017-171914A, compounds described in paragraph Nos. 0010 to 0065 and 0142 to 0222 of JP2017-171915A, quinophthalone compounds described in paragraph Nos. 0011 to 0034 of JP2013-054339A, quinophthalone compounds described in paragraph Nos. 0013 to 0058 of JP2014-026228A, isoindoline compounds described JP2018-062644A, quinophthalone compounds described in JP2018-203798A, quinophthalone compounds described in JP2018-062578A, quinophthalone compounds described in JP6432076B, quinophthalone compounds described in JP2018-155881A, quinophthalone compounds described in JP2018-111757A, quinophthalone compounds described in JP2018-040835A, quinophthalone compounds described in JP2017-197640A, quinophthalone compounds described in JP2016-145282A, quinophthalone compounds described in JP2014-085565A, quinophthalone compounds described in JP2014-021139A, quinophthalone compounds described in JP2013-209614A, quinophthalone compounds described in JP2013-209435A, quinophthalone compounds described in JP2013-181015A, quinophthalone compounds described in JP2013-061622A, quinophthalone compounds described in JP2013-032486A, quinophthalone compounds described in JP2012-226110A, quinophthalone compounds described in JP2008-074987A, quinophthalone compounds described in JP2008-081565A, quinophthalone compounds described in JP2008-074986A, quinophthalone compounds described in JP2008-074985A, quinophthalone compounds described in JP2008-050420A, quinophthalone compounds described in JP2008-031281A, quinophthalone compounds described in JP1973-032765A (JP-S48-032765A), quinophthalone compounds described in JP2019-008014A, quinophthalone compounds described in JP6607427B, compounds described in KR10-2014-0034963A, compounds described in JP2017-095706A, compounds described in TW2019-20495A, compounds described in JP6607427B, compounds described in JP2020-033525A, compounds described in JP2020-033524A, compounds described in JP2020-033523A, compounds described in JP2020-033522A, compounds described in JP2020-033521A, compounds described in WO2020/045200A, compounds described in WO2020/045199A, and compounds described in WO2020/045197A can also be used. In addition, from the viewpoint of improving a color value, a multimerized compound of these compounds is also preferably used.

As the red pigment, diketopyrrolopyrrole compounds described in JP2017-201384A, in which the structure has at least one substituted bromine atom, diketopyrrolopyrrole compounds described in paragraph Nos. 0016 to 0022 of JP6248838B, diketopyrrolopyrrole compounds described in WO2012/102399A, diketopyrrolopyrrole compounds described in WO2012/117965A, naphtholazo compounds described in JP2012-229344, and the like can also be used. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used.

In the present invention, a dye can also be used as the chromatic colorant. As the dye, a known dye can be used without any particular limitation. Examples thereof include a pyrazoleazo-based dye, an anilinoazo-based dye, a triarylmethane-based dye, an anthraquinone-based dye, an anthrapyridone-based dye, a benzylidene-based dye, an oxonol-based dye, a pyrazolotriazoleazo-based dye, a pyridoneazo-based dye, a cyanine-based dye, a phenothiazine-based dye, a pyrrolopyrazoleazomethine-based dye, a xanthene-based dye, a phthalocyanine-based dye, a benzopyran-based dye, an indigo-based dye, and a pyrromethane-based dye. In addition, as the dye, thiazole compounds described in JP2012-158649A, azo compounds described in JP2011-184493A, or azo compounds described in JP2011-145540A can also be preferably used.

In a case where the infrared-absorbing composition according to the embodiment of the present invention contains a chromatic colorant, a content of the chromatic colorant in the total solid content of the infrared-absorbing composition according to the embodiment of the present invention is preferably 1% to 50% by mass. In a case where the infrared-absorbing composition-according to the embodiment of the present invention includes two or more kinds of chromatic colorants, it is preferable that the total content thereof is within the above-described range.

<<Coloring Material which Allows Transmission of Infrared Rays and Shields Visible Light>>

The infrared-absorbing composition according to the embodiment of the present invention can also contain a coloring material which allows transmission of infrared rays and shields visible light (hereinafter, also referred to as a "coloring material which shields visible light"). An infrared-absorbing composition including the coloring material which shields visible light is preferably used as an infrared-absorbing composition for forming an infrared transmitting filter.

It is preferable that the coloring material which shields visible light is a coloring material which absorbs light in a wavelength range of violet to red. In addition, it is preferable that the coloring material which shields visible light is a coloring material which shields light in a wavelength range of 450 to 650 nm. In addition, it is preferable that the coloring material which shields visible light is a coloring material which allows transmission of light in a wavelength range of 900 to 1500 nm. It is preferable that the coloring material which shields visible light satisfies at least one of the following requirement (A) or (B).

(A): coloring material which shields visible light includes two or more kinds of chromatic colorants, and a combination of the two or more chromatic colorants forms black.

(B): coloring material which shields visible light includes an organic black colorant.

Examples of the chromatic colorant include the above-described chromatic colorants. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include the compounds described in JP2010-534726A, JP2012-515233A, JP2012-515234A, and the like, and the bisbenzofuranone compound is available, for example, as "Irgaphor Black" manufactured by BASF SE. Examples of the perylene compound include compounds described in paragraph Nos. 0016 to 0020 of JP2017-226821A, and C. I. Pigment Black 31 and 32. Examples of the azomethine compound include compounds described in JP1989-170601A (JP-H01-170601A) and JP1990-034664A (JP-H02-034664A). For example, "CHROMOFINE BLACK A1103" (manufactured by Dainichiseika Color & Chemicals Mfg. Co., Ltd.) is available.

In a case where a combination of the two or more chromatic colorants forms black, examples of the combination of the chromatic colorants include the following aspects (1) to (8).

(1) aspect in which the coloring material which shields visible light contains a yellow colorant, a blue colorant, a violet colorant, and a red colorant (2) aspect in which the coloring material which shields visible light contains a yellow colorant, a blue colorant, and a red colorant (3) aspect in which the coloring material which shields visible light contains a yellow colorant, a violet colorant, and a red colorant (4) aspect in which the coloring material which shields visible light contains a yellow colorant and a violet colorant (5) aspect in which the coloring material which shields visible light contains a green colorant, a blue colorant, a violet colorant, and a red colorant (6) aspect in which the coloring material which shields visible light contains a violet colorant and an orange colorant (7) aspect in which the coloring material which shields visible light contains a green colorant, a violet colorant, and a red colorant (8) aspect in which the coloring material which shields visible light contains a green colorant and a red colorant In a case where the infrared-absorbing composition according to the embodiment of the present invention contains a coloring material which shields visible light, a content of the coloring material which shields visible light in the total solid content of the infrared-absorbing composition is preferably 1% to 50% by mass. The lower limit is preferably 5% by mass or more, more preferably 10% by mass or more, still more preferably 20% by mass or more, and particularly preferably 30% by mass or more.

<<Surfactant>>

The infrared-absorbing composition according to the embodiment of the present invention preferably contains a surfactant. As the surfactant, various surfactants such as a fluorine-based surfactant, a nonionic surfactant, a cationic surfactant, an anionic surfactant, and a silicone-based surfactant can be used. The surfactant is preferably a fluorine-based surfactant or a silicone-based surfactant. Examples of the surfactant include surfactants described in paragraph Nos. 0238 to 0245 of WO2015/166779A, the contents of which are incorporated herein by reference. The surfactant can also be used as a dispersant for the specific particles.

Examples of the fluorine-based surfactant include surfactants described in paragraph Nos. 0060 to 0064 of JP2014-041318A (paragraph Nos. 0060 to 0064 of the corresponding WO2014/017669A) and the like, and surfactants described in paragraph Nos. 0117 to 0132 of JP2011-132503A, the contents of which are incorporated herein by reference. Examples of a commercially available product of the fluorine-based surfactant include: MEGAFACE F-171, F-172, F-173, F-176, F-177, F-141, F-142, F-143, F-144, F-437, F-475, F-477, F-479, F-482, F-554, F-555-A, F-556, F-557, F-558, F-559, F-560, F-561, F-565, F-563, F-568, F-575, F-780, EXP, MFS-330, R-41, R-41-LM, R-01, R-40, R-40-LM, RS-43, TF-1956, RS-90, R-94, RS-72-K, and DS-21 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); POLYFOX PF636, PF656, PF6320, PF6520, and PF7002 (all of which are manufactured by OMNOVA Solutions Inc.); and FTERGENT 710FM, 610FM, 601AD, 601ADH2, 602A, 215M, and 245F (all of which are manufactured by NEOS COMPANY LIMITED).

In addition, as the fluorine-based surfactant, an acrylic compound, which has a molecular structure having a functional group containing a fluorine atom and in which, by applying heat to the molecular structure, the functional group containing a fluorine atom is broken to volatilize a fluorine atom, can also be suitably used. Examples of such a fluorine-based surfactant include MEGAFACE DS series manufactured by DIC Corporation (The Chemical Daily, Feb. 22, 2016; Nikkei Business Daily, Feb. 23, 2016) such as MEGAFACE DS-21.

In addition, it is also preferable that a polymer of a fluorine atom-containing vinyl ether compound having a fluorinated alkyl group or a fluorinated alkylene ether group, and, a hydrophilic vinyl ether compound is used as the fluorine-based surfactant. Examples of such a fluorine-based surfactant include fluorine-based surfactants described in JP2016-216602A, the contents of which are incorporated herein by reference.

A block polymer can also be used as the fluorine-based surfactant. As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used. In addition, fluorine-containing surfactants described in paragraph Nos. 0016 to 0037 of JP2010-032698A, or the following compounds are also exemplified as the fluorine-based surfactant used in the present invention.

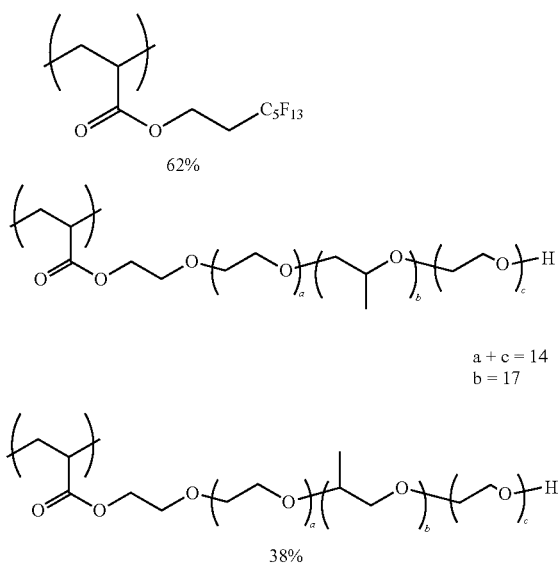

A weight-average molecular weight of the compound is preferably 3000 to 50000 and, for example, 14000. In the compound, "%" representing the proportion of a repeating unit is mol %.

In addition, as the fluorine-based surfactant, a fluorine-containing polymer having an ethylenically unsaturated bond-containing group in the side chain can be used. Specific examples thereof include compounds described in paragraph Nos. 0050 to 0090 and paragraph Nos. 0289 to 0295 of JP2010-164965A, and MEGAFACE RS-101, RS-102, RS-718K, and RS-72-K manufactured by DIC Corporation. In addition, as the fluorine-based surfactant, compounds described in paragraph Nos. 0015 to 0158 of JP2015-117327A can also be used.

Examples of the nonionic surfactant include glycerol, trimethylolpropane, trimethylolethane, an ethoxylate and propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE), SOLSPERSE 20000 (manufactured by Lubrizol Japan Ltd.), NCW-101, NCW-1001, and NCW-1002 (all of which are manufactured by Wako Pure Chemical Corporation), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

Examples of the cationic surfactant include a tetraalkylammonium salt, an alkylamine salt, a benzalkonium salt, an alkylpyridium salt, and an imidazolium salt. Specific examples thereof include dihydroxyethylstearylamine, 2-heptadecenyl-hydroxyethylimidazoline, lauryldimethylbenzylammonium chloride, cetylpyridinium chloride, and stealamidemethylpyridium chloride.

Examples of the anionic surfactant include dodecylbenzene sulfonic acid, sodium dodecylbenzene sulfonate, sodium lauryl sulfate, sodium alkyldiphenyl ether disulfonate, sodium alkylnaphthalene sulfonate, sodium dialkyl sulfosuccinate, sodium stearate, potassium oleate, sodium dioctyl sulfosuccinate, sodium polyoxyethylene alkyl ether sulfate, sodium polyoxyethylene alkylphenyl ether sulfate, sodium dialkyl sulfosuccinate, sodium stearate, sodium oleate, and sodium t-octylphenoxyethoxypolyethoxyethyl sulfate.

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), TSF-4440, TSF-4300, TSF-4445, TSF-4460, and TSF-4452 (all of which are manufactured by Momentive Performance Materials Co., Ltd.), KP-341, KF-6000, KF-6001, KF-6002, and KF-6003 (all of which are manufactured by Shin-Etsu Chemical Co., Ltd.), and BYK307, BYK323, and BYK330 (all of which are manufactured by BYK Chemie).

A content of the surfactant in the total solid content of the infrared-absorbing composition is preferably 0.001% to 1% by mass, more preferably 0.001% to 0.5% by mass, and still more preferably 0.001% to 0.2% by mass.

In addition, in a case where the surfactant is used as a dispersant for the specific particles, the content of the surfactant is preferably 1 to 200 parts by mass, more preferably 2 to 100 parts by mass, and still more preferably 5 to 50 parts by mass with respect to 100 parts by mass of the specific particles.

The infrared-absorbing composition may include only one kind of surfactant, or may include two or more kinds thereof. In a case of including two or more kinds thereof, the total amount thereof is preferably within the above-described range.

<<Polymerization Inhibitor>>

The infrared-absorbing composition according to the embodiment of the present invention can contain a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-t-butylphenol), and an N-nitrosophenylhydroxylamine salt (an ammonium salt, a cerous salt, or the like), and p-methoxyphenol is preferable. A content of the polymerization inhibitor in the total solid content of the infrared-absorbing composition is preferably 0.0001% to 5% by mass. The infrared-absorbing composition may include only one kind of polymerization inhibitor, or may include two or more kinds thereof. In a case of including two or more kinds thereof, the total amount thereof is preferably within the above-described range.

<<Silane Coupling Agent>>

The infrared-absorbing composition according to the embodiment of the present invention can contain a silane coupling agent. In the present specification, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group., Examples of the functional group other than the hydrolyzable group include a vinyl group, a styryl group, a (meth)acryloyl group, a mercapto group, an epoxy group, an oxetanyl group, an amino group, a ureido group, a sulfide group, an isocyanate group, and a phenyl group, and a (meth)acryloyl group or an epoxy group is preferable. Examples of the silane coupling agent include a compound described in paragraph Nos. 0018 to 0036 of JP2009-288703A and a compound described in paragraph Nos. 0056 to 0066 of JP2009-242604A, the content of which is incorporated herein by reference. A content of the silane coupling agent in the total solid content of the infrared-absorbing composition is preferably 0.01% to 15.0% by mass and more preferably 0.05% to 10.0% by mass. The infrared-absorbing composition may include only one kind of silane coupling agent, or may include two or more kinds thereof. In a case of including two or more kinds thereof, the total amount thereof is preferably within the above-described range.

<<Ultraviolet Absorber>>

The infrared-absorbing composition can contain a ultraviolet absorber. Examples of the ultraviolet absorber include a conjugated diene compound, an aminodiene compound, a salicylate compound, a benzophenone compound, a benzotriazole compound, an acrylonitrile compound, a hydroxyphenyltriazine compound, an indole compound, a triazine compound, and a merocyanine coloring agent. Specific examples of such a compound include compounds described in paragraph Nos. 0038 to 0052 of JP2009-217221A, paragraph Nos. 0052 to 0072 of JP2012-208374A, paragraph Nos. 0317 to 0334 of JP2013-068814A, and paragraph Nos., 0061 to 0080 of JP2016-162946A, the contents of which are incorporated herein by reference. Examples of a commercially available product of the ultraviolet absorber include Tinuvin series and Uvinul series manufactured by BASF SE. In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraph Nos. 0049 to 0059 of JP6268967B and paragraph Nos. 0059 to 0076 of WO2016/181987A can also be used. A content of the ultraviolet absorber in the total solid content of the infrared-absorbing composition is preferably 0.01% to 30% by mass and more preferably 0.05% to 25% by mass. The infrared-absorbing composition may include only one kind of ultraviolet absorber, or may include two or more kinds thereof. In a case of including two or more kinds thereof, the total amount thereof is preferably within the above-described range.

<<Antioxidant>>

The infrared-absorbing composition according to the embodiment of the present invention can contain an antioxidant. Examples of the antioxidant include a phenol compound, a phosphite ester compound, and a thioether compound. As the phenol compound, any phenol compound which is known as a phenol-based antioxidant can be used. Preferred examples of the phenol compound include a hindered phenol compound. A compound having a substituent at a site (ortho position) adjacent to a phenolic hydroxy group is preferable. As the substituent, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus antioxidant can also be suitably used. Examples of the phosphorus antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl)phosphite. Examples of a commercially available product of the antioxidant include ADK STAB AO-20, ADK STAB AO-30, ADK STAB AO-40, ADK STAB AO-50, ADK STAB AO-50F, ADK STAB AO-60, ADK STAB AO-60G, ADK STAB AO-80, and ADK STAB AO-330 (all of which are manufactured by ADEKA Corporation). In addition, as the antioxidant, compounds described in paragraph Nos. 0023 to 0048 of JP6268967B, compounds described in WO2017/006600A, or compounds described in WO2017/164024A can also be used. A content of the antioxidant in the total solid content of the infrared-absorbing composition is preferably 0.01% to 20% by mass and more preferably 0.3% to 15% by mass. The infrared-absorbing composition may include only one kind of antioxidant, or may include two or more kinds thereof. In a case of including two or more kinds thereof, the total amount thereof is preferably within the above-described range.

<<Other Components>>

Optionally, the infrared-absorbing composition according to the embodiment of the present invention may further contain a sensitizer, a curing accelerator, a filler, a thermal curing accelerator, a plasticizer, and other auxiliary agents (for example, conductive particles, a filling agent, an antifoaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraph No. 0183 of JP2012-003225A (corresponding to paragraph No. 0237 of US2013/0034812A) and paragraph Nos. 0101 to 0104 and 0107 to 0109 of JP2008-250074A, the contents of which are incorporated herein by reference. In addition, optionally, the infrared-absorbing composition according to the embodiment of the present invention may contain a potential antioxidant. Examples of the potential antioxidant include a compound in which a portion that functions as the antioxidant is protected by a protective group and the protective group is desorbed by heating the compound at 100° C. to 250° C. or by heating the compound at 80° C. to 200° C. in the presence of an acid/a base catalyst. Examples of the potential antioxidant include compounds described in WO2014/021023A, WO2017/030005A, and JP2017-008219A. Examples of a commercially available product of the potential antioxidant include ADEKA ARKLS GPA-5001 (manufactured by ADEKA Corporation).

In addition, in a case where the infrared-absorbing composition according to the embodiment of the present invention is used as various inks such as ink jet ink and printing ink, as other additives, a lubricant, a filling agent, a defoamer, a gelling agent, a thickener, a resistivity modifier, a film-forming agent, an anti-fading agent, an anti-mold agent, a rust inhibitor, or the like can be blended. Examples of these additives include additives described in paragraph Nos. 0163 to 0170 of JP2014-024980A, the contents of which are incorporated herein by reference.

<Storage Container>

A storage container of the infrared-absorbing composition according to the embodiment of the present invention is not particularly limited, and a known storage container can be used. In addition, as the storage container, it is also preferable to use a multilayer bottle having an interior wall constituted with six layers from six kinds of resins or a bottle having a 7-layer structure from 6 kinds of resins for the purpose of suppressing infiltration of impurities into raw materials or infrared-absorbing compositions. Examples of such a container include the containers described in JP2015-123351A. In addition, for the purpose of preventing metal elution from the container interior wall, improving storage stability of the infrared-absorbing composition, and suppressing the alteration of components, it is also preferable that the container interior wall is formed of glass, stainless steel, or the like.

<Method for Preparing Infrared-Absorbing Composition>

The infrared-absorbing composition according to the embodiment of the present invention can be prepared by mixing the above-described components with each other. During the preparation of the infrared-absorbing composition, all the components may be dissolved or dispersed in a solvent at the same time to prepare the infrared-absorbing composition. Optionally, two or more solutions or dispersion liquids in which the respective components are appropriately blended may be prepared, and the solutions or dispersion liquids may be mixed with each other during use (during application) to prepare the infrared-absorbing composition.

In the preparation of the infrared-absorbing composition, a process of dispersing the particles is preferably included. In the process for dispersing the particles, examples of a mechanical force which is used for dispersing the particles include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the particles in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the particles, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the particles, a refining treatment of particles in a salt milling step may be performed. A material, a device, process conditions, and the like used in the salt milling step can be found in, for example, JP2015-194521A and JP2012-046629A.

During the preparation of the infrared-absorbing composition, it is preferable that the infrared-absorbing composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is preferably 0.01 to 7.0 μm, more preferably 0.01 to 3.0 μm, and still more preferably 0.05 to 0.5 μm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY, DFA4201NAEY, DFA4201J006P, and the like), Toyo Roshi Kaisha., Ltd., Nihon Entegris K.K. (formerly Nippon Microlith Co., Ltd.), Kitz Micro Filter Corporation, and the like can be used.

In addition, it is preferable that a fibrous filter material is used as the filter. Examples of the fibrous filter material include polypropylene fiber, nylon fiber, and glass fiber. Examples of a commercially available product include SBP type series (SBP008 and the like), TPR type series (TPR002, TPR005, and the like), or SHPX type series (SHPX003 and the like), all manufactured by Roki Techno Co., Ltd.

In a case where a filter is used, a combination of different filters (for example, a first filter and a second filter) may be used. In this case, the filtering using each of the filters may be performed once, or twice or more. In addition, a combination of filters having different pore sizes in the above-described range may be used. In addition, the filtering using the first filter may be performed only on the dispersion liquid, and the filtering using the second filter may be performed on a mixture of the dispersion liquid and other components.

<Film>

Next, a film according to an embodiment of the present invention will be described. The film according to an embodiment of the present invention is obtained from the above-described infrared-absorbing composition according to the embodiment of the present invention. The film according to the embodiment of the present invention can be preferably used as an optical filter. The application of the optical filter is not particularly limited, but the optical filter can be preferably used for a near-infrared cut filter on a light-receiving side of a solid-state imaging element (for example, for a near-infrared cut filter for a wafer level lens), a near-infrared cut filter on a back surface side (opposite to the light-receiving side) of the solid-state imaging element, a near-infrared cut filter for an ambient light sensor (for example, an illuminance sensor that detects illuminance or tone of an environment in which an information terminal device is placed and adjusts tone of a display, or a color correction sensor that adjusts tone), and the like. In particular, the film according to the embodiment of the present invention can be preferably used as a near-infrared cut filter of a solid-state imaging element on a light-receiving side. In addition, the film according to the embodiment of the present invention can be used as a near-infrared cut filter of an infrared sensor that detects an object by detecting light having a wavelength of 700 to 1550 nm. In addition, by using an infrared-absorbing composition including the coloring material which allows transmission of infrared rays and shields visible light, the film according to the embodiment of the present invention can also be used to form an infrared transmitting filter capable of transmitting only near-infrared rays having a specific wavelength or longer. For example, it is also possible to form an infrared transmitting filter capable of transmitting near-infrared rays having a wavelength of 900 nm or more by shielding light from a wavelength of 400 to 900 nm. The film according to the embodiment of the present invention may be a film having a pattern or a film (flat film) not having a pattern. In addition, the film according to the embodiment of the present invention may be used in a state where it is laminated on a support, or the film according to the embodiment of the present invention may be peeled off from a support. Examples of the support include a semiconductor base material such as a silicon substrate, and a transparent base material.

A charge coupled device (CCD), a complementary metal-oxide semiconductor (CMOS), a transparent conductive film, or the like may be formed on the semiconductor base material used as the support. In addition, a black matrix which separates pixels from each other may be formed on the semiconductor base material. In addition, optionally, an undercoat layer may be provided on the semiconductor base material to improve adhesiveness with a layer above the semiconductor base material, to prevent diffusion of substances, or to make the surface of the base material flat.

The transparent base material used as the support is not particularly limited as long as it is formed of a material which can allow transmission of at least visible light. Examples thereof include a base material formed of a material such as glass and resin. Examples of the resin include polyester resins such as polyethylene terephthalate and polybutylene terephthalate, polyolefin resins such as polyethylene, polypropylene, and ethylene vinyl acetate copolymer, norbornene resin, acrylic resins such as polyacrylate and polymethylmethacrylate, urethane resin, vinyl chloride resin, fluoro resin, polycarbonate resin, polyvinyl butyral resin, and polyvinyl alcohol resin. Examples of the glass include soda lime glass, borosilicate glass, non-alkali glass, quartz glass, and copper-containing glass. Examples of the copper-containing glass include a phosphate glass containing copper and a fluorophosphate glass containing copper. As the copper-containing glass, a commercially available product may also be used. Examples of a commercially available product of the copper-containing glass include NF-50 (manufactured by AGC Techno Glass Co., Ltd.).

A thickness of the film according to the embodiment of the present invention can be a adjusted according to the purpose. The thickness of the film is preferably 20 µm or less, more preferably 10 µm or less, and still more preferably 5 µm or less. The lower limit of the thickness of the film is preferably 0.1 µm or more and more preferably 0.2 µm or more.

In a case where the film according to the embodiment of the present invention is used as an infrared cut filter, it is preferable that the film according to the embodiment of the present invention has a maximal absorption wavelength in a range of 650 to 1500 nm (preferably 700 to 1300 nm and more preferably 700 to 1000 nm). In addition, an average light transmittance in a wavelength range of 400 to 600 nm is preferably 50% or more, more preferably 70% or more, still more preferably 80% or more, and particularly preferably 85% or more. In addition, the light transmittance in the entire wavelength range of 400 to 600 nm is preferably 50% or more, more preferably 70% or more, and still more preferably 80% or more. In addition, in the film according to the embodiment of the present invention, a transmittance at at least one point in a wavelength range of 650 to 1500 nm (preferably 700 to 1300 nm and more preferably 700 to 1000 nm) is preferably 15% or less, more preferably 10% or less, and still more preferably 5% or less. In addition, in the film according to the embodiment of the present invention, a ratio (A/A2) of the maximal value A1 of an absorbance in a wavelength range of 400 to 600 nm to an absorbance A2 at the maximal absorption wavelength existing on the shortest wavelength side in a wavelength range of 650 to 1500 nm is preferably 0.30 or less, more preferably 0.20 or less, still more preferably 0.15 or less, and particularly preferably 0.10 or less.

In a case where the film according to the embodiment of the present invention is used as an infrared transmitting filter, in the film according to the embodiment of the present invention, it is preferable that the maximum value of a transmittance in a wavelength range of 400 to 830 nm is 20% or less (preferably 15% or less and more preferably 10% or less) and the minimum value of a transmittance in a wavelength range of 1100 to 1500 nm is 70% or more (preferably 75% or more and more preferably 80% or more). The film according to the embodiment of the present invention, which is used as the infrared transmitting filter, preferably satisfies any one of the following spectral characteristics (1) to (4).

(1): maximum value of a transmittance in a wavelength range of 400 to 750 nm is 20% or less (preferably 15% or less and more preferably 10% or less) and the minimum value of a transmittance in a wavelength range of 900 to 1500 nm is 70% or more (preferably 75% or more and more preferably 80% or more).

(2): maximum value of a transmittance in a wavelength range of 400 to 830 nm is 20% or less (preferably 15% or less and more preferably 10% or less) and the minimum value of a transmittance in a wavelength range of 1000 to 1500 nm is 70% or more (preferably 75% or more and more preferably 80% or more).

(3): maximum value of a transmittance in a wavelength range of 400 to 950 nm is 20% or less (preferably 15% or less and more preferably 10% or less) and the minimum value of a transmittance in a wavelength range of 1100 to 1500 nm is 70% or more (preferably 75% or more and more preferably 80% or more).

(4): maximum value of a transmittance in a wavelength range of 400 to 1050 nm is 20% or less (preferably 15% or less and more preferably 10% or less) and the minimum value of a transmittance in a wavelength range of 1200 to 1500 nm is 70% or more (preferably 75% or more and more preferably 80% or more).

The film according to the embodiment of the present invention can be used in combination with a color filter which includes a chromatic colorant. The color filter can be produced using a coloring composition including a chromatic colorant. In a case where the film according to the embodiment of the present invention is used as an infrared cut filter and used in combination with a color filter, it is preferable that the color filter is disposed on an optical path of the film according to the embodiment of the present invention. For example, it is preferable that the film according to the embodiment of the present invention and the color filter are laminated and used as a laminate. In the laminate, the film according to the embodiment of the present invention and the color filter may be or may not be adjacent to each other in a thickness direction. In a case where the film according to the embodiment of the present invention is not adjacent to the color filter in the thickness direction, the film according to the embodiment of the present invention may be formed on another support other than a support on which the color filter is formed, or another member (for example, a microlens or a planarizing layer) constituting a solid-state imaging element may be interposed between the film according to the embodiment of the present invention and the color filter.

The film according to the embodiment of the present invention can be used in various devices including a solid-state imaging element such as a charge coupled device (CCD) or a complementary metal-oxide semiconductor (CMOS), an infrared sensor, or an image display device.

<Method for Producing Film>

The film according to the embodiment of the present invention can be produced through a step of applying the infrared-absorbing composition according to the embodiment of the present invention.

Examples of the support are as described above. As a method of applying the infrared-absorbing composition, a known method can be used. Examples thereof include a dropping method (drop casting); a slit coating method; a spray method; a roll coating method; a spin coating method (spin coating); a cast coating method; a slit and spin method; a pre-wet method (for example, a method described in JP2009-145395A), various printing methods such as an ink jet (for example, on-demand type, piezo type, thermal type), a discharge printing such as nozzle jet, a flexo printing, a screen printing, a gravure printing, a reverse offset printing, and a metal mask printing method; a transfer method using molds and the like; and a nanoimprinting method. The application method using an ink jet method is not particularly limited, and examples thereof include a method (in particular, pp. 115 to 133) described in "Extension of Use of Ink Jet—Infinite Possibilities in Patent—" (published in February, 2005, S.B. Research Co., Ltd.) and methods described in JP2003-262716A, JP2003-185831A, JP2003-261827A, JP2012-126830A, and JP2006-169325A.

The infrared-absorbing composition layer formed by applying the infrared-absorbing composition may be dried (pre-baked). In a case of performing the pre-baking, the pre-baking temperature is preferably 150° C. or lower, more preferably 120° C. or lower, and still more preferably 110° C. or lower. The lower limit may be set to, for example, 50° C. or higher, or to −80° C. or higher. The pre-baking time is preferably 10 seconds to 3000 seconds, more preferably 40 seconds to 2500 seconds, and still more preferably 80 seconds to 220 seconds. Drying can be performed using a hot plate, an oven, or the like.

The infrared-absorbing composition layer after the pre-baking may be subjected to an additional baking. By performing the additional baking, aggregate of the particles of the infrared-absorbing coloring agent, which occurs during post-baking, can be reduced, and a change in ratio of the absorbance at the maximal absorption wavelength existing on the shortest wavelength side to the absorbance at the maximal absorption wavelength existing on the second shortest wavelength side in the wavelength range of 650 to 1500 nm can be smaller. In a case of performing the additional baking, the additional baking temperature is preferably 100° C. to 180° C. and more preferably 120° C. to 160° C. The additional baking time is preferably 10 to 3000 seconds, more preferably 40 to 2500 seconds, and still more preferably 300 to 1200 seconds. The additional baking can be performed using a hot plate, an oven, or the like.

The method of producing the film according to the embodiment of the present invention may further include a step of forming a pattern. Examples of the pattern forming method include a pattern forming method using a photolithography method and a pattern forming method using a dry etching method. Among these, the pattern forming method using a photolithography method is preferable. In a case where the film according to the embodiment of the present invention is used as a flat film, the step of forming a pattern is not necessarily performed. Hereinafter, the step of forming a pattern will be described in detail.

(Case where Pattern is Formed Using Photolithography Method)

It is preferable that the pattern forming method using a photolithography method includes: a step (exposing step) of exposing the infrared-absorbing composition layer, which is formed by applying the infrared-absorbing composition according to the embodiment of the present invention, in a patterned manner; and a step (developing step) of forming a pattern by removing a non-exposed portion of the infrared-absorbing composition layer by development. Optionally, the pattern forming method may further include a step (post-baking step) of baking the developed pattern. Hereinafter, the respective steps will be described.

<<Exposing Step>>

In the exposing step, the infrared-absorbing composition layer is exposed in a patterned manner. For example, the infrared-absorbing composition layer can be exposed in a patterned manner using a stepper exposure device or a scanner exposure device through a mask having a predetermined mask pattern. Thus, the exposed portion can be cured.

Examples of the radiation (light) which can be used during the exposure include g-rays and i-rays. In addition, light (preferably light having a wavelength of 180 to 300 nm) having a wavelength of 300 nm or less can also be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used.

In addition, in a case of exposure, the composition layer may be irradiated with light continuously to expose the composition layer, or the composition layer may be irradiated with light in a pulse to expose the composition layer (pulse exposure). The pulse exposure refers to an exposing method in which light irradiation and resting are repeatedly performed in a short cycle (for example, millisecond-level or less).

The irradiation amount (exposure amount) is, for example, preferably 0.03 to 2.5 $J/cm^2$ and more preferably 0.05 to 1.0 $J/cm^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be usually selected from a range of 1000 $W/m^2$ to 100000 $W/m^2$ (for example, 5000 $W/m^2$, 15000 $W/m^2$, or 35000 $W/m^2$). Appropriate conditions of each of the oxygen concentration and the exposure illuminance may be combined, and for example, a combination of the oxygen concentration of 10% by volume and the illuminance of 10000 $W/m^2$, a combination of the oxygen concentration of 35% by volume and the illuminance of 20000 $W/m^2$, or the like is available.

<<Developing Step>>

Next, a pattern is formed by removing a non-exposed portion of the exposed infrared-absorbing composition layer by development. The infrared-absorbing composition layer in the non-exposed portion can be removed by development using a developer. As a result, the infrared-absorbing composition layer in the non-exposed portion in the exposing step is eluted into the developer, and only the photocured portion remains on the support. The temperature of the developer is preferably, for example, 20° C. to 30° C. The development time is preferably 20 to 180 seconds. In addition, in order to improve residue removing properties, a step of removing the developer by shaking off per 60 seconds and supplying a fresh developer may be repeated multiple times.

Examples of the developer include an organic solvent and an alkali developer, and an alkali developer is preferably used. As the alkali developer, an alkaline aqueous solution (alkali developer) in which an alkaline agent is diluted with pure water is preferable. Examples of the alkaline agent include organic alkaline compounds such as ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. In consideration of environmental aspects and safety aspects, the alkaline agent is preferably a compound having a high molecular weight. The concentration of the alkaline agent in the alkaline aqueous solution is preferably 0.001% to 10% by mass and more preferably 0.01% to 1% by mass. In addition, the developer may further contain a surfactant. As the surfactant, a nonionic surfactant is preferable. From the viewpoint of transportation, storage, and the like, the developer may be first produced as a concentrated solution and then diluted to a concentration required upon the use. The dilution factor is not particularly limited and, for example, can be set to be in a range of 1.5 to 100 times. In addition, it is also preferable to wash (rinse) with pure water after development. In addition, it is preferable that the rinsing is performed by supplying a rinsing liquid to the composition layer after development while rotating the support on which the composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, it is preferable to carry out an additional exposure treatment or a heating treatment (post-baking) after carrying out drying. The additional exposure treatment or the post-baking is a curing treatment after development in order to complete curing. The heating temperature in the post-baking is, for example, preferably 100° C. to 240° C. and more preferably 200° C. to 240° C. The film after development is post-baked continuously or batch-wise using a heating unit such as a hot plate, a convection oven (hot air circulation dryer), and a high-frequency heater under the above-described conditions. In a case of performing the additional exposure treatment, light used for the exposure is preferably light having a wavelength of 400 nm or less. In addition, the additional exposure treatment may be carried out by the method described in KR10-2017-0122130A.

(Case where Pattern is Formed Using Dry Etching Method)

The formation of a pattern using a dry etching method can be performed using a method including: applying the above-described infrared-absorbing composition to a support or the like to form an infrared-absorbing composition layer; curing the formed composition layer to form a cured composition layer; forming a patterned photoresist layer on the cured composition layer; and dry-etching the cured composition layer with etching gas by using the patterned photoresist layer as a mask. It is preferable that pre-baking treatment is performed in order to form the photoresist layer. The details of the pattern formation by the dry etching method can be found in paragraph Nos. 0010 to 0067 of JP2013-064993A, the content of which is incorporated herein by reference.

<Optical Filter>

An optical filter according to an embodiment of the present invention has the above-described film according to the embodiment of the present invention. Examples of the type of the optical filter include an infrared cut filter and an infrared transmitting filter.

The optical filter according to the embodiment of the present invention may have a layer containing copper, a dielectric multi-layer film, or an ultraviolet absorbing layer in addition to the film according to the embodiment of the present invention. Examples of the ultraviolet absorbing layer include absorbing layers described in paragraph Nos. 0040 to 0070 and 0119 to 0145 of WO2015/099060A. Examples of the dielectric multi-layer film include dielectric multi-layer films described in paragraph Nos. 0255 to 0259 of JP2014-041318A. As the layer containing copper, a glass substrate (copper-containing glass substrate) formed of glass containing copper, or a layer (copper complex-containing layer) containing a copper complex may also be used. Examples of the copper-containing glass substrate include a phosphate glass including copper and a fluorophosphate glass including copper. Examples of a commercially available product of the copper-containing glass include NF-50 (manufactured by AGC Techno Glass Co., Ltd.), BG-60 and BG-61 (both of which are manufactured by Schott AG), and CD5000 (manufactured by Hoya Corporation).

<Solid-State Imaging Element>

The solid-state imaging element according to an embodiment of the present invention includes the film according to the embodiment of the present invention. The configuration of the solid-state imaging element is not particularly limited as long as it includes the film according to the embodiment of the present invention and functions as a solid-state imaging element. For example, the following configuration can be adopted.

The solid-state imaging element includes a plurality of photodiodes and transfer electrodes on the support, the photodiodes consisting of a light receiving area of the solid-state imaging element, and the transfer electrode consisting of polysilicon or the like. In the solid-state imaging element, a light-shielding film consisting of tungsten or the like which has openings through only light receiving sections of the photodiodes is provided on the photodiodes and the transfer electrodes, a device protective film consisting of silicon nitride or the like is formed on the light-shielding film so as to cover the entire surface of the light-shielding film and the light receiving sections of the photodiodes, and the film according to the embodiment of the present invention is formed on the device protective film. Furthermore, a configuration in which a light collecting unit (for example, a microlens; hereinafter, the same shall be applied) is provided above the device protective film and below the film according to the embodiment of the present invention (on a side thereof close the support), or a configuration in which a light collecting unit is provided on the film according to the embodiment of the present invention may be adopted. In addition, the color filter may have a structure in which a film which forms each pixel is embedded in a space which is partitioned in, for example, a lattice form by a partition wall. In this case, it is preferable that the partition wall has a lower refractive index than each pixel. Examples of an imaging device having such a structure include devices described in JP2012-227478A and JP2014-179577A.

<Image Display Device>

An image display device according to the embodiment of the present invention includes the film according to the embodiment of the present invention. Examples of the image display device include a liquid crystal display device or an organic electroluminescence (organic EL) display device. The definitions or details of image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation". The image display device may be an image display device having a white organic EL element. It is preferable that the white organic EL element has a tandem structure. The tandem structure of the organic EL element is described in, for example, JP2003-045676A, or pp. 326 to 328 of "Forefront of Organic EL Technology Development—Know-How Collection of High Brightness, High Precision, and Long Life" (Technical Information Institute, 2008). It is preferable that a spectrum of white light emitted from the organic EL element has high maximal emission peaks in a blue range (430 to 485 nm), a green range (530 to 580 nm), and a yellow range (580 to 620 nm). It is more preferable that the spectrum has a maximal emission peak in a red range (650 to 700 nm) in addition to the above-described emission peaks.

<Infrared Sensor>

An infrared sensor according to the embodiment of the present invention includes the film according to the embodiment of the present invention. The configuration of the infrared sensor is not particularly limited as long as it functions as an infrared sensor. Hereinafter, an embodiment of the infrared sensor according to the present invention will be described using the drawing.

In FIG. 1, reference numeral 110 represents a solid-state imaging element. Infrared cut filters 111 and infrared transmitting filters 114 are arranged in an imaging region of the solid-state imaging element 110. In addition, color filters 112 are arranged on the infrared cut filters 111. Microlenses 115 are disposed on an incidence ray hv side of the color filters 112 and the infrared transmitting filters 114. A planarizing layer 116 is formed so as to cover the microlenses 115.

The infrared cut filter 111 can be formed using the infrared-absorbing composition according to the embodiment of the present invention. Spectral characteristics of the infrared cut filters 111 can be selected according to the emission wavelength of an infrared light emitting diode (infrared LED) to be used. The color filters 112 is not particularly limited as long as pixels which allow transmission of light having a specific wavelength in a visible range and absorbs the light are formed therein, and a known color filter in the related art for forming a pixel can be used. For example, pixels of red (R), green (G), and blue (B) are formed in the color filters. For example, the details of the color filters can be found in paragraph Nos. 0214 to 0263 of JP2014-043556A, the content of which is incorporated herein by reference. Characteristics of the infrared transmitting filter 114 can be selected according to the emission wavelength of the infrared LED to be used.

In the infrared sensor shown in FIG. 1, an infrared cut filter (other infrared cut filters) other than the infrared cut filter 111 may be further disposed on the planarizing layer 116. As the other infrared cut filters, for example, a layer containing copper and/or a dielectric multi-layer film may be provided. The details of the examples are as described above. In addition, as the other infrared cut filters, a dual band pass filter may be used.

EXAMPLES

Hereinafter, the present invention will be described in detail with reference to Examples. Materials, used amounts, proportions, treatment details, treatment procedures, and the like shown in the following examples can be appropriately changed within a range not departing from the scope of the present invention.

<Synthesis Example of Infrared-Absorbing Coloring Agent A-1>

An infrared-absorbing coloring agent A-1 was synthesized according to the following scheme. In the following structural formulae, Me represents a methyl group and Ph represents a phenyl group.

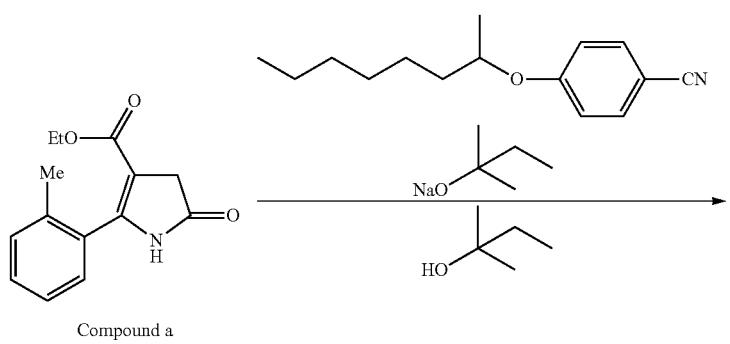

Compound a

-continued
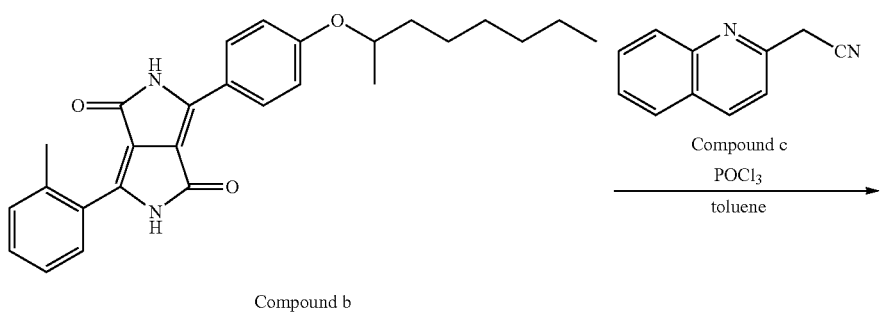
Compound b
Compound c
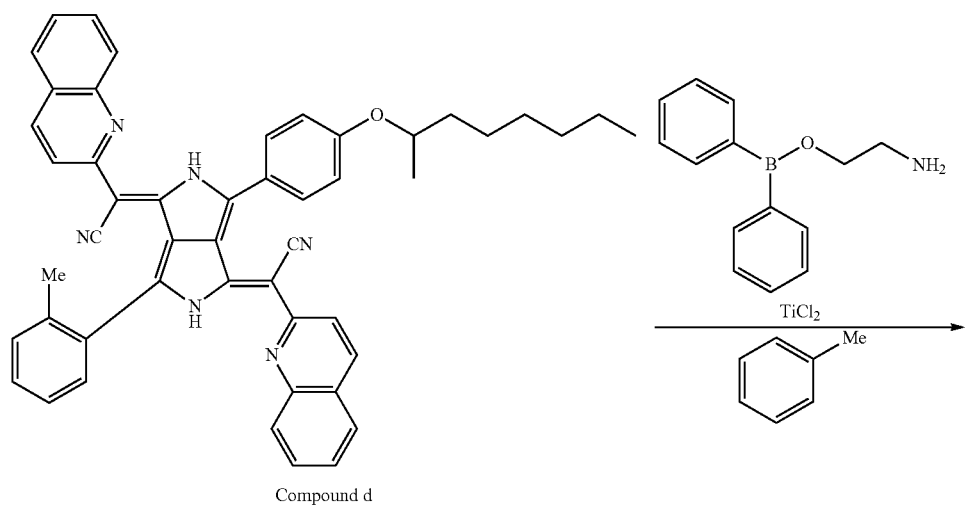
Compound d
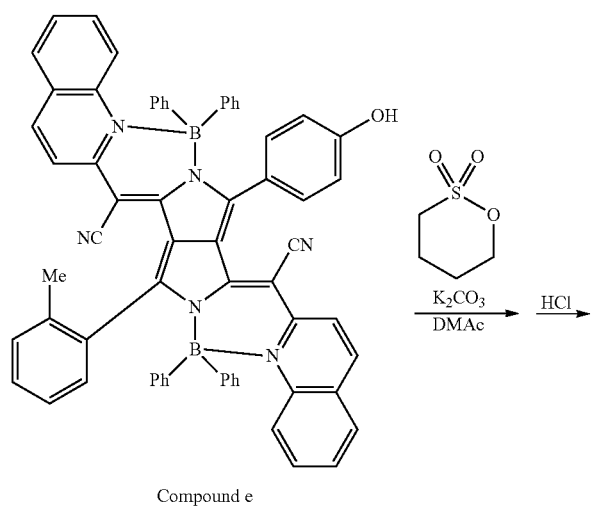
Compound e -continued

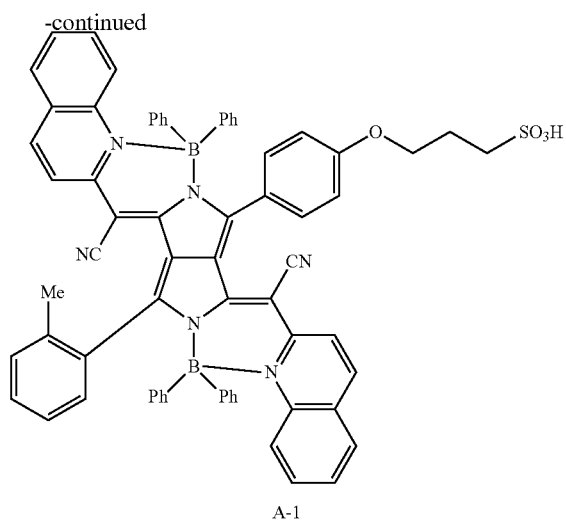

A-1

(Synthesis of Compound a)

A compound a was synthesized according to the method described in Tetrahedron, Vol. 62 (2006), pp. 6018 to 6028 using ethyl 2-methylbenzoyl acetate (manufactured by Tokyo Chemical Industry Co., Ltd.) as a raw material.

(Synthesis of Compound b)

A compound b was synthesized according to the method described in paragraph 0342 of WO2016/194527A using 4-(1-methylheptoxy)benzonitrile and the compound a as raw materials.

(Synthesis of Compound c)

A compound c was synthesized according to the method described in Chemistry-A European Journal, 2009, vol. 15, #19, p. 4857 to 4864.

(Synthesis of Compound d)

A compound d was synthesized according to the method described in paragraph 0072 of JP6353060B.

(Synthesis of Compound e)

A compound e was synthesized according to the method described in paragraph 0072 of JP6353060B.

(Synthesis of Infrared-Absorbing Coloring Agent A-1)

3.0 parts by mass of the compound e and 1.75 parts by mass of potassium carbonate were stirred in 36 parts by mass of dimethylacetamide (DMAc), 3.0 parts by mass of butane sultone and 4 parts by mass of DMAc were added thereto, and the mixture was stirred at room temperature for 10 minutes. The circumscribe temperature was raised to 95° C. and heating was performed for 3 hours. Next, the mixture was allowed to cool until the internal temperature reached 30° C., and the precipitated crystals were filtered off. The obtained crystals were added little by little to 30 parts by mass of a 4 mol/L hydrochloric acid aqueous solution while maintaining an internal temperature of 30° C. or lower, and an operation of stirring at room temperature for 30 minutes and filtering off the precipitated crystals was performed twice. 60 parts by mass of ethyl acetate was added to the obtained crystals, the mixture was heated under reflux for 30 minutes and allowed to cool to 30° C., and operation of filtering off the crystals was performed twice. The obtained crystals were blast-dried at 50° C. for 24 hours to obtain 2.0 parts by mass of a compound A-1.

<Synthesis Example of Infrared-Absorbing Coloring Agents A-2 to A-7>

Infrared-absorbing coloring agents A-2 to A-7 were synthesized in the same manner as in the synthesis of the infrared-absorbing coloring agent A-1.

<Evaluation of Dissolved Amount of Infrared-Absorbing Coloring Agent>

The infrared-absorbing coloring agent shown in the tables below was added to a measurement solvent shown in the tables below, while the temperature was adjusted to 25° C. under atmospheric pressure. After stirring for 1 hour, the dissolved amount of each infrared-absorbing coloring agent in the measurement solvent at 25° C. was determined. The dissolved amount of the infrared-absorbing coloring agent was evaluated based on the following standard. A case of A was judged to be a good solvent, and a case of B was judged to be a poor solvent. The infrared-absorbing coloring agent exists as particles in the poor solvent. PGMEA described in the column of measurement solvent in the following tables is an abbreviation for propylene glycol monomethyl ether acetate.

A: dissolved amount of the infrared-absorbing coloring agent in 100 g of the measurement solvent at 25° C. was 0.1 g or more.

B: dissolved amount of the infrared-absorbing coloring agent in 100 g of the measurement solvent at 25° C. was less than 0.1 g.

TABLE 1

| Type of infrared-absorbing coloring agent | Skeleton | Measurement solvent | Solubility |
|---|---|---|---|
| A-1 | Pyrrolopyrrole | Dimethyl sulfoxide | A |
|  |  | Water | B |
|  |  | PGMEA | B |
|  |  | Cyclopentanone | B |
| A-2 | Pyrrolopyrrole | Dimethyl sulfoxide | A |
|  |  | Water | B |
|  |  | PGMEA | B |
|  |  | Cyclopentanone | B |

TABLE 1-continued

| Type of infrared-absorbing coloring agent | Skeleton | Measurement solvent | Solubility |
|---|---|---|---|
| A-3 | Pyrrolopyrrole | Dimethyl sulfoxide | A |
|  |  | Water | B |
|  |  | PGMEA | B |
|  |  | Cyclopentanone | B |
| A-4 | Pyrrolopyrrole | Dimethyl sulfoxide | A |
|  |  | Water | B |
|  |  | PGMEA | B |
|  |  | Cyclopentanone | B |
| A-5 | Pyrrolopyrrole | Dimethyl sulfoxide | A |
|  |  | Water | B |
|  |  | PGMEA | B |
|  |  | Cyclopentanone | B |
| A-6 | Pyrrolopyrrole | Dimethyl sulfoxide | A |
|  |  | Water | B |
|  |  | PGMEA | B |
|  |  | Cyclopentanone | B |
| A-7 | Pyrrolopyrrole | Dimethyl sulfoxide | A |
|  |  | Water | B |
|  |  | PGMEA | B |
|  |  | Cyclopentanone | B |

TABLE 2

| Type of infrared-absorbing coloring agent | Skeleton | Measurement solvent | Solubility |
|---|---|---|---|
| Comparative coloring agent 1 | Pyrrolopyrrole | Dimethyl sulfoxide | A |
|  |  | Water | B |
|  |  | PGMEA | B |
|  |  | Cyclopentanone | B |
| Comparative coloring agent 2 | Pyrrolopyrrole | Dimethyl sulfoxide | A |
|  |  | Water | B |
|  |  | PGMEA | B |
|  |  | Cyclopentanone | B |
| Comparative coloring agent 3 | Squarylium | Dimethyl sulfoxide | A |
|  |  | Water | B |
|  |  | PGMEA | A |
|  |  | Cyclopentanone | A |

<Maximal Absorption Wavelength of Infrared-Absorbing Coloring Agent in Good Solvent>

Each infrared-absorbing coloring agent was dissolved in a solvent (good solvent) descried in the following table to prepare a coloring agent solution having a concentration of infrared-absorbing coloring agent of $2.5\times<10^{-6}$ mol/L, and absorption spectrum of the coloring agent solution was measured. The number of maximal absorption wavelengths existing in a wavelength range of 650 to 1500 nm and the wavelength (max) indicating the value having the largest absorbance are shown in the following table.

TABLE 3

| Type of infrared-absorbing coloring agent | Skeleton | Solvent | Evaluation | |
|---|---|---|---|---|
|  |  |  | Number of maximal absorption wavelengths | λmax |
| A-1 | Pyrrolopyrrole | Dimethyl sulfoxide | 2 | 819 nm |
| A-2 | Pyrrolopyrrole | Dimethyl sulfoxide | 2 | 819 nm |
| A-3 | Pyrrolopyrrole | Dimethyl sulfoxide | 2 | 780 nm |
| A-4 | Pyrrolopyrrole | Dimethyl sulfoxide | 2 | 779 nm |
| A-5 | Pyrrolopyrrole | Dimethyl sulfoxide | 2 | 746 nm |
| A-6 | Pyrrolopyrrole | Dimethyl sulfoxide | 2 | 801 nm |
| A-7 | Pyrrolopyrrole | Dimethyl sulfoxide | 2 | 747 nm |
| Comparative coloring agent 1 | Pyrrolopyrrole | Dimethyl sulfoxide | 2 | 819 nm |
| Comparative coloring agent 2 | Pyrrolopyrrole | Dimethyl sulfoxide | 2 | 820 nm |
| Comparative coloring agent 3 | Squarylium | Dimethyl sulfoxide | 1 | 750 nm |
|  |  | Cyclopentanone | 1 | 749 nm |

Structures of the infrared-absorbing coloring agents A-1 to A-7 and comparative coloring agents 1 to 3 are as follows. In the following structural formulae, Me represents a methyl group and Ph represents a phenyl group.

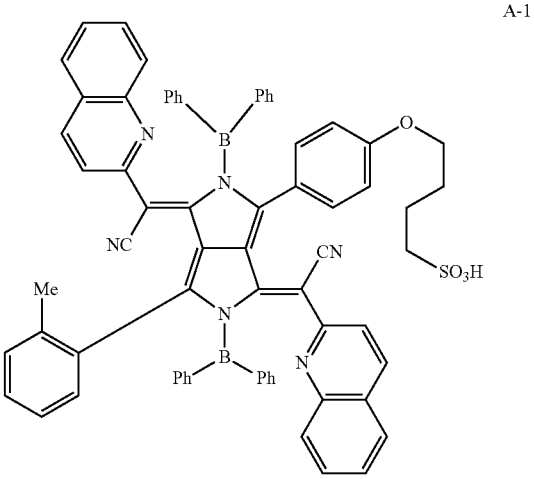

A-1

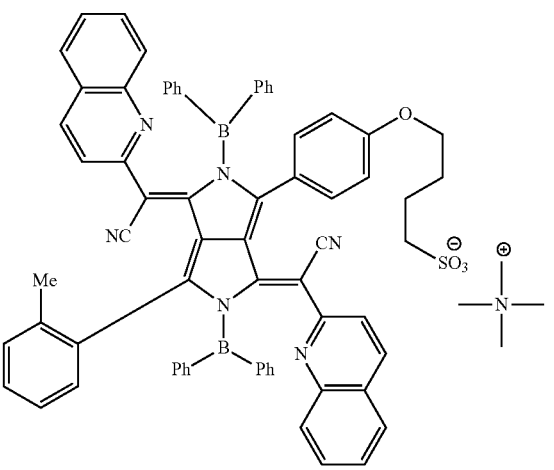

A-2

-continued
A-3
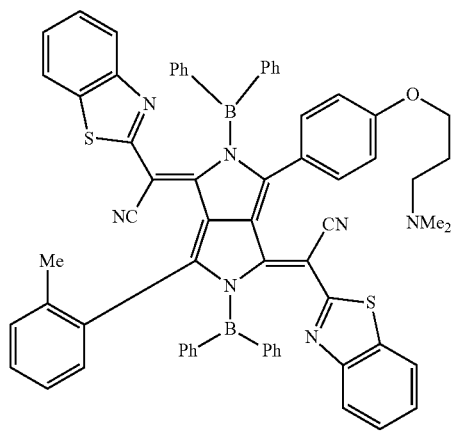
A-4
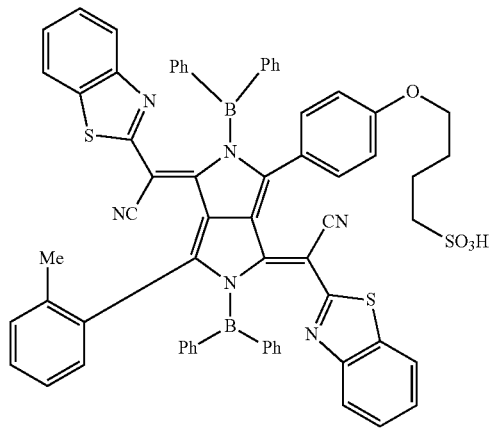
A-5
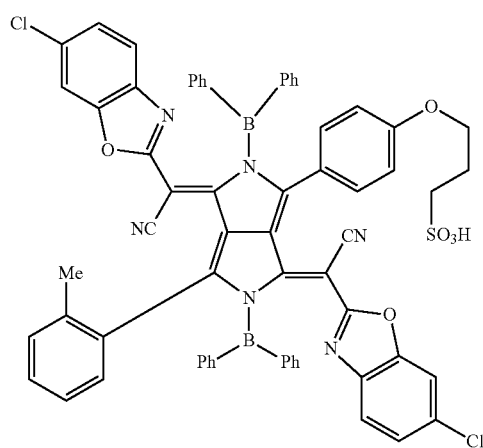
-continued
A-6
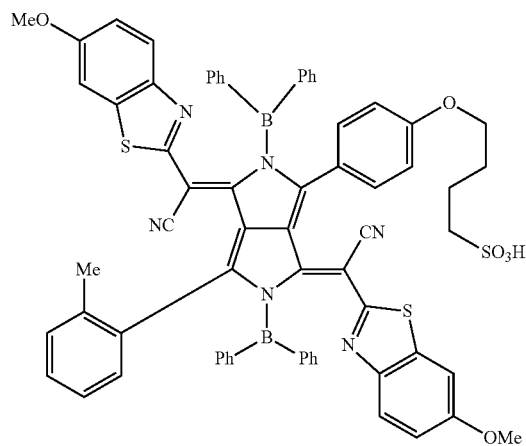
A-7
Comparative coloring agent 1
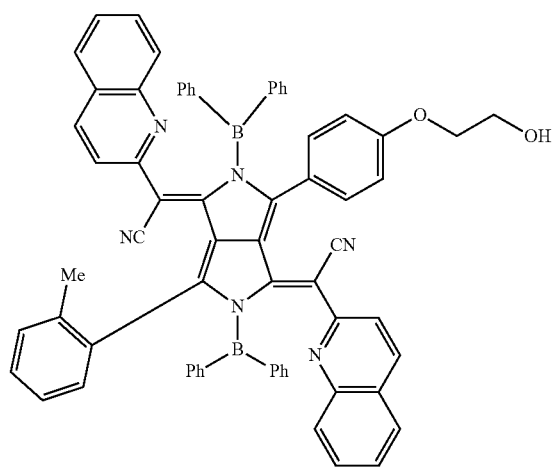

Comparative coloring agent 3

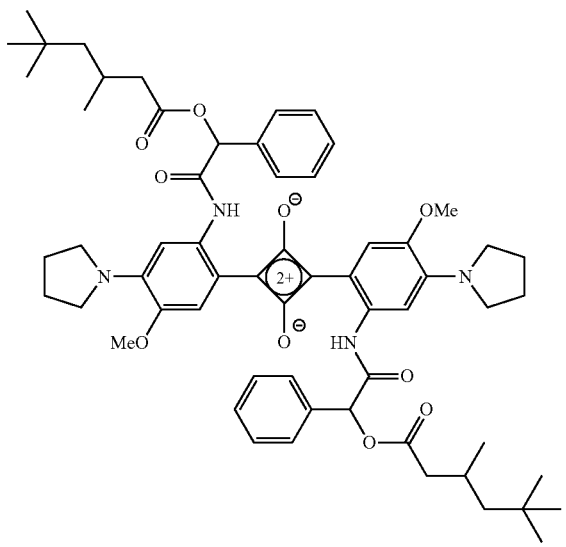

Comparativr coloring agent 2

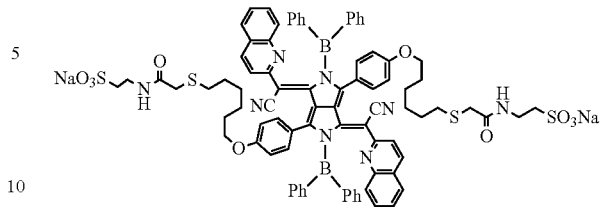

<Preparation of Infrared-Absorbing Compositions of Examples 1 to 5 and Comparative Examples 1 and 2>

Raw materials shown below were mixed, and the obtained mixture was filtered using a nylon filter (manufactured by Nihon Pall Corporation) having a pore diameter of 0.45 μm to prepare an infrared-absorbing composition. In Examples 1 to 5 and Comparative Examples 1 and 2, the infrared-absorbing coloring agent existed in the infrared-absorbing composition in a state of particles. In addition, the dispersion liquid was prepared as follows. The infrared-absorbing coloring agent, the surfactant, and the solvent having the types described in the column of dispersion liquid in the following tables were mixed in blended amounts described in the column of dispersion liquid in the following tables, 500 parts by mass of zirconia beads having a diameter of 0.1 mm was further added thereto, the mixture was treated in a planetary ball mill at 300 rpm for 5 hours, and then the zirconia beads were separated by filtration to prepare a dispersion liquid.

TABLE 4

| | Dispersion liquid | | | | | | | |
|---|---|---|---|---|---|---|---|---|
| | Infrared-absorbing coloring agent | | Solvent | | Surfactant | | Resin | |
| | Type | Blending amount (part by mass) | Type | Blending amount (part by mass) | Type | Blending amount (part by mass) | Type | Blending amount (part by mass) |
| Example 1 | A-1 | 15 | Water | 479 | Surfactant 1 | 6 | Resin 1 | 75 |
| Example 2 | A-2 | 15 | Water | 479 | Surfactant 1 | 6 | Resin 1 | 75 |
| Example 3 | A-3 | 15 | Water | 479 | Surfactant 2 | 6 | Resin 1 | 75 |
| Example 4 | A-4 | 15 | Water | 479 | Surfactant 1 | 6 | Resin 1 | 75 |
| Example 5 | A-5 | 15 | Water | 479 | Surfactant 1 | 6 | Resin 1 | 75 |
| Comparative Example 1 | Comparative coloring agent 1 | 15 | Water | 479 | Surfactant 1 | 6 | Resin 1 | 75 |
| Comparative Example 2 | Comparative coloring agent 2 | 15 | Water | 479 | Surfactant 1 | 6 | Resin 1 | 75 |

Surfactant 1: sodium dodecylbenzenesulfonate (Neogen SC, manufactured by DKS Co., Ltd.)
Surfactant 2: dodecylbenzenesulfonic acid (manufactured by Tokyo Chemical Industry Co., Ltd.)
Resin 1: 20% by mass aqueous solution of polyvinyl alcohol Surfactant 1: sodium dodecylbenzenesulfonate (Neogen SC, manufactured by DKS Co., Ltd.)
Surfactant 2: dodecylbenzenesulfonic acid (manufactured by Tokyo Chemical Industry Co., Ltd.)
Resin 1: 20% by mass aqueous solution of polyvinyl alcohol <Preparation of Infrared-Absorbing Compositions of Examples 6 to 27>

Raw materials shown in the table below were mixed, and the obtained mixture was filtered using a nylon filter (manufactured by Nihon Pall Corporation) having a pore diameter of 0.45 μm to prepare infrared-absorbing compositions of Examples 6 to 27. In each infrared-absorbing composition, the infrared-absorbing coloring agent existed in a state of particles. The dispersion liquid was prepared as follows. The infrared-absorbing coloring agent, the dispersant, and the solvent having the types described in the column of dispersion liquid in the following tables were mixed in blended amounts described in the following tables, 230 parts by mass of zirconia beads having a diameter of 0.3 mm was further added thereto, the mixture was dispersed using a paint shaker for 8 hours, and the beads were separated by filtration, thereby preparing a dispersion liquid.

<Preparation of Infrared-Absorbing Composition of Comparative Example 3>

The infrared-absorbing coloring agent described in the following table was added to and dissolved in a resin solution obtained by dissolving the resin described in the following table in the solvent described in the following table, and insoluble fraction and the like were removed by filtration to obtain a resin composition. In the composition of Comparative Example 3, the comparative coloring agent 3 was dissolved in the solvent in the infrared-absorbing composition.

TABLE 5

| | Dispersion liquid | | | | | | | | | |
|---|---|---|---|---|---|---|---|---|---|---|
| | Infrared-absorbing coloring agent | | Solvent | | Dispersant | | Infrared-absorbing coloring agent | | Resin | |
| | Type | Blending amount (part by mass) | Type | Blending amount (part by mass) | Type | Blending amount (part by mass) | Type | Blending amount (part by mass) | Type | Blending amount (part by mass) |
| Example 6 | A-1 | 1.8 | S-1 | 39 | C-1 | 2.2 | — | — | P-1 | 6 |
| Example 7 | A-2 | 1.8 | S-1 | 39 | C-1 | 2.2 | — | — | P-2 | 6 |
| Example 8 | A-3 | 1.8 | S-1 | 39 | C-2 | 2.2 | — | — | P-1 | 6 |
| Example 9 | A-4 | 1.8 | S-1 | 39 | C-1 | 2.2 | — | — | P-3 | 6 |
| Example 10 | A-5 | 1.8 | S-1 | 39 | C-1 | 2.2 | — | — | P-2 | 6 |
| Example 11 | A-6 | 1.8 | S-1 | 39 | C-1 | 2.2 | — | — | P-1 | 6 |
| Example 12 | A-7 | 1.8 | S-1 | 39 | C-1 | 2.2 | — | — | P-1 | 6 |
| Example 13 | A-1 | 1.8 | S-1 | 39 | C-1 | 2.2 | — | — | P-2 | 7.7 |
| Example 14 | A-4 | 1.8 | S-1 | 39 | C-1 | 2.2 | — | — | P-2 | 7.7 |
| Example 15 | A-5 | 1.8 | S-1 | 39 | C-1 | 2.2 | — | — | P-2 | 7.7 |
| Example 16 | A-6 | 1.8 | S-1 | 39 | C-1 | 2.2 | — | — | P-4 | 7.7 |
| Example 17 | A-7 | 1.8 | S-1 | 39 | C-1 | 2.2 | — | — | P-4 | 7.7 |
| Example 18 | A-1 | 0.9 | S-2 | 18.5 | C-1 | 1.1 | — | — | P-3 | 20 |
| Comparative Example 3 | — | | — | | — | | Comparative coloring agent 3 | 0.9 | P-3 | 20 |

| | Curable compound | | Photo-polymerization initiator | | Surfactant | | Polymerization inhibitor | | Solvent | |
|---|---|---|---|---|---|---|---|---|---|---|
| | Type | Blending amount (part by mass) | Type | Blending amount (part by mass) | Type | Blending amount (part by mass) | Type | Blending amount (part by mass) | Type | Blending amount (part by mass) |
| Example 6 | M-1 | 1.4 | F-1 | 1.5 | G-1 | 0.04 | H-1 | 0.006 | S-1 | 48.1 |
| Example 7 | M-1 | 1.4 | F-1 | 1.5 | G-1 | 0.04 | H-1 | 0.006 | S-1 | 48.1 |
| Example 8 | M-2 | 1.4 | F-1 | 1.5 | G-1 | 0.04 | H-1 | 0.006 | S-1 | 48.1 |
| Example 9 | M-1 | 1.4 | F-1 | 1.5 | G-1 | 0.04 | H-1 | 0.006 | S-1 | 48.1 |
| Example 10 | M-1 | 1.4 | F-1 | 1.5 | G-1 | 0.04 | H-1 | 0.006 | S-1 | 48.1 |
| Example 11 | M-1 | 1.4 | F-1 | 1.5 | G-1 | 0.04 | H-1 | 0.006 | S-1 | 48.1 |
| Example 12 | M-1 | 1.4 | F-1 | 1.5 | G-1 | 0.04 | H-1 | 0.006 | S-1 | 48.1 |
| Example 13 | M-3 | 4.5 | — | — | G-1 | 0.04 | H-1 | 0.006 | S-1 | 44.8 |
| Example 14 | M-3 | 4.5 | — | — | G-1 | 0.04 | H-1 | 0.006 | S-1 | 44.8 |
| Example 15 | M-3 | 4.5 | — | — | G-2 | 0.04 | H-1 | 0.006 | S-1 | 44.8 |
| Example 16 | M-4 | 4.5 | — | — | G-2 | 0.04 | H-1 | 0.006 | S-1 | 44.8 |
| Example 17 | M-4 | 4.5 | — | — | G-3 | 0.04 | H-1 | 0.006 | S-1 | 44.8 |
| Example 18 | — | — | — | — | — | — | — | — | S-2 | 59.5 |
| Comparative Example 3 | — | — | — | — | — | — | — | — | S-2 | 79.1 |

TABLE 6

| | Dispersion liquid | | | | | | | | | | | |
|---|---|---|---|---|---|---|---|---|---|---|---|---|
| | Infrared-absorbing coloring agent | | Solvent 1 | | Solvent 2 | | Dispersant | | Resin | | Curable compound | |
| | Type | Blending amount (part by mass) | Type | Blending amount (part by mass) | Type | Blending amount (part by mass) | Type | Blending amount (part by mass) | Type | Blending amount (part by mass) | Type | Blending amount (part by mass) |
| Example 19 | A-1 | 1.8 | S-1 | 19.5 | S-3 | 19.5 | C-1 | 22 | P-1 | 7.7 | M-3 | 4.5 |
| Example 20 | A-4 | 1.8 | S-1 | 19.5 | S-3 | 19.5 | C-1 | 22 | P-1 | 7.7 | M-3 | 4.5 |
| Example 21 | A-5 | 1.8 | S-1 | 19.5 | S-3 | 19.5 | C-1 | 22 | P-1 | 6 | M-1 | 1.4 |
| Example 22 | A-1 | 1.8 | S-1 | 19.5 | S-4 | 19.5 | C-1 | 22 | P-1 | 7.7 | M-3 | 4.5 |
| Example 23 | A-4 | 1.8 | S-1 | 19.5 | S-4 | 19.5 | C-1 | 22 | P-1 | 7.7 | M-3 | 4.5 |
| Example 24 | A-5 | 1.8 | S-1 | 19.5 | S-4 | 19.5 | C-1 | 22 | P-1 | 6 | M-1 | 1.4 |
| Example 25 | A-1 | 1.8 | S-1 | 19.5 | S-5 | 19.5 | C-1 | 22 | P-1 | 7.7 | M-3 | 4.5 |
| Example 26 | A-4 | 1.8 | S-1 | 19.5 | S-5 | 19.5 | C-1 | 22 | P-1 | 7.7 | M-3 | 4.5 |
| Example 27 | A-5 | 1.8 | S-1 | 19.5 | S-5 | 19.5 | C-1 | 22 | P-1 | 6 | M-1 | 1.4 |

| | Photopolymerization initiator | | Surfactant | | Polymerization inhibitor | | Solvent 1 | | Solvent 2 | |
|---|---|---|---|---|---|---|---|---|---|---|
| | Type | Blending amount (part by mass) | Type | Blending amount (part by mass) | Type | Blending amount (part by mass) | Type | Blending amount (part by mass) | Type | Blending amount (part by mass) |
| Example 19 | — | — | G-1 | 0.04 | H-1 | 0.006 | S-1 | 24.1 | S-3 | 24 |
| Example 20 | — | — | G-1 | 0.04 | H-1 | 0.006 | S-1 | 24.1 | S-3 | 24 |
| Example 21 | F-1 | 1.5 | G-1 | 0.04 | H-1 | 0.006 | S-1 | 24.1 | S-3 | 24 |
| Example 22 | — | — | G-1 | 0.04 | H-1 | 0.006 | S-1 | 24.1 | S-4 | 24 |
| Example 23 | — | — | G-1 | 0.04 | H-1 | 0.006 | S-1 | 24.1 | S-4 | 24 |
| Example 24 | F-1 | 1.5 | G-1 | 0.04 | H-1 | 0.006 | S-1 | 24.1 | S-4 | 24 |
| Example 25 | — | — | G-1 | 0.04 | H-1 | 0.006 | S-1 | 24.1 | S-5 | 24 |
| Example 26 | — | — | G-1 | 0.04 | H-1 | 0.006 | S-1 | 24.1 | S-5 | 24 |
| Example 27 | F-1 | 1.5 | G-1 | 0.04 | H-1 | 0.006 | S-1 | 24.1 | S-5 | 24 |

(Solvent)

S-1: propylene glycol monomethyl ether acetate

S-2: cyclopentanone

S-3: propylene carbonate

S-4: cyclohexyl acetate

S-5: methyl isobutyl ketone (Dispersant)

C-1: resin having the following structure (a numerical value described together with the main chain indicates a molar ratio, and a numerical value described together with the main chain indicates the number of repeating units; weight-average molecular weight: 21000, acid value: 36.0 mgKOH/g, amine value: 47.0 mgKOH/g)

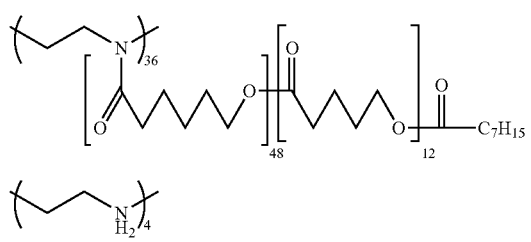

-continued

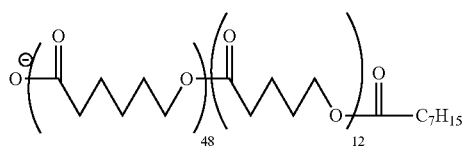

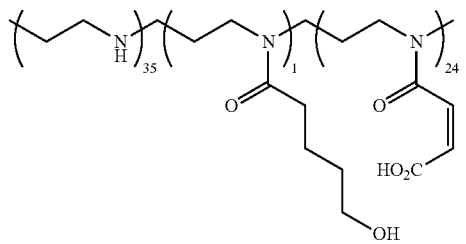

C-2: resin having the following structure (a numerical value described together with the main chain indicates a molar ratio, and a numerical value described together with the main chain indicates the number of repeating units; weight-average molecular weight: 38000, acid value: 99.1 mgKOH/g)

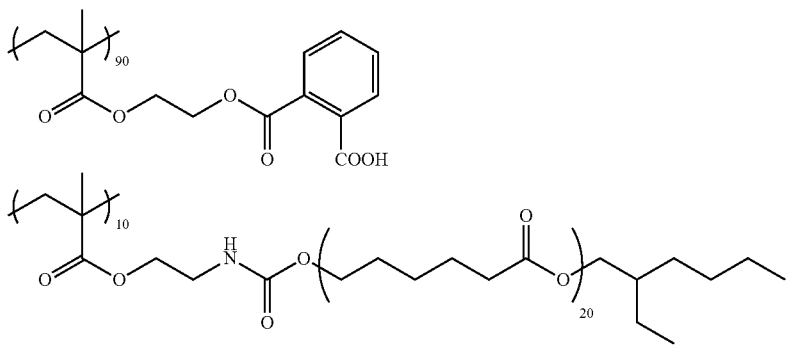

(Resin)

P-1: resin having the following structure (a numerical value described together with the main chain indicates a molar ratio; weight-average molecular weight: 10000, acid value=69.2 mgKOH/g)

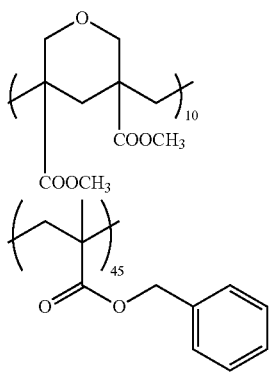

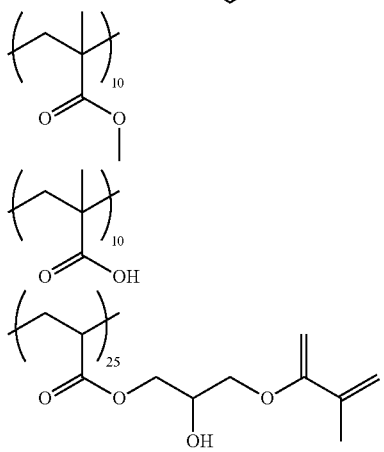

P-2: copolymer of allyl methacrylate (AMA) and methacrylic acid (MAA) (compositional ratio (mass ratio): AMA/MAA=80/20, weight-average molecular weight: 15000)

P-3: copolymer of methyl a-allyloxymethylacrylate (AOMA) and N-phenylmaleimide (PME) (compositional ratio (mass ratio): AOMA/PME=66/34, weight-average molecular weight: 31600)

P-4: copolymer of methyl methacrylate (MMA) and glycidyl methacrylate (GMA) (compositional ratio (mass ratio): MMA/GMA=50/50, weight-average molecular weight: 25000)

(Curable Compound)

M-1: mixture of compounds having the following structures (a molar ratio between a left compound and a right compound is 7:3)

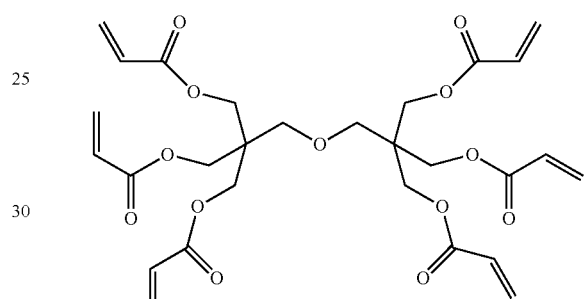

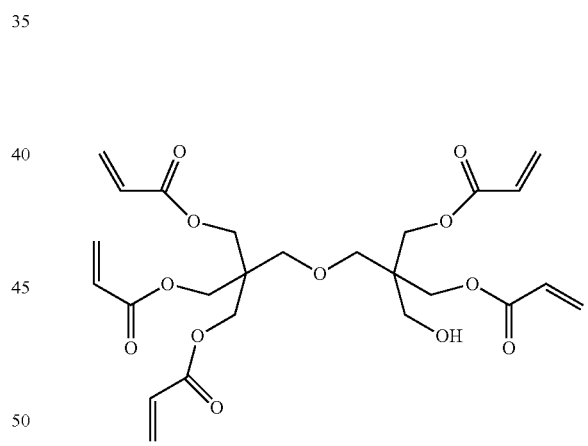

M-2: compound having the following structure

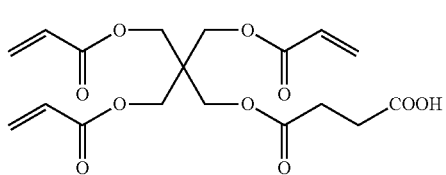 [SMILES: C=CC(=O)OCC(COC(=O)C=C)(COC(=O)C=C)COC(=O)CCC(=O)O]

M-3: EPICLON N-695 (cresol novolac-type epoxy resin, manufactured by DIC Corporation)

M-4: EHPE 3150 (1,2-epoxy-4-(2-oxiranyl)cyclohexane adduct of 2,2'-bis(hydroxymethyl)-1-butanol, manufactured by DAICEL-ALLNEX LTD.)

(Photopolymerization Initiator)
F-1: compound having the following structure

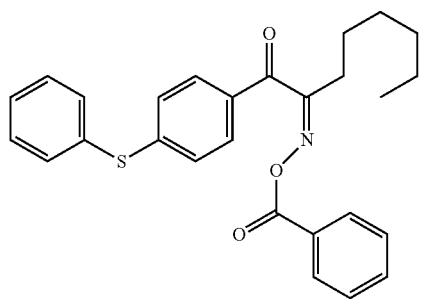 [SMILES: CCCCCC/C(=N/OC(=O)c1ccccc1)C(=O)c1ccc(Sc2ccccc2)cc1]

F-2: compound having the following structure

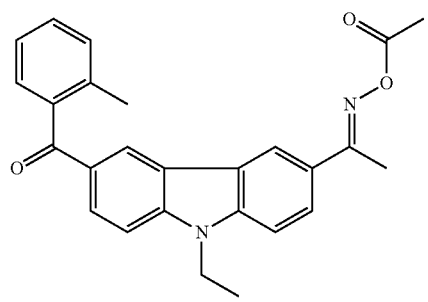 [SMILES: CCn1c2ccc(C(=O)c3ccccc3C)cc2c2cc(/C(C)=N/OC(C)=O)ccc21]

(Surfactant)
G-1: compound having the following structure (weight-average molecular weight: 14000; a numerical value "%" representing the proportion of a repeating unit is mol %)

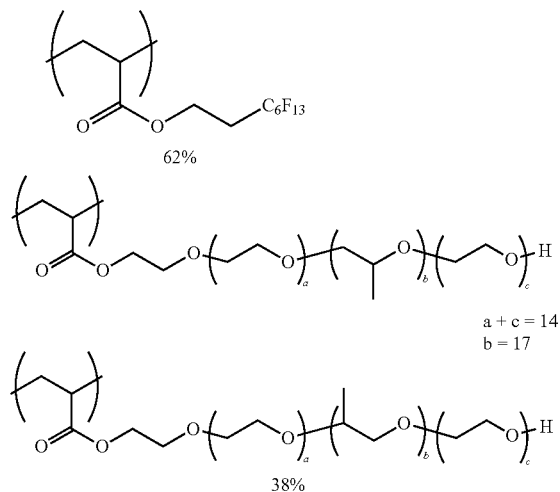

G-2: KF-6001 (silicone-based surfactant, manufactured by Shin-Etsu Chemical Co., Ltd.)
G-3: PolyFox PF6320 (fluorine-based surfactant, manufactured by OMNOVA Solutions Inc.)
(Polymerization Inhibitor)
H-1: p-methoxyphenol
<Maximal Absorption Wavelength and Absorbance>
Absorption spectrum of each infrared-absorbing composition was measured, and the number of maximal absorption wavelengths existing in a wavelength range of 650 to 1500 nm, the maximal absorption wavelength (ki) existing on the shortest wavelength side of the maximal absorption wavelength existing in the wavelength range of 650 to 1500 nm, the maximal absorption wavelength ($\lambda_2$) existing on the second shortest wavelength side of the maximal absorption wavelength existing in the wavelength range of 650 to 1500 nm, and a value ($Z_1$) of an absorbance at the maximal absorption wavelength ($\lambda_1$) in a case where an absorbance at the maximal absorption wavelength ($\lambda_2$) was set to 1 were determined. In the infrared-absorbing compositions of Examples 1 to 18 and Comparative Examples 1 to 3, the characteristics of the maximal absorption wavelength and the absorbance in the wavelength range of 650 to 1500 nm were derived from the infrared-absorbing coloring agents A-1 to A-7 and the comparative coloring agents 1 to 3, each of which was included in each infrared-absorbing composition.

<Production of Cured Film>

(Production Example 1) Method for Producing Cured Film Formed of Infrared-Absorbing Compositions of Examples 1 to 5 and 18, and Comparative Examples 1 to 3

The infrared-absorbing compositions of Examples 1 to 5 and 18, and Comparative Examples 1 to 3 were applied to a glass substrate (manufactured by Corning Inc., "1737") using a spin coater, and a heat treatment was performed for 120 seconds using a hot plate at 100° C. for initial drying. Thereafter, nitrogen replacement was carried out at 50° C. for 30 minutes using an inert oven, the temperature was raised to 150° C. in approximately 10 minutes, and the film was additionally dried in a nitrogen atmosphere at 150° C. for 30 minutes to obtain a cured film.

(Production Example 2) Method for Producing Cured Film Formed of Infrared-Absorbing Compositions of Examples 6 to 12, 21, 24, and 27

The infrared-absorbing compositions of Examples 6 to 12, 21, 24, and 27 were applied to a glass substrate (manufactured by Corning Inc., "1737") using a spin coater, and a heat treatment (pre-baking) was performed for 120 seconds using a hot plate at 100° C. Next, using an i-ray stepper exposure device FPA-3000 i5+ (manufactured by Canon Inc.), the entire surface of the coating film was exposed at 500 mJ/cm². Next, using a development machine (CD-2060, manufactured by FUJIFILM Electronic Materials Co., Ltd.), a puddle development was performed at 23° C. for 60 seconds, and then rinse treatment was performed with pure water and spin drying was performed. Furthermore, a heat treatment (post-baking) was performed for 300 seconds using a hot plate at 200° C., thereby obtaining a cured film.

(Production Example 3) Method for Producing Cured Film Formed of Infrared-Absorbing Compositions of Examples 13 to 17

The infrared-absorbing compositions of Examples 13 to 17 were applied to a glass substrate (manufactured by Corning Inc., "1737") using a spin coater, and a heat treatment (pre-baking) was performed for 120 seconds using a hot plate at 100° C. Furthermore, a heat treatment (post-baking) was performed for 480 seconds using a hot plate at 200° C., thereby obtaining a cured film.

(Production Example 4) Method for Producing Cured Film Formed of Infrared-Absorbing Compositions of Examples 19, 20, 22, 23, 25, and 26

The infrared-absorbing compositions of Examples 19, 20, 22, 23, 25, and 26 were applied to a glass substrate (manufactured by Corning Inc., "1737") using a spin coater, and a heat treatment (pre-baking) was performed for 600 seconds using a hot plate at 120° C. Furthermore, a heat treatment (post-baking) was performed for 480 seconds using a hot plate at 200° C., thereby obtaining a cured film.

<Evaluation of Spectral Characteristics>
(Slope Shape)

By the above-described method for producing each cured film, a film thickness of the cured film was adjusted so that a transmittance at the maximal absorption wavelength ($\lambda_1$) existing on the shortest wavelength side of the maximal absorption wavelength existing in the wavelength range of 650 to 1500 nm was 10%, and a wavelength ($\lambda_{SH60}$) on the longest wavelength side of $\lambda_1$, at which the transmittance was 60% on the short-wave side, was measured. A difference ($\lambda_1 - \lambda_{SH60}$) between $\lambda_1$ and $\lambda_{SH60}$ was calculated, and a slope shape was evaluated based on the following standard. It is shown that, as the above-described difference between the wavelengths is smaller, a well-cut tail for absorbing infrared rays is better, and it is possible to more selectively shield the infrared rays.

—Evaluation Standard—
A: $(\lambda_1 - \lambda_{SH60}) \leq 50$ nm
B: 50 nm $< (\lambda_1 - \lambda_{SH60}) \leq 70$ nm
C: 70 nm $< (\lambda_1 - \lambda_{SH60})$ (Infrared Shielding Properties)

By the above-described method for producing each cured film, a film thickness of the cured film was adjusted so that a transmittance at a wavelength ($\lambda$maxA) exhibiting the highest absorbance value in the wavelength range of 650 to 1500 nm was 1%, and a wavelength ($\lambda_{LH20}$) on the shortest wavelength side of $\lambda$max, at which the transmittance was 20% on the short-wave side, and a wavelength ($\lambda_{SH20}$) on the longest wavelength side, at which the transmittance was 20% on the short-wave side, were measured. A difference ($\lambda_{LH20} - \lambda_{SH20}$) between $\lambda_{LH20}$ and $\lambda_{SH20}$ was calculated, and infrared shielding properties were evaluated based on the following standard. It is shown that, as the above-described difference between the wavelengths is larger, infrared rays in a wide wavelength range can be shielded.

—Evaluation Standard—
A: $(\lambda_{LH20} - \lambda_{SH20}) \geq 110$ nm
B: 85 nm $\leq (\lambda_{LH20} - \lambda_{SH20}) < 110$ nm
C: 60 nm $\leq (\lambda_{LH20} - \lambda_{SH20}) < 85$ nm
D: $(\lambda_{LH20} - \lambda_{SH20}) < 60$ nm (Heat Resistance)

The cured film having a thickness of 1.0 µm obtained above was heated at 200° C. for 3 hours using a hot plate. Using a spectrophotometer U-4100 (manufactured by Hitachi High-Tech Corporation.), the transmittance of the film before and after heating with respect to light having a wavelength of 400 to 2000 nm was measured. In the wavelength range of 400 to 1500 nm, the change in transmittance at the wavelength where the change in transmittance before and after heating was the largest was calculated from the following expression, and the change in transmittance was evaluated according to the following standard. It can be said that, as the change in transmittance is smaller, the heat resistance is more excellent.

Change in transmittance=|(Transmittance after light irradiation−Transmittance before light irradiation)|

—Evaluation Standard—
A: change in transmittance was less than 3%.
B: change in transmittance was 3% or more and less than 5%.
C: change in transmittance was 5% or more and less than 10%.
D: change in transmittance was 10% or more.

(Light Resistance)

The cured film having a thickness of 1.0 µm obtained above was set in a fading tester equipped with a super xenon lamp (200,000 lux), and was irradiated with light of 200,000 lux for 55 hours under a condition in which no ultraviolet cut filter was used. Next, using a spectrophotometer U-4100 (manufactured by Hitachi High-Tech Corporation.), the transmission spectrum of the film after light irradiation was measured. In the wavelength range of 400 nm to 2,000 nm, the change in transmittance at the wavelength where the change in transmittance before and after light irradiation was the largest was calculated from the following expression, and the heat resistance was evaluated according to the following standard.

Change in transmittance=|(Transmittance after light irradiation−Transmittance before light irradiation)|

—Evaluation Standard—
A: change in transmittance was less than 3%.
B: change in transmittance was 3% or more and less than 5%.
C: change in transmittance was 5% or more and less than 10%.
D: change in transmittance was 10% or more.

TABLE 7

| | | Maximal absorption wavelength | | | Spectral characteristics | | | |
|---|---|---|---|---|---|---|---|---|
| | Number | $\lambda_1$ | $\lambda_2 - \lambda_1$ | $Z_1$ | Slope shape | Infrared shielding properties | Heat resistance | Light resistance |
| Example 1 | 3 | 745 nm | 76 nm | 1.3 | A | B | A | A |
| Example 2 | 3 | 740 nm | 80 nm | 1.1 | A | B | A | A |
| Example 3 | 3 | 710 nm | 60 nm | 1.0 | A | B | A | A |
| Example 4 | 3 | 700 nm | 51 nm | 1.5 | A | B | A | A |
| Example 5 | 3 | 690 nm | 50 nm | 1.0 | A | B | A | A |
| Example 6 | 3 | 748 nm | 78 nm | 1.2 | A | B | A | A |
| Example 7 | 3 | 746 nm | 80 nm | 0.9 | B | B | A | A |
| Example 8 | 3 | 712 nm | 62 nm | 1.0 | A | B | A | A |

TABLE 7-continued

| | | Maximal absorption wavelength | | | Spectral characteristics | | | |
|---|---|---|---|---|---|---|---|---|
| | | | | | | Infrared | | |
| | | | | | Slope | shielding | Heat | Light |
| | Number | $\lambda_1$ | $\lambda_2 - \lambda_1$ | $Z_1$ | shape | properties | resistance | resistance |
| Example 9 | 3 | 701 nm | 51 nm | 1.3 | A | B | A | A |
| Example 10 | 3 | 695 nm | 52 nm | 1.0 | A | B | A | A |
| Example 11 | 3 | 715 nm | 70 nm | 1.4 | A | B | A | A |
| Example 12 | 3 | 696 nm | 54 nm | 1.1 | A | B | A | A |
| Example 13 | 3 | 745 nm | 76 nm | 1.3 | A | B | A | A |
| Example 14 | 3 | 701 nm | 51 nm | 1.3 | A | B | A | A |
| Example 15 | 3 | 695 nm | 52 nm | 1.3 | A | B | A | A |
| Example 16 | 3 | 715 nm | 70 nm | 1.3 | A | B | A | A |
| Example 17 | 3 | 696 nm | 54 nm | 1.1 | A | B | A | A |
| Example 18 | 3 | 745 nm | 76 nm | 1.3 | A | B | A | A |
| Example 19 | 3 | 748 nm | 78 nm | 1.2 | A | B | A | A |
| Example 20 | 3 | 701 nm | 51 nm | 1.3 | A | B | A | A |
| Example 21 | 3 | 695 nm | 52 nm | 1 | A | B | A | A |
| Example 22 | 3 | 748 nm | 78 nm | 1.2 | A | B | A | A |
| Example 23 | 3 | 701 nm | 51 nm | 1.3 | A | B | A | A |
| Example 24 | 3 | 695 nm | 52 nm | 1 | A | B | A | A |
| Example 25 | 3 | 748 nm | 78 nm | 1.2 | A | B | A | A |
| Example 26 | 3 | 701 nm | 51 nm | 1.3 | A | B | A | A |
| Example 27 | 3 | 695 nm | 52 nm | 1 | A | B | A | A |
| Comparative Example 1 | 2 | 770 nm | 81 nm | 0.5 | C | C | A | A |
| Comparative Example 2 | 2 | 810 nm | 95 nm | 0.3 | C | C | B | A |
| Comparative Example 3 | 1 | 749 nm | — | — | B | D | D | D |

As shown in the above table, the infrared-absorbing compositions of Examples had a good slope shape and excellent infrared shielding properties. In addition, in the infrared-absorbing compositions of Examples, all of the infrared-absorbing coloring agents A-1 to A-7 existed as particles in the infrared-absorbing composition. In addition, in the infrared-absorbing compositions of Examples, these particles had two or more maximal absorption wavelengths in a wavelength range of 650 to 1500 nm. In addition, in the above-described range, in a case where the absorbance at the maximal absorption wavelength ($\lambda_2$) existing on the second shortest wavelength side was set to 1, the absorbance ($Z_1$) at the maximal absorption wavelength ($\lambda_1$) existing on the shortest wavelength side was 0.6 to 2.0. In addition, the difference ($\lambda_2 - \lambda_1$) between the maximal absorption wavelength ($\lambda_1$) existing on the shortest wavelength side and the maximal absorption wavelength ($\lambda_2$) existing on the second shortest wavelength side was all in a range of 30 to 80 nm. In addition, with reference to Table 3 in combination, the above-described value of $\lambda_1$ in the infrared-absorbing compositions of Examples 1 to 27 existed on a shorter wavelength side than the wavelength ($\lambda$max) exhibiting the highest absorbance in the coloring agent solution that is prepared by dissolving each of the infrared-absorbing coloring agents A-1 to A-7 in a good solvent (dimethyl sulfoxide).

On the other hand, in the cured film of Comparative Example 3, the maximal absorption wavelengths existed at 749 nm and 920 nm, so that the difference in the wavelengths was as large as 100 nm or more and the infrared shielding properties were not sufficient.

Noise could be further reduced by using the cured film formed of the infrared-absorbing composition of Example 6 in an infrared sensor.

Example 28

An infrared-absorbing composition was produced in the same manner as in Example 6, except that, in Example 6, 1.7 parts by mass of an infrared-absorbing coloring agent B-1 and 2.0 parts by mass of an ultraviolet absorber UV-1 were further blended during the preparation of the dispersion liquid, and each of the characteristics was evaluated in the same manner as described above. The infrared-absorbing composition of Example 28 had a slope shape equivalent to that of Example 6. In addition, the infrared shielding properties were superior to that of Example 6, and were evaluated as A.

Example 29

An infrared-absorbing composition was produced in the same manner as in Example 9, except that, in Example 9, 1.7 parts by mass of an infrared-absorbing coloring agent B-2 and 2.0 parts by mass of an ultraviolet absorber (Tinuvin 326, 2-(5-chloro-2-benzotriazolyl)-6-tert-butyl-p-cresol, manufactured by BASF SE) were further blended during the preparation of the dispersion liquid, and each of the characteristics was evaluated in the same manner as described above. The infrared-absorbing composition of Example 29 had a slope shape equivalent to that of Example 9. In addition, the infrared shielding properties were superior to that of Example 9, and were evaluated as A.

Example 30

An infrared-absorbing composition was produced in the same manner as in Example 10, except that, in Example 10, 1.7 parts by mass of an infrared-absorbing coloring agent B-3 and 2.0 parts by mass of an ultraviolet absorber (Tinuvin 477, hydroxyphenyltriazine-based compound, manufactured by BASF SE) were further blended during the preparation of the dispersion liquid, and each of the characteristics was evaluated in the same manner as described above. The infrared-absorbing composition of Example 30 had a slope shape equivalent to that of Example 10. In addition, the infrared shielding properties were superior to that of Example 10, and were evaluated as A.

Example 31

An infrared-absorbing composition was produced in the same manner as in Example 11, except that, in Example 11, 1.7 parts by mass of an infrared-absorbing coloring agent B-4 and 2.0 parts by mass of an ultraviolet absorber (Tinuvin 460, hydroxyphenyltriazine-based compound, manufactured by BASF SE) were further blended during the preparation of the dispersion liquid, and each of the characteristics was evaluated in the same manner as described above. The infrared-absorbing composition of Example 31 had a slope shape equivalent to that of Example 11. In addition, the infrared shielding properties were superior to that of Example 11, and were evaluated as A.

Example 32

An infrared-absorbing composition was produced in the same manner as in Example 12, except that, in Example 12, 1.7 parts by mass of an infrared-absorbing coloring agent B-5 and 2.0 parts by mass of an ultraviolet absorber (Tinuvin 405, hydroxyphenyltriazine-based compound, manufactured by BASF SE) were further blended during the preparation of the dispersion liquid, and each of the characteristics was evaluated in the same manner as described above. The infrared-absorbing composition of Example 32 had a slope shape equivalent to that of Example 12. In addition, the infrared shielding properties were superior to that of Example 12, and were evaluated as A.

Example 33

An infrared-absorbing composition was produced in the same manner as in Example 14, except that, in Example 14, 1.7 parts by mass of the infrared-absorbing coloring agent B-2, 0.3 parts by mass of an infrared-absorbing coloring agent B-6, and 9.0 parts by mass of an ultraviolet absorber (Tinuvin 479, hydroxyphenyltriazine-based compound, manufactured by BASF SE) were further blended during the preparation of the dispersion liquid, and each of the characteristics was evaluated in the same manner as described above. The infrared-absorbing composition of Example 33 had a slope shape equivalent to that of Example 14. In addition, the infrared shielding properties were superior to that of Example 14, and were evaluated as A.

Example 34

An infrared-absorbing composition was produced in the same manner as in Example 15, except that, in Example 15, 1.7 parts by mass of the infrared-absorbing coloring agent B-3, 0.3 parts by mass of an infrared-absorbing coloring agent B-7, and 9.0 parts by mass of an ultraviolet absorber (Uvinul 3050, dihydroxybenzophenone-based compound, manufactured by BASF SE) were further blended during the preparation of the dispersion liquid, and each of the characteristics was evaluated in the same manner as described above. The infrared-absorbing composition of Example 34 had a slope shape equivalent to that of Example 15. In addition, the infrared shielding properties were superior to that of Example 15, and were evaluated as A.

Example 35

An infrared-absorbing composition was produced in the same manner as in Example 16, except that, in Example 16, 1.7 parts by mass of the infrared-absorbing coloring agent B-4, 0.3 parts by mass of an infrared-absorbing coloring agent B-8, and 9.0 parts by mass of an ultraviolet absorber (Tinuvin 477, hydroxyphenyltriazine-based compound, manufactured by BASF SE) were further blended during the preparation of the dispersion liquid, and each of the characteristics was evaluated in the same manner as described above. The infrared-absorbing composition of Example 35 had a slope shape equivalent to that of Example 16. In addition, the infrared shielding properties were superior to that of Example 16, and were evaluated as A.

Example 36

An infrared-absorbing composition was produced in the same manner as in Example 17, except that, in Example 17, 1.7 parts by mass of the infrared-absorbing coloring agent B-5, 0.3 parts by mass of an infrared-absorbing coloring agent B-9, and 9.0 parts by mass of an ultraviolet absorber (Uvinul 3049, dihydroxybenzophenone-based compound, manufactured by BASF SE) were further blended during the preparation of the dispersion liquid, and each of the characteristics was evaluated in the same manner as described above. The infrared-absorbing composition of Example 36 had a slope shape equivalent to that of Example 17. In addition, the infrared shielding properties were superior to that of Example 17, and were evaluated as A.

Example 37

An infrared-absorbing composition was produced in the same manner as in Example 14, except that, in Example 14, 1.7 parts by mass of an infrared-absorbing coloring agent B-10, 0.3 parts by mass of the infrared-absorbing coloring agent B-6, and 9.0 parts by mass of an ultraviolet absorber (Uvinul 3050, dihydroxybenzophenone-based compound, manufactured by BASF SE) were further blended during the preparation of the dispersion liquid, and each of the characteristics was evaluated in the same manner as described above. The infrared-absorbing composition of Example 37 had a slope shape equivalent to that of Example 14. In addition, the infrared shielding properties were superior to that of Example 14, and were evaluated as A.

Example 38

An infrared-absorbing composition was produced in the same manner as in Example 20, except that, in Example 20, 1.7 parts by mass of the infrared-absorbing coloring agent B-10, 0.3 parts by mass of the infrared-absorbing coloring agent B-6, and 9.0 parts by mass of an ultraviolet absorber Tinuvin 477 (hydroxyphenyltriazine-based compound, manufactured by BASF SE) were further blended during the preparation of the dispersion liquid, and each of the characteristics was evaluated in the same manner as described above. The infrared-absorbing composition of Example 38 had a slope shape equivalent to that of Example 20. In addition, the infrared shielding properties were superior to that of Example 20, and were evaluated as A.

Example 39

An infrared-absorbing composition was produced in the same manner as in Example 21, except that, in Example 21, 1.7 parts by mass of the infrared-absorbing coloring agent B-10, 0.3 parts by mass of the infrared-absorbing coloring agent B-6, and 9.0 parts by mass of an ultraviolet absorber Tinuvin 479 (hydroxyphenyltriazine-based compound, manufactured by BASF SE) were further blended during the preparation of the dispersion liquid, and each of the characteristics was evaluated in the same manner as described above. The infrared-absorbing composition of Example 39 had a slope shape equivalent to that of Example 21. In addition, the infrared shielding properties were superior to that of Example 21, and were evaluated as A.

The infrared-absorbing coloring agents B-1 to B-10 are compounds having the following structures, respectively.

B-1
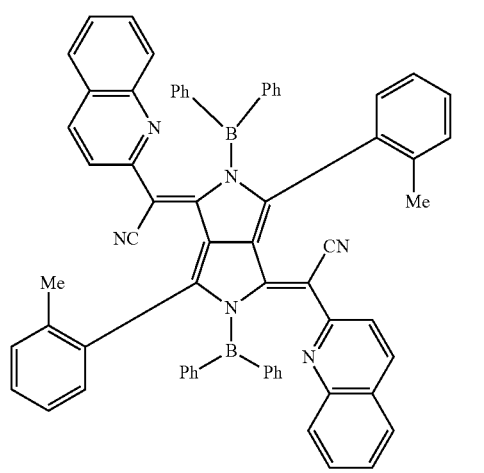

B-2
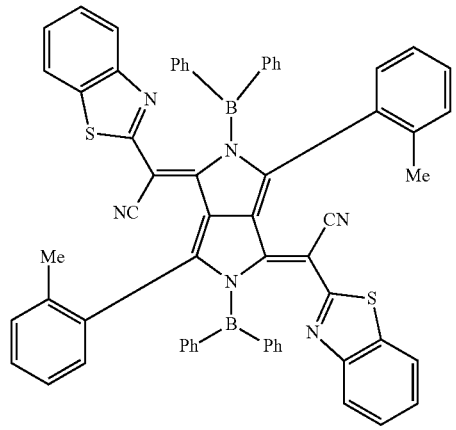

B-4
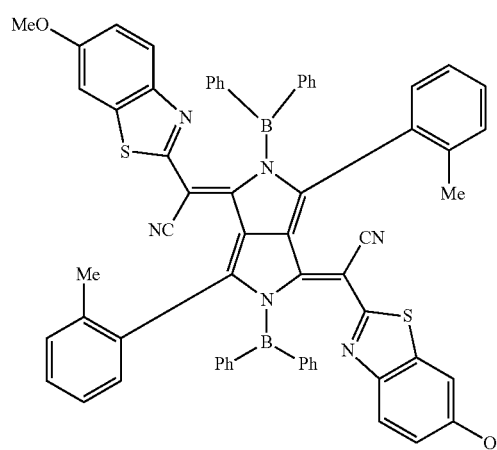

B-3
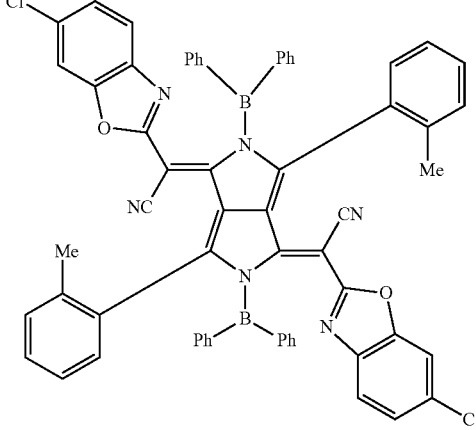

B-5
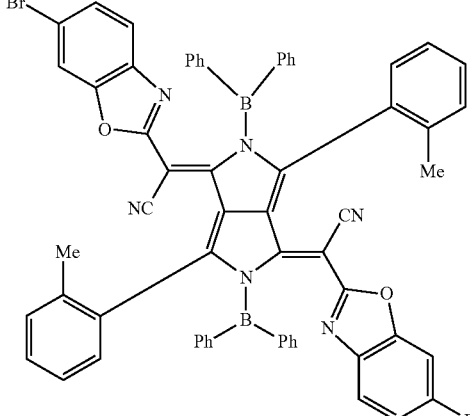

B-6

B-7
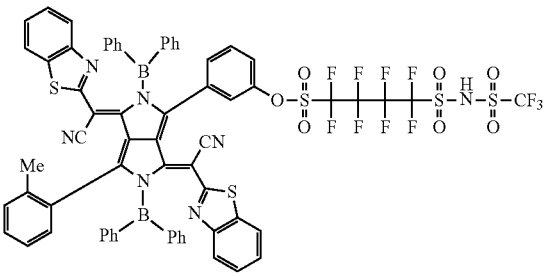

-continued

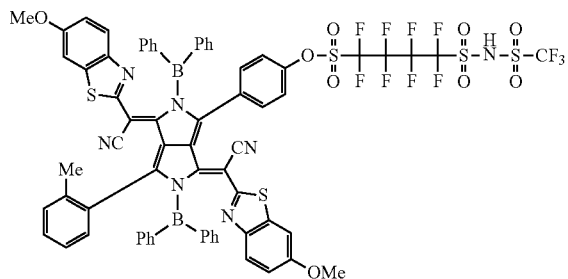

B-8

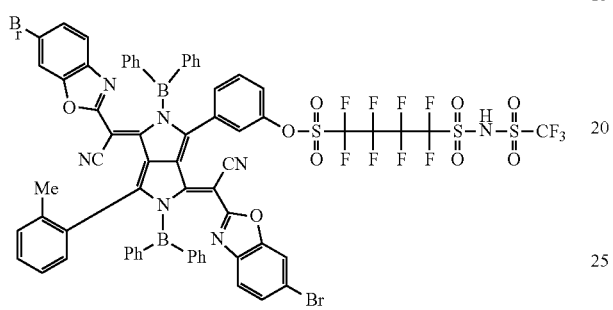

B-9

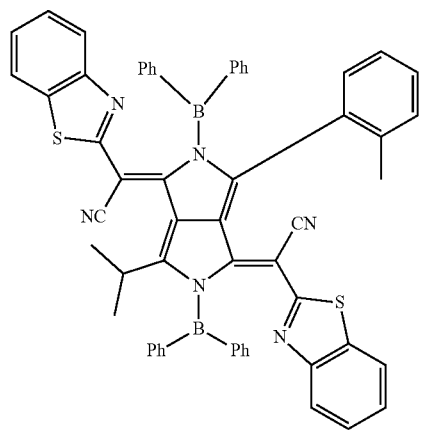

B-10

The ultraviolet absorber UV-1 is a compound having the structure shown below.

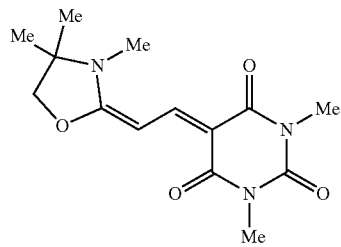

(UV-1)

EXPLANATION OF REFERENCES

110: solid-state imaging element
111: infrared cut filter
112: color filter
114: infrared transmitting filter
115: microlens
116: planarizing layer

What is claimed is:
1. An infrared-absorbing composition comprising:
   particles of an infrared-absorbing coloring agent; and
   a solvent,
   wherein the particles in the infrared-absorbing composition have two or more maximal absorption wavelengths exhibited in a wavelength range of 650 to 1500 nm, and
   in the range, in a case where an absorbance at a maximal absorption wavelength existing on a second shortest wavelength side is set to 1, an absorbance at a maximal absorption wavelength existing on a shortest wavelength side is 0.6 to 2.0,
   wherein the infrared-absorbing coloring agent comprises a compound represented by Formula (PP-2):

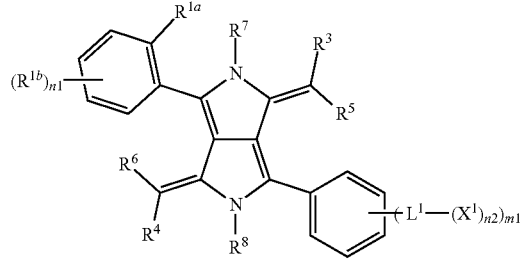

(PP-2)

wherein, in Formula (PP-2), $R^{1a}$ represents an alkyl group; $R^{1b}$ represents a substituent; $R^3$, $R^4$, $R^5$, and $R^6$ each independently represent a cyano group or a heteroaryl group; $R^7$ and $R^8$ each indecently represent —$BR^9R^{10}$ wherein $R^9$ and $R^{10}$ each independently represent an aryl group; $L^1$ represents an aliphatic hydrocarbon group, —O—, or an (n2+1)-valent linking group consisting of a combination of these groups; $X^1$ represents an acid group or a basic group; n1 represents 0; n2 represents 1; and m1 represents 1.

2. The infrared-absorbing composition according to claim 1,
   wherein, in the range, a difference between the maximal absorption wavelength existing on the shortest wavelength side and the maximal absorption wavelength existing on the second shortest wavelength side is 30 to 80 nm.

3. The infrared-absorbing composition according to claim 1,
   wherein the maximal absorption wavelength of the particles, which exists on the shortest wavelength side, exists on a shorter wavelength side than a wavelength at which a coloring agent solution that the infrared-absorbing coloring agent constituting the particles is dissolved in a good solvent for the infrared-absorbing coloring agent exhibits a highest absorbance.

4. The infrared-absorbing composition according to claim 1, wherein the particles in the infrared-absorbing composition have three or more maximal absorption wavelengths exhibited in the wavelength range of 650 to 1500 nm.

5. The infrared-absorbing composition according to claim 1,
wherein the number of maximal absorption wavelengths exhibited by the particles in the infrared-absorbing composition in the wavelength range of 650 to 1500 nm is greater than the number of maximal absorption wavelengths exhibited by a coloring agent solution that the infrared-absorbing coloring agent constituting the particles is dissolved in a good solvent for the infrared-absorbing coloring agent in the wavelength range of 650 to 1500 nm.

6. The infrared-absorbing composition according to claim 1, further comprising:
a curable compound.

7. The infrared-absorbing composition according to claim 1,
wherein the infrared-absorbing composition is for an optical filter or an ink.

8. A film formed of the infrared-absorbing composition according to claim 1.

9. An optical filter comprising:
the film according to claim 8.

10. A solid-state imaging element comprising:
the film according to claim 8.

11. An image display device comprising:
the film according to claim 8.

12. An infrared sensor comprising:
the film according to claim 8.

* * * * *